United States Patent
Liu et al.

(10) Patent No.: US 12,356,617 B2
(45) Date of Patent: Jul. 8, 2025

(54) MICROELECTRONIC DEVICES WITH VERTICALLY RECESSED CHANNEL STRUCTURES AND DISCRETE, SPACED INTER-SLIT STRUCTURES, AND RELATED METHODS AND SYSTEMS

(71) Applicant: Micron Technology, Inc., Boise, ID (US)

(72) Inventors: Haitao Liu, Boise, ID (US); Litao Yang, Boise, ID (US); Albert Fayrushin, Boise, ID (US); Naveen Kaushik, Boise, ID (US); Jian Li, Boise, ID (US); Collin Howder, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 645 days.

(21) Appl. No.: 17/158,888

(22) Filed: Jan. 26, 2021

(65) Prior Publication Data
US 2022/0238548 A1 Jul. 28, 2022

(51) Int. Cl.
*H10B 43/27* (2023.01)
*H10B 41/10* (2023.01)
(Continued)

(52) U.S. Cl.
CPC .............. *H10B 43/27* (2023.02); *H10B 41/10* (2023.02); *H10B 41/27* (2023.02); *H10B 43/10* (2023.02)

(58) Field of Classification Search
CPC ........ H10B 43/27; H10B 41/27; H10B 31/10; H01L 27/11587; H01L 27/11556;
(Continued)

(56) References Cited

U.S. PATENT DOCUMENTS

| 8,519,471 B2 | 8/2013 | Kuk et al. |
| 9,412,821 B2 | 8/2016 | Simsek-Ege et al. |

(Continued)

FOREIGN PATENT DOCUMENTS

WO 2020/163005 A1 8/2020

OTHER PUBLICATIONS

Caillat et al., 3DNAND GIDL—Assisted Body Biasing for Erase Enabling CMOS under Array (CUA) Architecture, Conference Paper—May 2017, 2017 IEEE International Memory Workshop (IMW). IEEE, 5 pages.

(Continued)

*Primary Examiner* — Shaun M Campbell
*Assistant Examiner* — David Paul Sedorook
(74) *Attorney, Agent, or Firm* — TraskBritt

(57) ABSTRACT

A microelectronic device includes a stack structure comprising a vertically alternating sequence of insulative and conductive structures arranged in tiers. At least one pillar, comprising a channel material, extends through the stack structure. A source region, below the stack structure, comprises a doped material with vertical extensions that protrude to an interface with the channel material at an elevation proximate at least one source-side GIDL region. Slit structures extend through the stack structure to divide the structure into blocks of pillar arrays. A series of spaced, discrete pedestal structures are included along a base of the slit structures. Forming the microelectronic device structure may include forming a lateral opening through cell materials of the pillar, vertically recessing the channel material, and laterally recessing other material(s) of the pillar before forming the doped material in the broadened recesses. Additional microelectronic devices, related methods, and electronic systems are also disclosed.

18 Claims, 29 Drawing Sheets

(51) Int. Cl.
   *H10B 41/27* (2023.01)
   *H10B 43/10* (2023.01)
(58) Field of Classification Search
   CPC ......... H01L 27/11582; H01L 27/11565; H01L 27/11519
   See application file for complete search history.

(56) References Cited

U.S. PATENT DOCUMENTS

| | | | |
|---|---|---|---|
| 9,741,737 B1 | 8/2017 | Huang et al. | |
| 9,825,048 B2 | 11/2017 | Cernea | |
| 9,941,298 B2 | 4/2018 | Huang et al. | |
| 10,134,758 B2 | 11/2018 | Zhu et al. | |
| 10,229,909 B2 | 3/2019 | Tokumitsu et al. | |
| 10,418,379 B2 | 9/2019 | Huang et al. | |
| 10,559,582 B2 | 2/2020 | Nishikawa et al. | |
| 10,608,012 B2 | 3/2020 | Huang et al. | |
| 10,784,273 B2 | 9/2020 | Howder et al. | |
| 11,049,568 B1* | 6/2021 | Yada | H10B 43/27 |
| 2012/0276721 A1* | 11/2012 | Chung | H01L 21/02181 438/483 |
| 2017/0148810 A1* | 5/2017 | Kai | H01L 23/535 |
| 2019/0103410 A1 | 4/2019 | Daycock et al. | |
| 2019/0221577 A1 | 7/2019 | Lilak et al. | |
| 2019/0287984 A1* | 9/2019 | Yang | H10B 43/40 |
| 2019/0288000 A1 | 9/2019 | Choi | |
| 2019/0371816 A1 | 12/2019 | Huang et al. | |
| 2019/0385681 A1 | 12/2019 | Yun et al. | |
| 2020/0066346 A1 | 2/2020 | Li et al. | |
| 2020/0083245 A1 | 3/2020 | Fayrushin et al. | |
| 2020/0144288 A1* | 5/2020 | Kanamori | H01L 21/565 |
| 2020/0168623 A1* | 5/2020 | Nishikawa | H10B 41/10 |
| 2020/0176467 A1 | 6/2020 | Choi et al. | |
| 2020/0227429 A1 | 7/2020 | Ji et al. | |
| 2020/0251479 A1* | 8/2020 | Sakakibara | H01L 21/76895 |
| 2020/0258574 A1 | 8/2020 | McNeil | |
| 2021/0057429 A1* | 2/2021 | Zhang | H10B 43/35 |
| 2022/0157724 A1* | 5/2022 | Takii | H10B 41/27 |
| 2024/0155842 A1* | 5/2024 | Ryu | H10B 43/10 |

OTHER PUBLICATIONS

Chandulo et al., Microelectronic Devices with Support Pillars Spaced Along a Slit Region Between Pillar Array Blocks, and Related Methods and Systems, filed Oct. 5, 2020, U.S. Appl. No. 17/063,101. 65 pages.

International Search Report for Application No. PCT/US2022/013722, mailed May 10, 2022, 3 pages.

Written Opinion of the International Searching Authority for Application No. PCT/US2022/013722, mailed May 10, 2022, 4 pages.

\* cited by examiner

MICROELECTRONIC DEVICES WITH VERTICALLY RECESSED CHANNEL STRUCTURES AND DISCRETE, SPACED INTER-SLIT STRUCTURES, AND RELATED METHODS AND SYSTEMS

TECHNICAL FIELD

Embodiments of the disclosure relate to the field of microelectronic device design and fabrication. More particularly, the disclosure relates to methods for forming microelectronic devices (e.g., memory devices, such as 3D NAND memory devices) having tiered stack structures that include vertically alternating conductive structures and insulative structures, to related systems, and to methods for forming such structures and devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line). In a "three-dimensional NAND" memory device (which may also be referred to herein as a "3D NAND" memory device), a type of vertical memory device, not only are the memory cells arranged in row and column fashion in a horizontal array, but tiers of the horizontal arrays are stacked over one another (e.g., as vertical strings of memory cells) to provide a "three-dimensional array" of the memory cells. The stack of tiers includes conductive materials vertically alternating with insulating (e.g., dielectric) materials. The conductive materials function as control gates for, e.g., access lines (e.g., word lines) of the memory cells. Vertical structures (e.g., pillars comprising channel structures and tunneling structures) extend along the vertical string of the memory cells. A drain end of a string is adjacent one of the top and bottom of the vertical structure (e.g., pillar), while a source end of the string is adjacent the other of the top and bottom of the pillar. The drain end is operably connected to a bit line, while the source end is operably connected to a source line. A 3D NAND memory device also includes electrical connections between, e.g., access lines (e.g., word lines) and other conductive structures of the device so that the memory cells of the vertical strings can be selected for writing, reading, and erasing operations.

The channel structures of 3D NAND memory devices may be configured as so-called "hollow" channel structures, with a channel material laterally encircling a center or core of the pillar. Block-erasing the memory cells of such 3D NAND memory devices involves injecting holes (e.g., electron holes) into the channel material. For example, a conductive structure, gatedly connected to the hollow channel structure, may be used to provide gate-induced drain leakage (GIDL), generating the holes that can be transported into other parts of the hollow channel structure by an electronic field. Such a "GIDL" region may be otherwise referred to herein or in the art as a "select device." The gated connection, between the GIDL region and the hollow channel structure, may be facilitated by including a relatively higher level of doping, in the hollow channel structure near the GIDL region, than compared to elsewhere in the hollow channel structure. Thus, the GIDL region may generate holes in the hollow channel region to achieve block-erase of the memory cells.

Conventional 3D NAND structures have injected holes using a GIDL region proximate a drain region atop a tiered stack structure. However, as stacks are scaled upward to increase more tiers and more memory cells, the conventional one-sided (e.g., top-down) GIDL injection may not be functionally sufficient to ensure complete block-erase of a string of memory cells. Efforts have been made to include—in addition to an upper GIDL region, adjacent a drain region, for top-down injection of holes—a lower GIDL region, adjacent a source region, for bottom-up injection of holes. However, designing and fabricating such structures continues to present challenges.

BRIEF DESCRIPTION OF THE DRAWINGS

FIG. 24 is a cross-sectional, elevational, schematic illustration of a microelectronic device structure, wherein a doped material of a source region includes vertical extensions protruding to elevations at or near an elevation of at least one source-side GIDL region, and wherein a slit structure comprises a series of discrete, spaced inter-slit pedestals of a remnant sacrificial material, in accordance with embodiments of the disclosure.

DETAILED DESCRIPTION

Figure 1:
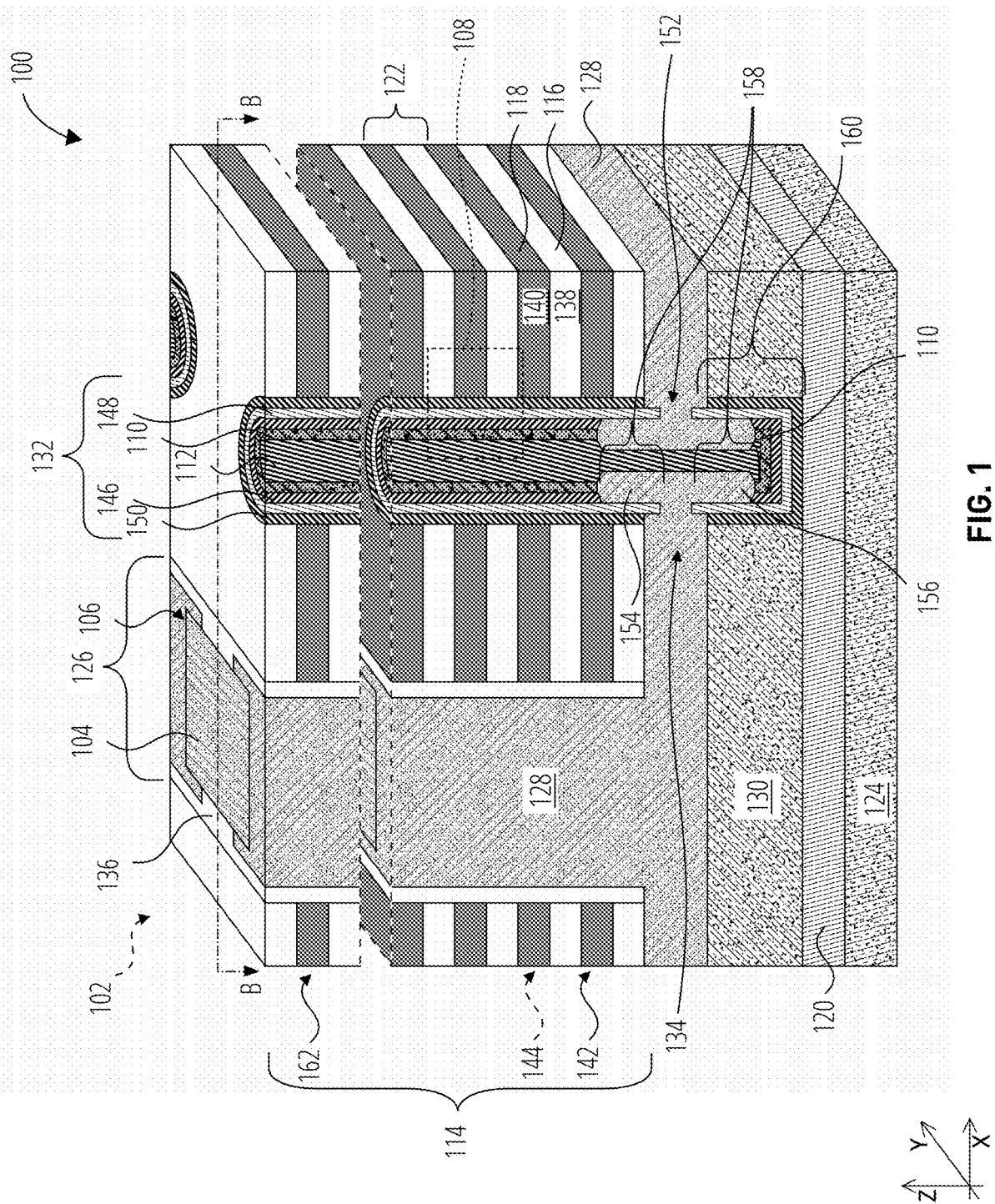
FIG. 1 is a cross-sectional, elevational, schematic illustration of a microelectronic device structure, wherein a doped material of a source region includes vertical extensions protruding to elevations at or near an elevation of at least one source-side GIDL region, and wherein a slit structure comprises a series of discrete, spaced inter-slit support structures on inter-slit pedestals of a remnant sacrificial material, in accordance with embodiments of the disclosure.

Structures (e.g., microelectronic device structures), apparatus (e.g., microelectronic devices, semiconductor devices), and systems (e.g., electronic systems), in accordance with embodiments of the disclosure, include a stack of vertically alternating conductive structures and insulative structures arranged in tiers through which pillars vertically extend. A source region, comprising a doped material (e.g., a doped semiconductor material), is below the stack. The pillars extend through the doped material of the source region. The source region is formed in a manner that enables vertical extensions of the doped material to protrude upward, from the source region into lower elevations of the stack, to an elevation near or including a conductive structure configured as a gate-induced drain leakage (GIDL) region. The vertical extensions of the source region (e.g., the vertical extensions of the doped material) occupy vertical recesses formed in the channel material and, in some embodiments, also in an insulative material at a core of the pillars. The dopant (of the doped material) is, therefore, positioned in relatively close proximity to the GIDL region(s) with a sufficient amount of dopant to facilitate a reliable gated connection between the GIDL region and the channel material atop the doped material extension, providing a more reliable block-erase operation. Slit structures divide the stack of tiers into blocks of pillar arrays. Inter-slit structures provide structural support during material-removal stages of the fabrication process, such as removal of a sacrificial material to be replaced by the doped material of the source region. Accordingly, the microelectronic device structures—with effective source-side GIDL region(s)—may be reliably formed.

As used herein the terms "gate-induced drain leakage region" and "GIDL region" mean and include a conductive region (e.g., a conductive structure, a conductive tier) configured to generate—during a block-erase operation—holes (e.g., electron holes) in an adjacent channel material so that the holes can be swept into the channel material by an electronic field to cause erasing of the memory cells associated with the pillar that includes the channel material. Such GIDL region may be otherwise referred to herein or in the art as a "select gate" or "select device." When a GIDL region is adjacent a source region, the GIDL region may be otherwise referred to herein or in the art as a "source-side select device," a "source-gate select device," or an SGS device. When a GIDL region is adjacent a drain region, the GIDL region may be otherwise referred to herein or in the art as a "drain-side select device," a "drain-gate select device," or an SGD device.

As used herein, the terms "opening," "trench," "slit," "recess," and "void" mean and include a volume extending through or into at least one structure or at least one material, leaving a gap in that at least one structure or at least one material, or a volume extending between structures or materials, leaving a gap between the structures or materials. Unless otherwise described, an "opening," "trench," "slit," and/or "recess" is not necessarily empty of material. That is, an "opening," "trench," "slit," or "recess" is not necessarily void space. An "opening," "trench," "slit," or "recess" formed in or between structures or materials may comprise structure(s) or material(s) other than that in or between which the opening is formed. And, structure(s) or material(s) "exposed" within an opening, trench, slit, or recess is/are not necessarily in contact with an atmosphere or non-solid environment. Structure(s) or material(s) "exposed" within an opening, trench, slit, or recess may be adjacent or in contact with other structure(s) or material(s) that is/are disposed within the opening, trench, slit, or recess. In contrast, unless otherwise described, a "void" may be substantially or wholly empty of material. A "void" formed in or between structures or materials may not comprise structure(s) or material(s) other than that in or between which the "void" is formed. And, structure(s) or material(s) "exposed" within a "void" may be in contact with an atmosphere or non-solid environment.

As used herein, the terms "trench" and "slit" mean and include an elongate opening, while the terms "opening," "recess," and "void" may include either or both an elongate opening, elongate recess, or elongate void, respectively, and/or a non-elongate opening, a non-elongate recess, or non-elongate void.

As used herein, the terms "substrate" and "base structure" mean and include a base material or other construction upon which components, such as those within memory cells, are formed. The substrate or base structure may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" or "base structure" in the following description, previous process stages may have been utilized to form materials, structures, or junctions in the base semiconductor structure, base structure, or other foundation.

As used herein, the term "insulative," when used in reference to a material or structure, means and includes a material or structure that is electrically insulating. An "insulative" material or structure may be formed of and include one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric carboxynitride material (e.g., a silicon carboxynitride ($SiO_xC_zN_y$)), and/or air. Formulae including one or more of "x," "y," and/or "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and/or "z" atoms of an additional element (if any), respectively, for every one atom of another element (e.g., Si, Al, Hf, Nb, Ti). As the formulae are representative of relative atomic ratios and not strict chemical structure, an insulative material or insulative structure may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including one or more insulative materials.

As used herein, the term "sacrificial," when used in reference to a material or structure, means and includes a material or structure that is formed during a fabrication process but which is removed (e.g., substantially removed) prior to completion of the fabrication process.

As used herein, the term "horizontal" means and includes a direction that is parallel to a primary surface of the substrate on which the referenced material or structure is located. The width and length of a respective material or structure may be defined as dimensions in a horizontal plane. With reference to the figures, the "horizontal" direction may be perpendicular to an indicated "Z" axis, may be parallel to an indicated "X" axis, and may be parallel to an indicated "Y" axis.

As used herein, the term "lateral" means and includes a direction in a horizontal plane parallel to a primary surface of the substrate on which a referenced material or structure is located and substantially perpendicular to a "longitudinal" direction. The width of a respective material or structure may be defined as a dimension in the lateral direction of the horizontal plane. With reference to the figures, the "lateral" direction may be parallel to an indicated "X" axis, may be perpendicular to an indicated "Y" axis, and may be perpendicular to an indicated "Z" axis.

As used herein, the term "longitudinal" means and includes a direction in a horizontal plane parallel to a primary surface of the substrate on which a referenced material or structure is located, and substantially perpendicular to a "lateral" direction. The length of a respective material or structure may be defined as a dimension in the longitudinal direction of the horizontal plane. With reference to the figures, the "longitudinal" direction may be parallel to an indicated "Y" axis, may be perpendicular to an indicated "X" axis, and may be perpendicular to an indicated "Z" axis.

As used herein, the term "vertical" means and includes a direction that is perpendicular to a primary surface of the substrate on which a referenced material or structure is located. The "height" of a respective material or structure may be defined as a dimension in a vertical plane. With reference to the figures, the "vertical" direction may be parallel to an indicated "Z" axis, may be perpendicular to an indicated "X" axis, and may be perpendicular to an indicated "Y" axis.

As used herein, the term "width" means and includes a dimension, along an indicated "X" axis in a horizontal plane (e.g., at a certain elevation, if identified), defining a maximum distance, along such "X" axis in the horizontal plane, of the material or structure in question. For example, a "width" of a structure that is at least partially hollow, or that is at least partially filled with one or more other material(s), is the horizontal dimension between outermost edges or sidewalls of the structure, such as an outer "X"-axis diameter for a hollow or filled, cylindrical structure.

As used herein, the term "length" means and includes a dimension, along an indicated "Y" axis in a horizontal plane (e.g., at a certain elevation, if identified), defining a maximum distance, along such "Y" axis in the horizontal plane, of the material or structure in question. For example, a "length" of a structure that is at least partially hollow, or that is at least partially filled with one or more other material(s), is the horizontal dimension between outermost edges or sidewalls of the structure, such as an outer "Y"-axis diameter for a hollow or filled, cylindrical structure.

As used herein, the term "laterally overlapping," when referring to a relative disposition of at least two materials or structures, is a spatially relative term that means and includes at least one portion—of one of the at least two materials or structures—occupying at least one horizontal plane (e.g., an elevation, a level) also occupied by at least one portion of another of the at least two materials or structures. Therefore, one structure "laterally overlapping" a second structure includes the first structure having at least one portion that overlaps in elevation with at least one portion of the second structure. Materials or structures described as "laterally overlapping" (with no mention of "directly") may be either directly laterally overlapping or indirectly laterally overlapping. "Directly laterally overlapping" materials or structures are each in physical contact, with one or more of the others of the directly laterally overlapping materials or structures, in a respective region of direct lateral overlap. Accordingly, "directly laterally overlapping" materials or structures are in direct physical contact with one another at the elevations of the region of direct lateral overlap. "Indirectly laterally overlapping" materials or structures are physically spaced from one another in a respective region of indirect lateral overlap. Accordingly, "indirectly laterally overlapping" materials or structures are not in direct physical contact with one another at the elevations of the region of indirect lateral overlap.

As used herein, the term "vertically overlapping," when referring to a relative disposition of at least two materials or structures, is a spatially relative term that means and includes at least one portion—of one of the at least two materials or structures—occupying at least one vertical plane also occupied by at least one portion of another of the at least two materials or structures. Materials or structures described as "vertically overlapping" (with no mention of "directly") may be either directly vertically overlapping or indirectly vertically overlapping. "Directly vertically overlapping" materials or structures are each in physical contact, with one or more of the others of the directly vertically overlapping materials or structures, in a respective region of direct vertical overlap. "Indirectly vertically overlapping" materials or structures are physically spaced from one another in a respective region of indirect vertical overlap.

As used herein, the terms "thickness" or "thinness" are spatially relative terms that mean and include a dimension in a straight-line direction that is normal to the closest surface of an immediately adjacent material or structure that is of a different composition or that is otherwise distinguishable from the material or structure whose thickness, thinness, or height is discussed.

As used herein, the term "between" is a spatially relative term used to describe the relative disposition of one material, structure, or sub-structure relative to at least two other materials, structures, or sub-structures. The term "between" may encompass both a disposition of one material, structure, or sub-structure directly adjacent the other materials, structures, or sub-structures and a disposition of one material, structure, or sub-structure indirectly adjacent to the other materials, structures, or sub-structures.

As used herein, the term "proximate" is a spatially relative term used to describe disposition of one material, structure, or sub-structure near to another material, structure, or sub-structure. The term "proximate" includes dispositions of indirectly adjacent to, directly adjacent to, and internal to.

As used herein, the term "neighboring," when referring to a material or structure, is a spatially relative term that means and refers to a next, most proximate material or structure of an identified composition or characteristic. Materials or structures of other compositions or characteristics than the identified composition or characteristic may be disposed between one material or structure and its "neighboring" material or structure of the identified composition or characteristic. For example, a structure of material X "neighboring" a structure of material Y is the first material X structure, e.g., of multiple material X structures, that is next most proximate to the particular structure of material Y. The "neighboring" material or structure may be directly or indirectly proximate the structure or material of the identified composition or characteristic.

As used herein, the term "consistent"—when referring to a parameter, property, or condition of one structure, material, feature, or portion thereof in comparison to the parameter, property, or condition of another such structure, material, feature, or portion of such same aforementioned structure, material, or feature—is a relative term that means and includes the parameter, property, or condition of the two such structures, materials, features, or portions being equal, substantially equal, or about equal, at least in terms of respective dispositions of such structures, materials, features, or portions. For example, two structures having "consistent" thickness as one another may each define a same, substantially same, or about the same thickness at X lateral distance from a feature, despite the two structures being at different elevations along the feature. As another example, one structure having a "consistent" width may have two portions that each define a same, substantially same, or about the same width at elevation Y1 of such structure as at elevation Y2 of such structure.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0 percent met, at least 95.0 percent met, at least 99.0 percent met, or even at least 99.9 percent met.

As used herein, the terms "on" or "over," when referring to an element as being "on" or "over" another element, are spatially relative terms that mean and include the element being directly on top of, adjacent to (e.g., laterally adjacent to, horizontally adjacent to, longitudinally adjacent to, vertically adjacent to), underneath, or in direct contact with the other element. It also includes the element being indirectly on top of, adjacent to (e.g., laterally adjacent to, horizontally adjacent to, longitudinally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, any spatially relative terms used in this disclosure are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one material's or feature's relationship to another material(s) or feature(s) as illustrated in the figures, using—as a reference point—the lowest illustrated surface of the structure that includes the materials or features. As used herein, a "level" and an "elevation" are each defined by a horizontal plane parallel to a primary surface of the substrate or base structure on or in which the structure (that includes the materials or features) is formed. "Lower levels" and "lower elevations" are relatively nearer to the bottom-most illustrated surface of the respective structure, while "higher levels" and "higher elevations" are relatively further from the bottom-most illustrated surface of the respective structure. Unless otherwise specified, any spatially relative terms used in this disclosure are intended to encompass different orientations of the materials in addition to the orientation as depicted in the figures. For example, the materials in the figures may be inverted, rotated, etc., with the "upper" levels and elevations then illustrated proximate the bottom of the page and the "lower" levels and elevations then illustrated proximate the top of the page.

As used herein, the terms "comprising," "including," "having," and grammatical equivalents thereof are inclusive or open-ended terms that do not exclude additional, unrecited elements or method steps, but these terms also include more restrictive terms "consisting of" and "consisting essentially of" and grammatical equivalents thereof. Therefore, a structure described as "comprising," "including," and/or "having" a material may be a structure that, in some embodiments, includes additional material(s) as well and/or a structure that, in some embodiments, does not include any other material(s). Likewise, a composition (e.g., gas) described as "comprising," "including," and/or "having" a species may be a composition that, in some embodiments, includes additional species as well and/or a composition that, in some embodiments, does not include any other species.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" means and includes any and all combinations of one or more of the associated listed items.

As used herein, the singular forms "a," "an," and "the" are intended to include the plural forms as well, unless the context clearly indicates otherwise.

As used herein, a "(s)" at the end of a term means and includes the singular form of the term and/or the plural form of the term, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly, or apparatus in a predetermined way.

The illustrations presented herein are not meant to be actual views of any particular material, structure, sub-structure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, in order to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

In referring to the drawings, like numerals refer to like components throughout. The drawings are not necessarily drawn to scale.

With reference to FIG. 1, illustrated, in elevational cross-sectional view, is a microelectronic device structure 100 that includes a stack structure 114 of vertically alternating (e.g., vertically interleaved) insulative structures 116 and conductive structures 118 arranged in tiers 122. An upper three levels of the stack structure 114 are illustrated, and a lower eight levels of the stack structure 114 are illustrated. Any number of additional levels and tiers 122 of the insulative structures 116, the conductive structures 118, or other regions (e.g., inter-dielectric regions) may be included between the levels that are illustrated, such as in the region indicated by dashed lines.

Slit structures 126 extend through the stack structure 114. The slit structures 126 include a doped material 128 that extends under the stack structure 114 to form a source region 134. A semiconductor base structure 130 underlies the doped material 128. In some embodiments, a conductive region 120 is beneath the semiconductor base structure 130, and an additional base structure 124 is beneath the semiconductor base structure 130. The slit structures 126 (e.g., elongate in a "Y"-axis direction) divide (e.g., across the "X"-axis direction) the stack structure 114 into blocks, as further discussed below. Pillars 132, including a channel material 110, also extend through the stack structure 114, through the doped material 128, and through the semiconductor base structure 130 (e.g., to the conductive region 120). While portions of two pillars 132 are illustrated in the perspective of FIG. 1, additional pillars 132 are present in the full microelectronic device structure.

The semiconductor base structure 130 may be formed of and include, for example, a semiconductor material (e.g., polysilicon). The conductive region 120 may include one or more regions of conductive material(s), such as a stack of tungsten (W) and tungsten silicide ($WSi_2$) defined into one or more source lines. The additional base structure 124 may be formed of and include, for example, a semiconductor material (e.g., polysilicon). The material of the additional base structure 124 may be the same or different (e.g., the same or a different semiconductor material) than that of the semiconductor base structure 130

The doped material 128, which is interposed between the semiconductor base structure 130 and the stack structure 114, provides the source region 134 adjacent a lower end of the pillars 132. The doped material 128 may be formed of and include, for example, a semiconductor material (e.g., the semiconductor material of the semiconductor base structure 130) doped with an N-type conductivity materials (e.g., polysilicon doped with at least one N-type dopant (e.g., one or more of arsenic, phosphorous, and/or antimony)) or doped with one of P-type conductivity materials (e.g., polysilicon doped with at least one P-type dopant (e.g., one or more of boron, aluminum, and/or gallium)).

The slit structure 126—extending through the stack structure 114—includes, in at least some embodiments, inter-slit support structures 106, such as pillar structures (e.g., block-like structures) extending through the stack structure 114 and through the doped material 128 of the elevations below the stack structure 114, as discussed further below. The inter-slit support structures 106 may be formed of and include an other doped material 104. For example, in embodiments in which the doped material 128 is formed of and includes an N-type dopant, the other doped material 104 may be formed of and include a P-type dopant. Alternatively, as another example, in embodiments in which the doped material 128 is formed of and includes a P-type dopant, the other doped material 104 may be formed of and include an N-type dopant.

In some embodiments, the slit structures 126 also include an insulative liner 136 (e.g., formed of and including one or more insulative material(s)). The insulative liner 136 may extend along vertical sidewalls of the slit structures 126. In some embodiments, sidewalls of the conductive structures 118 of the stack structure 114 are laterally recessed, relative to sidewalls of the insulative structures 116, along the slit structure 126. In such embodiments, the insulative liner 136 laterally extends—beyond the primary width (e.g., "X"-axis dimension) of the slit structure 126—in correspondence with the lateral recesses of the conductive structures 118. Notwithstanding any extensions into recesses of the conductive structures 118, portions of the insulative liner 136 laterally adjacent the inter-slit support structures 106 may, in some embodiments, be thicker (e.g., along the "X"-axis) than portions of the insulative liner 136 laterally adjacent the doped material 128, between neighboring inter-slit support structures 106.

In the stack structure 114, the insulative structures 116 may be formed of and include at least one insulative material 138, such as an electrically insulative material that may be formed of and include any one or more of the insulative material(s) discussed above (e.g., a dielectric oxide material, such as silicon dioxide). In this and other embodiments described herein, the insulative material 138 of the insulative structures 116 may be the same as or different than other insulative material(s) of the microelectronic device structure 100.

The conductive structures 118 of the stack structure 114 may be formed of and include one or more conductive materials 140, such as one or more of: at least one metal (e.g., one or more of tungsten, titanium, nickel, platinum, rhodium, ruthenium, iridium, aluminum, copper, molybdenum, silver, gold), at least one alloy (e.g., an alloy of one or more of the aforementioned metals), at least one metal-containing material that includes one or more of the aforementioned metals (e.g., metal nitrides, metal silicides, metal carbides, metal oxides, such as a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof), at least one conductively-doped semiconductor material (e.g., conductively-doped silicon, conductively-doped germanium, conductively-doped silicon germanium), polysilicon, and/or at least one other material exhibiting electrical conductivity. In some embodiments, the conductive structures 118 include at least one of the aforementioned electrically conductive materials along with at least one additional electrically conductive material configured, for example, as a liner.

One or more of the conductive structures 118 neighboring (e.g., proximal) the source region 134 of the doped material 128 are configured as a source-side GIDL region 142, such as a source-gate select device (e.g., an SGS device). In some embodiments, a single GIDL region (e.g., the source-side GIDL region 142) is present adjacent the source region 134. In other embodiments, more than one GIDL region (e.g., the source-side GIDL region 142 and one or more additional source-side GIDL regions 144) are present adjacent the source region 134. One or more conductive structures 118 atop the stack structure 114 may also be configured as GIDL region(s), such as a drain-side GIDL region 162, such as a drain-gate select device (e.g., an SGD device).

In the elevations of the stack structure 114 (e.g., elevations above the source region 134), the pillars 132 are laterally surrounded by the materials of the tiers 122 of the insulative structures 116 and the conductive structures 118. In elevations of the stack structure 114 at least above the GIDL region(s) (e.g., the source-side GIDL region 142 and, if included, the additional source-side GIDL regions 144), the channel material 110 may be interposed horizontally between an insulative material 112—forming a core of the pillar 132—and the tiers 122 of the stack structure 114. At least a portion of the channel material 110 is disposed vertically beneath the insulative material 112. In some embodiments, a horizontal dimension (e.g., width, diameter) of the insulative material 112 in elevations that include the channel material 110 may be greater than the horizontal dimension of the insulative material 112 in elevations that do not include the channel material 110.

The insulative material 112 may be formed of and include an electrically insulative material such as, for example, phosphosilicate glass (PSG), borosilicate glass (BSG), fluorosilicate glass (FSG), borophosphosilicate glass (BPSG), silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), or combinations thereof. In some embodiments, the insulative material 112 comprises silicon dioxide.

The channel material 110 may be formed of and include one or more of a semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and an oxide semiconductor material. The channel material 110 may be selected or otherwise formulated to have high mobility (e.g., a semiconductor material including one or more of a doped polysilicon, germanium (Ge), silicon germanium (SiGe), and/or gallium arsenide (GaAs)). In some embodiments, the channel material 110 includes a doped semiconductor material. The channel material 110 may, for example, be configured as a so-called "doped hollow channel" (DHC) structure.

The pillars 132 also include cell materials interposed horizontally between the channel material 110 and the tiers 122 of the stack structure 114. The cell materials may include a tunnel dielectric material 146 (also referred to as a "tunneling dielectric material"), which may be horizontally adjacent the channel material 110; a memory material 148, which may be horizontally adjacent the tunnel dielectric material 146; and a dielectric blocking material 150 (also referred to as a "charge blocking material"), which may be horizontally adjacent the memory material 148. In some embodiments, a dielectric barrier material is also horizontally interposed (e.g., directly horizontally interposed) between the dielectric blocking material 150 and the tiers 122 of the stack structure 114. The cell materials— including the tunnel dielectric material 146, the memory material 148, the dielectric blocking material 150, and, if present, the dielectric blocking material 150—also extend into the semiconductor base structure 130 and below the insulative material 112. However, the cell materials do not extend continuously from the stack structure 114 into the semiconductor base structure 130.

The tunnel dielectric material 146 may be formed of and include a dielectric material through which charge tunneling can be performed under suitable electrical bias conditions, such as through hot-carrier injection or by Fowler-Nordheim tunneling induced charge transfer. The tunnel dielectric material 146 may be formed of and include one or more of silicon oxide, silicon nitride, silicon oxynitride, dielectric metal oxides (e.g., aluminum oxide and hafnium oxide), dielectric metal oxynitride, dielectric metal silicates, alloys thereof, and/or combinations thereof. In some embodiments, the tunnel dielectric material 146 comprises silicon dioxide or silicon oxynitride.

The memory material 148 may comprise a charge trapping material or a conductive material. The memory material 148 may be formed of and include one or more of silicon nitride, silicon oxynitride, polysilicon (e.g., doped polysilicon), a conductive material (e.g., tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material polycrystalline or amorphous semiconductor material including at least one elemental semiconductor element or at least one compound semiconductor material, conductive nanoparticles (e.g., ruthenium nanoparticles), metal dots. In some embodiments, the memory material 148 comprises silicon nitride.

The dielectric blocking material 150 may be formed of and include one or more dielectric materials, such as, for example, one or more of an oxide (e.g., silicon dioxide), a nitride (e.g., silicon nitride), an oxynitride (e.g., silicon oxynitride), or another material. The material(s) of the dielectric blocking material 150 may be formed as one or more distinctive material regions (e.g., layers). In some embodiments, the dielectric blocking material 150 comprises a single material region, which may be formed of and include silicon oxynitride. In other embodiments, the dielectric blocking material 150 comprises a structure configured as an oxide-nitride-oxide (ONO) structure, with a series of material regions (e.g., layers) formed of and including, respectively, an oxide (e.g., silicon dioxide), a nitride (e.g., silicon nitride), and an oxide again (e.g., silicon dioxide).

In some embodiments, the tunnel dielectric material 146, the memory material 148, and the dielectric blocking material 150 together may form a structure configured to trap a charge, such as, for example, an oxide-nitride-oxide (ONO) structure. In some such embodiments, the tunnel dielectric material 146 comprises silicon dioxide, the memory material 148 comprises silicon nitride, and the dielectric blocking material 150 comprises silicon dioxide.

In embodiments including a dielectric barrier material, it may be formed of and include one or more of a metal oxide (e.g., one or more of aluminum oxide, hafnium oxide, zirconium oxide, lanthanum oxide, yttrium oxide, tantalum oxide, gadolinium oxide, niobium oxide, titanium oxide), a dielectric silicide (e.g., aluminum silicide, hafnium silicate, zirconium silicate, lanthanum silicide, yttrium silicide, tantalum silicide), and a dielectric nitride (e.g., aluminum nitride, hafnium nitride, lanthanum nitride, yttrium nitride, tantalum nitride).

A lateral opening 152 extends through the cell materials (e.g., the dielectric blocking material 150, the memory material 148, the tunnel dielectric material 146, and the dielectric barrier material, if present) and through the channel material 110. In some embodiments, the lateral opening 152 extends partially or wholly through the insulative material 112 (e.g., partially or wholly through a core of the pillar 132) in elevation(s) of the source region 134.

The doped material 128 of the source region 134 extends through the lateral opening 152; therefore, the doped material 128 extends laterally through the cell materials and the channel material 110. In some embodiments, the doped material 128 extends into or through the insulative material 112 of the pillar 132 in elevation(s) of the source region 134.

A sidewall of the doped material 128 may be in direct contact with the insulative material 112 at the core of the pillar 132. In some embodiments, the insulative material 112 may form a unitary structure, extending continuously from the elevations of the stack structure 114, through the elevations of the source region 134, and into elevations of the semiconductor base structure 130. In some such embodiments, the portion of the insulative material 112 extending through the elevations of the source region 134 may be horizontally narrower (e.g., thinner) than portions of the insulative material 112 extending through the elevations of the stack structure 114 and/or than portions of the insulative material 112 extending into elevations of the semiconductor base structure 130.

The channel material 110 and the cell materials of the pillar 132 are separated into upper and lower portions above and below the doped material 128 (e.g., above and below the lateral opening 152), respectively. The channel material 110 is vertically recessed both above and below the lateral opening 152.

In some embodiments, one or more of the cell materials (e.g., the tunnel dielectric material 146) may be vertically recessed both above and below the lateral opening 152. In these or other embodiments, one or more of the cell materials (e.g., the tunnel dielectric material 146) may be laterally recessed (e.g., thinned) in the vicinity of the vertical recesses in the channel material 110.

Where the channel material 110, the cell material(s) (e.g., the tunnel dielectric material 146), and/or the insulative material 112 of the core of the pillar 132 are recessed, vertically, laterally, or both, the doped material 128 of the source region 134 extends to fill the recesses, forming extensions of the doped material 128 within the footprint of (e.g., within the width of, within the diameter of) the pillar 132. For example, the doped material 128 extends upward and downward into spaces formed by vertical recesses into the channel material 110 and, in some embodiments, into one or more of the cell materials (e.g., the tunnel dielectric material 146). The doped material 128 may also extend laterally into spaces formed by lateral recesses into or lateral spaces through the insulative material 112 and, in some embodiments, into laterally recesses into or through one or more of the cell materials (e.g., the tunnel dielectric material 146). Therefore, the doped material 128 extends upwardly and downwardly, and (in some embodiments) laterally into or through, recesses that are within the footprint of the pillar 132.

These vertical extensions of the doped material 128 form an upper vertical extension 154 (extending upward to an elevation within the elevations of the stack structure 114, e.g., an elevation overlapping with, or nearly overlapping with, elevations of at least one of the GIDL regions, such as the source-side GIDL region 142 and/or the additional source-side GIDL region 144) and a lower vertical extension 156 (extending downward to an elevation within the elevations of the semiconductor base structure 130). Both the upper vertical extension 154 and the lower vertical extension 156 are near the base of the pillar 132, adjacent the source region 134.

The channel material 110 is recessed a vertical recess height 158—and the doped material 128 is formed to substantially fill the vertical recess height 158—above the lateral opening 152. Above the lateral opening 152, the channel material 110 interfaces with the doped material 128 at a level within elevations of the stack structure 114. Below the lateral opening 152, the channel material 110 interfaces with the doped material 128 at a level within elevations of the semiconductor base structure 130.

In embodiments in which the doped material 128 comprises a doped polysilicon material and in which the channel material 110 comprises a doped polysilicon material, the interface between the doped material 128 and the channel material 110 may nonetheless be visually distinguishable, e.g., via electron microscopy. In these or other embodiments, the dopant composition and/or dopant concentration in the doped material 128 may be different than the dopant composition and/or dopant concentration in the channel material 110. For example, the dopant concentration in the doped material 128 may be greater than the dopant concentration in the channel material 110.

The channel material 110 is vertically recessed, and the doped material 128 includes vertically-extending portions (e.g., the upper vertical extension 154, the lower vertical extension 156) so that the doped material 128 vertically extends to a level (e.g., elevation) near or at a level (e.g., elevation) of at least one source-side GIDL region(s) (e.g., the source-side GIDL region 142 and, in some embodiments, the additional source-side GIDL region 144). The upper vertical extension 154 may extend to a level that is within a range of about 10 nm below (e.g., about 5 nm below) a lowest surface of the lowest source-side GIDL region (e.g., the source-side GIDL region 142, which may be the lowest conductive structure 118 of the stack structure 114) to about even with an upper surface of the upper most source-side GIDL region (e.g., the additional source-side GIDL region 144, or the source-side GIDL region 142 if only a single source-side GIDL region is included in the stack structure 114). Accordingly, in an embodiment in which only the single source-side GIDL region 142 (e.g., only a single source-side, or lower, GIDL region) is included in the stack structure 114, the vertical recess height 158 may be in a range from about 10 nm less (e.g., within about 5 nm less), in vertical height, than the thickness of the lowest insulative structure 116 of the stack structure 114 to about the combined thickness of the lowest insulative structure 116 and the lowest conductive structure 118 of the stack structure 114. In embodiments in which multiple source-side GIDL regions are included, the vertical recess height 158 may not extend substantially above an upper surface of the uppermost of the source-side GIDL regions.

In some embodiments, the upper vertical extension 154 of the doped material 128 laterally overlaps some or all elevations of the source-side GIDL region 142 (e.g., at least the lowest conductive structure 118 of the stack structure 114). For example, according to the embodiment illustrated in FIG. 1, the channel material 110 is vertically recessed to, and the upper vertical extension 154 of the doped material 128 extends to, a height of about a middle elevation of the source-side GIDL region 142 (e.g., the lowest conductive structure 118 of the stack structure 114); therefore, the doped material 128 laterally overlaps a portion of the source-side GIDL region 142.

In embodiments in which—in addition to vertically recessing the channel material 110—the insulative material 112 is laterally recessed or laterally divided and/or in which one or more of the cell materials (e.g., the tunnel dielectric material 146) is/are laterally and/or vertically recessed, a horizontal thickness of the upper vertical extension 154 and/or the lower vertical extension 156 of the doped material 128 is greater than a horizontal thickness of the channel material 110 above the upper vertical extension 154.

Below the lateral opening 152, the lower vertical extension 156 of the doped material 128 may have a height about equal to the vertical recess height 158 of the upper vertical extension 154. In some embodiments, some of the channel material 110 may remain underneath the insulative material 112 of the core of the pillar 132. In some embodiments, a depth 160 of the cell materials of the pillars 132 below the lateral opening 152 may be in a range of from about three times (3×) to about four times (4×) the vertical recess height 158. Below the lateral opening 152, the channel material 110 and/or at least one of the cell materials may define a cross-sectional "U" shape.

The upper vertical extensions 154 of the doped material 128 facilitate a reliable functional (e.g., gated) communication between the channel material 110 and the proximate GIDL region(s) (e.g., the source-side GIDL region 142 or, in embodiments with more than one source-side GIDL region, both the source-side GIDL region 142 and the additional source-side GIDL regions 144).

In embodiments in which the upper vertical extension 154 fills lateral recess(es) (e.g., in the insulative material 112 and/or one or more of the cell materials), the increased width of the doped material 128 may also facilitate disposition of a relatively greater amount and/or concentration of dopant proximate the source-side GIDL region(s) than compared to, e.g., an upper vertical extension 154 of approximately equal horizontal thickness to that of the channel material 110. This relatively greater amount and/or concentration of dopant, from the doped material 128 of the upper vertical extension 154, may also facilitate the reliable functional (e.g., gated) communication between the channel material 110 and the proximate GIDL regions(s).

With the improved functional connection between the channel material 110 and the proximate GIDL region(s), during a block-erase operation the source-side GIDL region(s) (e.g., the source-side GIDL region 142, or the source-side GIDL region 142 and the additional source-side GIDL regions 144) induce formation of the holes (e.g., electron holes) in the channel material 110—while drain-side GIDL region(s) (e.g., the drain-side GIDL region 162) do likewise atop the channel material 110—to reliably erase the memory cells that are along the pillars 132, even when such pillars 132 pass through numerous tiers 122 (and therefore numerous conductive structures 118) of the stack structure 114.

The number (e.g., quantity) of tiers 122 (and conductive structures 118 and insulative structures 116) illustrated in the stack structure 114 of FIG. 1 may constitute only a lower portion of a much taller stack structure that includes many additional tiers 122 of the conductive structures 118 and the insulative structures 116. In some embodiments, a number (e.g., quantity) of the tiers 122 of the stack structure 114—and therefore the number (e.g., quantity) of conductive structures 118 in the stack structure 114—may be within a range of from thirty-two of the tiers 122 (and of the conductive structures 118) to three hundred, or even more, of the tiers 122 (and of the conductive structures 118). In some embodiments, the stack structure 114 includes one-hundred twenty-eight of the tiers 122 (and of the conductive structures 118). However, the disclosure is not so limited, and the stack structure 114 may include a different number of the tiers 122 (and of the conductive structures 118).

The stack structure 114 may be formed in one or more decks, with each of the decks including a vertically alternating sequence of the insulative structures 116 and the conductive structures 118 arranged in the tiers 122. For example, the illustrated lower eight levels of the stack structure 114 of FIG. 1 may represent only the lowest eight levels of a lower deck of the stack structure 114, and the illustrated upper three levels of the stack structure 114 of FIG. 1 may represent only the uppermost three levels of an upper deck of the stack structure 114. Any number of additional levels (e.g., insulative structures 116, conductive structures 118) may be included in either the lower deck or the upper deck in the space indicated, in FIG. 1, with dashed lines. Accordingly, the microelectronic device structure 100 of FIG. 1 may be only a portion of a microelectronic device structure 200 illustrated in FIG. 2, and the microelectronic device structure 200 may form the stack structure 114 in two parts (e.g., two decks), a lower deck 202 and an upper deck 204. In other embodiments, the stack structure 114 may include more than two decks.

The pillars 132 extend substantially vertically through each of the decks (e.g., the lower deck 202 and the upper deck 204) of the stack structure 114, as well as through the doped material 128, through the semiconductor base structure 130, and to the conductive region 120. In some embodiments, the materials of the pillars 132 (e.g., the insulative material 112 of the core, the channel material 110, and the cell materials that include the tunnel dielectric material 146, the memory material 148, and the dielectric blocking material 150 (FIG. 1)) are formed as material regions extending continuously (e.g., seamlessly and/or without distinctive portions) through the upper deck 204 and the lower deck 202 to the lateral opening 152 (FIG. 1). In other embodiments, the materials of the pillars 132 are separately formed in the upper deck 204 and the lower deck 202 such that separately-formed material regions interface proximate an interdeck portion 206. In some embodiments, the vertically alternating sequence of the conductive structures 118 and the insulative structures 116 of the tiers 122 (FIG. 1) may be interrupted, proximate the interdeck portion 206, by one or more other structures, such as an interdeck dielectric region that may be significantly thicker than any individual one of the insulative structures 116 of the tiers 122.

The slit structures 126, extending through the stack structure 114 (e.g., through all decks, including the upper deck 204 and the lower deck 202) divide the pillars 132 into blocks 208. Each of the blocks 208 may include an array of the pillars 132, and the sequence of blocks 208 may form a pillar array portion 210 of the microelectronic device structure 200.

Laterally adjacent the pillar array portion 210, either with or without intervening features, may be one or more staircase portions 212 that include staircase structure(s) having steps defined by lateral ends of at least some of the tiers 122 (FIG. 1). Operative, electrical contacts (not illustrated) may be included in the staircase portion 212 to form electrical connection to the various conductive structures 118 (FIG. 1) of the stack structure 114. The doped material 128, as well as the semiconductor base structure 130, may extend from the pillar array portion 210 to the staircase portion 212.

The microelectronic device structure 200 may further include additional features below the pillars 132, such as in or below one or more of the semiconductor base structure 130, the conductive region 120, and/or the additional base structure 124. For example, bit lines (not illustrated in FIG. 2) and bit contacts (not illustrated in FIG. 2) may be formed (e.g., within the footprint of the pillar array portion 210) in any one or more of the semiconductor base structure 130, the conductive region 120, and/or the additional base structure 124. The bit lines and bit contacts may be in operable communication with the pillars 132 and/or other electrical features of the microelectronic device structure 200. Additional conductive lines and contacts may also be included above, e.g., the upper deck 204, for electrical connection of the pillars 132 and/or other features of the microelectronic device structure 200. In some embodiments, CMOS (complementary metal-oxide-semiconductor) circuitry (not illustrated in FIG. 2) is included in a CMOS region 214 below the pillars 132 of the pillar array portion 210. The CMOS region 214 may include or be below any one or more of the semiconductor base structure 130, the conductive region 120, and/or the additional base structure 124. The microelectronic device structure 200 may be characterized as having a so-called "CMOS under Array" ("CuA") region.

Figure 2:
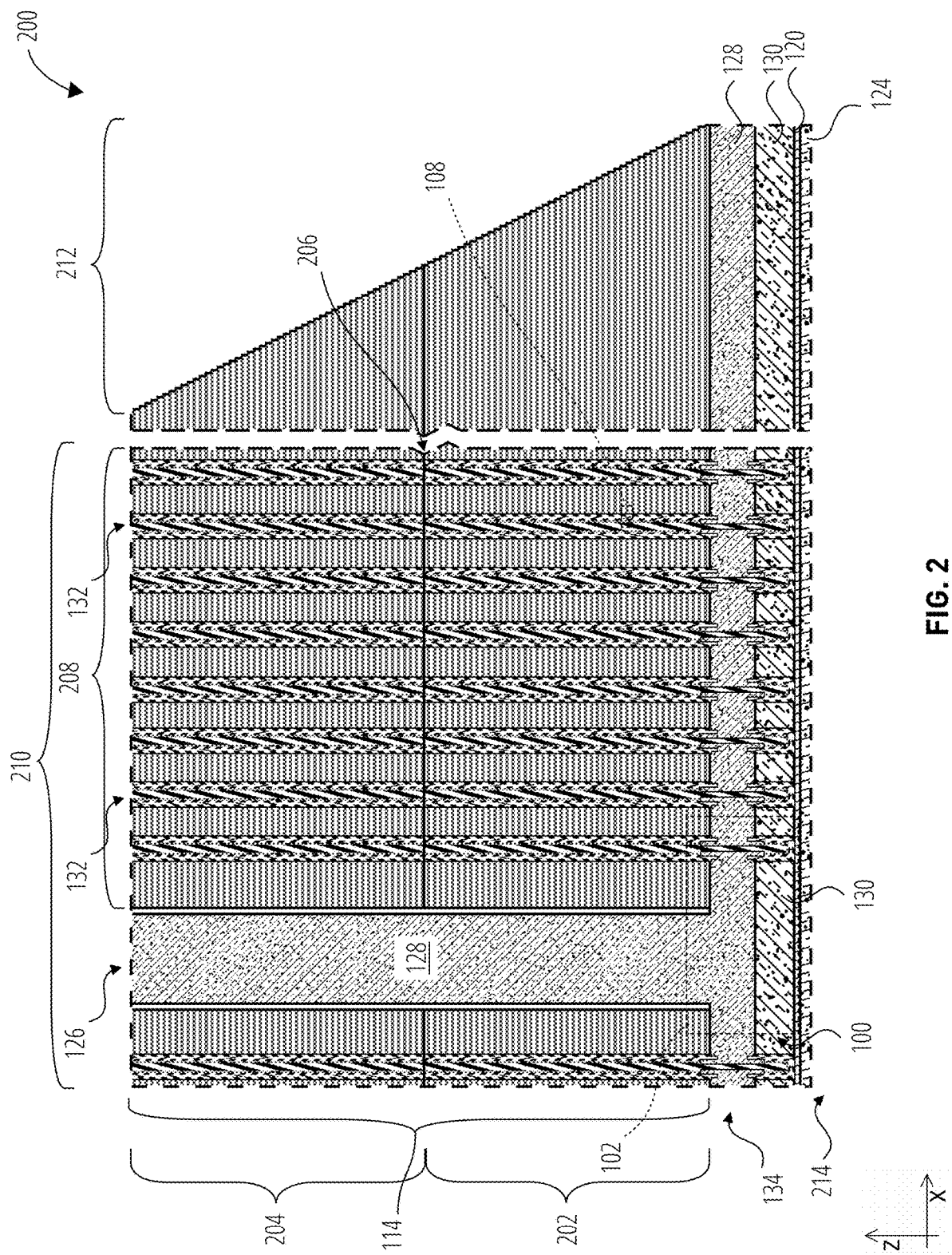
FIG. 2 is a cross-sectional, elevational, schematic illustration of a microelectronic device structure that may include the microelectronic device structure of FIG. 1, such that the illustration of FIG. 1 is an enlarged view corresponding to box 102 of FIG. 2, in accordance with embodiments of the disclosure.
Figure 3:
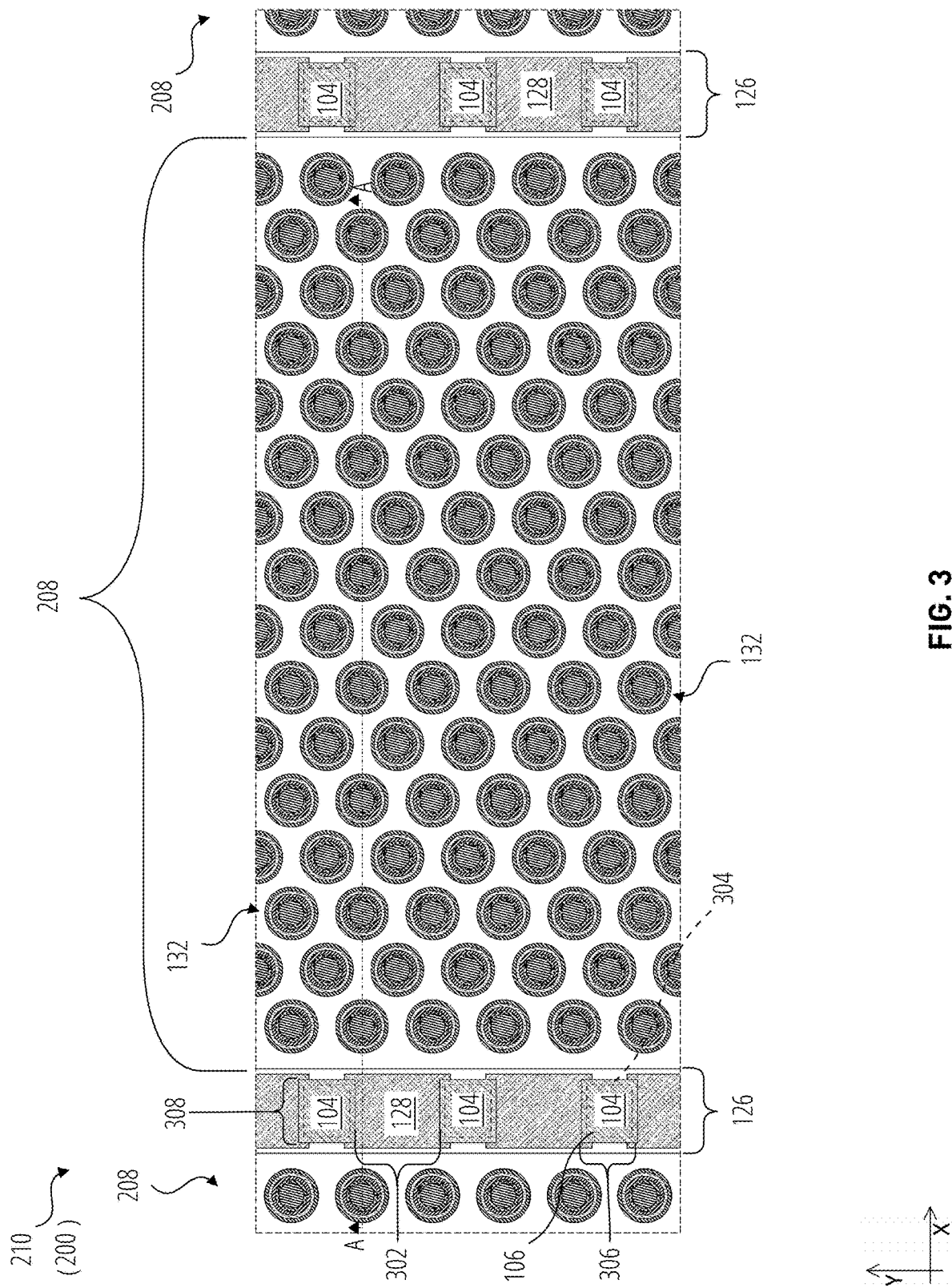
FIG. 3 is a top plan, schematic illustration of the microelectronic device structure of FIG. 2, wherein the view of FIG. 2 is taken along section line A-A of FIG. 3, in accordance with embodiments of the disclosure.

FIG. 3 illustrates, from a top-view perspective, one of the blocks 208 that includes an array of the pillars 132 (e.g., of the pillar array portion 210 (FIG. 2)). One block 208 is bordered, at its left and right lateral sides, by one of a pair of the slit structures 126. Additional blocks 208 may be disposed across the slit structures 126. In such a structure as that illustrated in FIG. 3, the pillar array portion 210 of FIG. 2 may be a cross-sectional view taken along section line A-A of FIG. 3. The staircase portion 212 of FIG. 2, which portion is not illustrated in the structure portion illustrated in FIG. 3, may be laterally disposed (e.g., in the "X"-axis direction) relative to that which is illustrated in FIG. 3.

In the discussions herein, descriptions of one pillar 132 may equally apply to any or all of the pillars 132 of one or more blocks 208 of a microelectronic device structure of any embodiment of this disclosure (e.g., the microelectronic device structure 100 of FIG. 1, the microelectronic device structure 200 of FIG. 2, etc.). Accordingly, some or all of the pillars 132 may have substantially the same materials and structures.

Likewise, in the discussions herein, descriptions of one slit structure 126 may equally apply to any or all of the slit structures 126 defining one or more blocks 208 of the microelectronic device structure(s) of any embodiment of this disclosure (e.g., the microelectronic device structure 100 of FIG. 1, the microelectronic device structure 200 of FIG. 2, etc.). Accordingly, some or all of the slit structures 126 have substantially the same materials and sub-structures.

Within a given slit structure 126, the inter-slit support structures 106 may be arranged in a series (e.g., a linear series). Within a respective one of the slit structures 126, the inter-slit support structures 106 may be spaced (e.g., substantially evenly spaced) by regions of the doped material 128. The inter-slit support structures 106 may be spaced a distance 302, which may be greater than or about equal a length 306 of the individual inter-slit support structures 106. For example, in some embodiments, individual inter-slit support structures 106 may define individual lengths 306 (e.g., along the "Y"-axis) of from about 100 nm to about 1 µm, and neighboring inter-slit support structures 106 may be spaced apart distances 302 of from about 1 µm to about 10 µm. In some embodiments, a ratio of the length 306 of the inter-slit support structure 106 to the distance 302 between the inter-slit support structures 106 may be from about 1:5 to about 1:20. The distance 302 between the neighboring inter-slit support structures 106 is substantially filled with the doped material 128; therefore, the distance 302 may also define a length of segments of the doped material 128 alternating with discrete segments of the other doped material 104 in the form of the inter-slit support structures 106. As discussed further below, the length 306, width 308, and relative spacing distance 302 of the inter-slit support structures 106 may be selected or otherwise tailored to provide sufficient structural support during material-removal stage (s) of the fabrication process.

Figure 4:
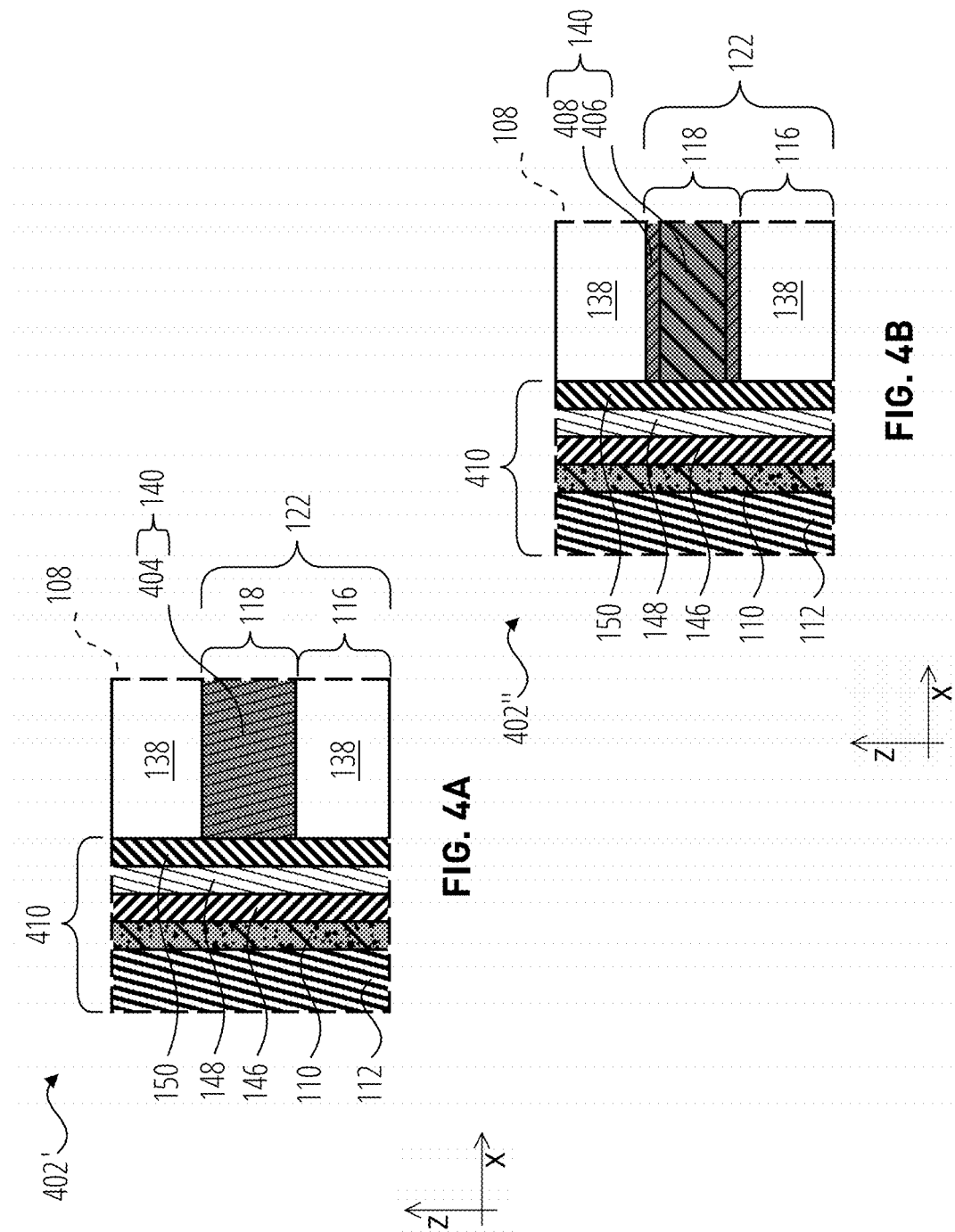
FIG. 4A and FIG. 4B are each a cross-sectional, elevational, schematic illustration of a memory cell, in accordance with embodiments of the disclosure, wherein the illustrated area corresponds to, e.g., box 108 of FIG. 1, FIG. 2, FIG. 24, and FIG. 25.

The pillars 132 may effectuate the formation of strings of memory cells of a memory device (e.g., a memory device including the microelectronic device structure 100 of FIG. 1, the microelectronic device structure 200 of FIG. 2 and FIG. 3, and/or any other microelectronic device structure described or illustrated herein). With reference to FIG. 4A and FIG. 4B, illustrated, in enlarged elevational cross-sectional view, are memory cells 402 (e.g., memory cell 402' of FIG. 4A and memory cell 402" of FIG. 4B) that may be provided in the microelectronic device structure 100 of FIG. 1, the microelectronic device structure 200 of FIG. 2, and/or any other microelectronic device structure illustrated with box 108. Each of the illustrations of FIG. 4A and FIG. 4B may represent a simplified enlarged view of box 108 of FIG. 1, FIG. 2, and/or other figures discussed below. Reference herein to one "memory cell 402" or multiple "memory cells 402" equally refers to one or multiple of any of the illustrated memory cell 402' of FIG. 4A and/or the illustrated memory cell 402" of FIG. 4B.

In the elevations of the stack structure 114 above the upper vertical extension 154 of doped material 128 (FIG. 1), the memory cells 402 are in the vicinity of at least one of the tiers 122, with at least one of the insulative structures 116 vertically adjacent at least one of the conductive structures 118. In some embodiments, such as that illustrated in FIG. 4A, the conductive material(s) 140 of the conductive structures 118 consist essentially of, or consist of, a single conductive material or a homogenous combination of conductive materials either of which is represented by a conductive material 404 illustrated in FIG. 4A. The conductive material 404 may be directly adjacent the insulative material 138 of the insulative structure 116, e.g., without a distinguishable conductive liner.

In other embodiments, such as that illustrated in FIG. 4B, the conductive material(s) 140 of some or all of the conductive structures 118 may include a conductive metal 406 surrounded at least in part by a conductive liner material 408. The conductive liner material 408 may be directly adjacent upper and lower surfaces of neighboring insulative structures 116, respectively. The conductive metal 406 may be directly vertically between portions of the conductive liner material 408.

Memory cells 402" having the structure of FIG. 4B may be formed by a so-called "replacement gate" process, discussed further below. The conductive liner material 408 may comprise, for example, a seed material that enables formation of the conductive metal 406 during the replacement-gate process. The conductive liner material 408 may be formed of and include, for example, a metal (e.g., titanium, tantalum), a metal nitride (e.g., tungsten nitride, titanium nitride, tantalum nitride), or another material. In some embodiments, the conductive liner material 408 comprises titanium nitride, and the conductive metal 406 comprises tungsten.

With continued reference to FIG. 4A and FIG. 4B, adjacent the tiers 122, with the insulative structures 116 and the conductive structures 118, are materials of one of the pillars 132 (e.g., FIG. 1) (partially illustrated, in FIG. 4A and FIG. 4B, as a pillar portion 410, which may be about half of the lateral width, e.g., the diameter, of the pillar 132). As illustrated in the pillar portion 410, each of the pillars 132 (FIG. 1) includes—at least above the upper vertical extension 154 of the doped material 128 (FIG. 1)—the channel material 110 and the cell materials (e.g., the tunnel dielectric material 146, the memory material 148, and the dielectric blocking material 150) that may each laterally surround the insulative material 112 at the core (e.g., the axial center) of the pillar 132 (FIG. 1).

In some embodiments of memory cells, such as with the memory cell 402' of FIG. 4A and the memory cell 402" of FIG. 4B, the channel material 110 may be horizontally interposed between the insulative material 112 and the tunnel dielectric material 146; the tunnel dielectric material 146 may be horizontally interposed between the channel material 110 and the memory material 148; and the memory material 148 may be horizontally interposed between the tunnel dielectric material 146 and the dielectric blocking material 150. In some such embodiments, the dielectric blocking material 150 is horizontally interposed between the memory material 148 and a dielectric barrier material (not illustrated), and the dielectric barrier material may be directly adjacent the conductive structure 118 and the insulative structure 116 of the tier 122. In other such embodiments, the dielectric blocking material 150 is directly horizontally interposed between the memory material 148 and the tier 122.

To effectuate the memory cell 402 (e.g., the memory cell 402' of FIG. 4A, the memory cell 402" of FIG. 4B), one of the conductive structures 118 laterally surrounds (e.g., encircles) the materials of the pillar 132 (e.g., FIG. 3). In embodiments corresponding to the memory cell 402' of FIG. 4A, the conductive material 404 laterally surrounds the materials of the pillar 132 (e.g., FIG. 3); whereas, in embodiments corresponding to the memory cell 402" of FIG. 4B, both the conductive metal 406 and the conductive liner material 408 laterally surround the materials of the pillar 132 (e.g., FIG. 3).

Accordingly, each of the pillars 132 (e.g., FIG. 2) may provide a string of memory cells 402 extending vertically, or at least partially vertically, through the stack structure 114 (FIG. 2), from the source region 134 (FIG. 2) to a drain region above the stack structure 114. At least one of the conductive structures 118 adjacent the source region 134, below the stack structure 114, is configured as a GIDL region (e.g., a source-side select device) while at least one of the conductive structures 118 adjacent the drain region, above the stack structure, is configured as another GIDL region (e.g., a drain-side select device).

Accordingly, disclosed is a microelectronic device comprising a stack structure. The stack structure comprises a vertically alternating sequence of insulative structures and conductive structures arranged in tiers. At least one pillar extends through the stack structure. The at least one pillar comprises a channel material. A source region, below the stack structure, comprises a doped material. A vertical extension of the doped material protrudes upward to an interface with the channel material at an elevation within the stack structure. The vertical extension of the doped material defines a greater horizontal thickness than a horizontal thickness defined by the channel material above the interface.

While forming a sufficient amount of dopant adjacent the upper, drain-side GIDL region may be relatively straight forward, forming a sufficient amount of dopant adjacent the lower, source-side GIDL region(s) is more challenging. By the methods described below, the source region 134 (FIG. 1, FIG. 2) is formed to include the upwardly-extending vertical projections (e.g., the upper vertical extensions 154 (FIG. 1)) so that the doped material 128 (FIG. 1) is disposed near or laterally overlapping with at least one lower, source-side GIDL region (e.g., the source-side GIDL region 142 (FIG. 1) and, in some embodiments, the additional source-side GIDL region 144 (FIG. 1))—and with a relatively greater volume of doped material 128 near or laterally overlapping with the at least one lower, source-side GIDL region (e.g., the source-side GIDL region 142 (FIG. 1) and, in some embodiments, the additional source-side GIDL region 144 (FIG. 1))—to facilitate a reliable gated connection between the GIDL region (e.g., the source-side GIDL region 142 (FIG. 1) and, in some embodiments, the additional source-side GIDL region 144 (FIG. 1)) and the channel material 110 that interfaces with the doped material 128.

With reference to FIG. 5 through FIG. 19, illustrated are various stages for forming a microelectronic device, such as one including the microelectronic device structure 100 of FIG. 1 and/or the microelectronic device structure 200 of FIG. 2 and FIG. 3.

Figure 5:
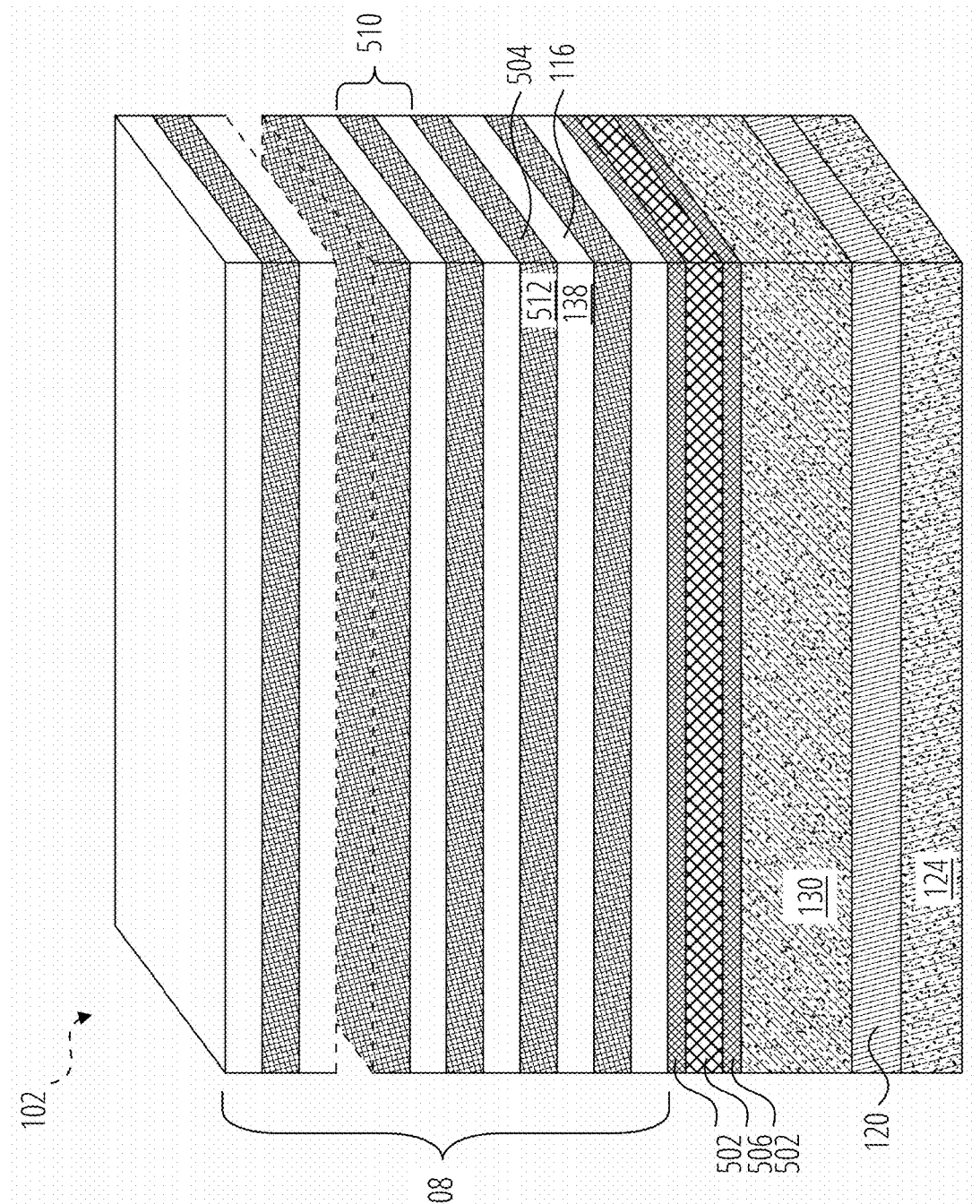
FIG. 5 through FIG. 19 are cross-sectional, elevational, schematic illustrations of various stages of processing to fabricate the microelectronic device structures of FIG. 1 through FIG. 3, in accordance with embodiments of the disclosure, wherein the view of FIG. 19 is taken along section line B-B of FIG. 1.

With reference to FIG. 5, a sacrificial structure with a sequence (e.g., "sandwich" structure) of different sacrificial materials is formed on the semiconductor base structure 130 in the elevations that will eventually become the source region 134 (FIG. 1). A region (e.g., layer) of a first sacrificial material 502 may be formed (e.g., deposited) on an upper surface of the semiconductor base structure 130, a region (e.g., layer) of a second sacrificial material 506 may be formed (e.g., deposited) on the first sacrificial material 502, and an additional region (e.g., layer) of the first sacrificial material 502 may be formed on the second sacrificial material 506.

Each of the first sacrificial material 502 regions may be formed to a thickness in a range from about 10 nm to about 40 nm. The region of the second sacrificial material 506 may be formed to a thickness in a range from about 30 nm to about 60 nm. The thickness of the second sacrificial material 506 may subsequently define a height of the lateral opening 152 (FIG. 1). Therefore, the thickness of the second sacrificial material 506 may be tailored to facilitate forming the lateral opening 152 with a sufficient height to facilitate subsequent recess formation and recess filing acts. A thickness of the sacrificial sandwich structure (e.g., a combined thickness of the lower region of the first sacrificial material 502, the region of the second sacrificial material 506, and the upper region of the first sacrificial material 502) may correspond to the thickness of the source region 134 (e.g., the doped material 128 to be formed between the semiconductor base structure 130 and the stack structure 114 (FIG. 1)).

The first sacrificial material 502 and the second sacrificial material 506 may be selected or otherwise formulated so that the second sacrificial material 506 is selectively removable (e.g., selectively etchable) relative to the first sacrificial material 502. The second sacrificial material 506 may further be selected or otherwise formulated to be selectively removable (e.g., selectively etchable) relative to the material of the semiconductor base structure 130 (e.g., relative to semiconductor material such as polysilicon), and/or relative to insulative materials (e.g., oxides, nitrides, oxynitrides), such as in the dielectric blocking material 150 (FIG. 1). The first sacrificial material 502 may also be formulated or otherwise selected to be selectively removable (e.g., selectively etchable) relative to semiconductor material (e.g., of the semiconductor base structure 130, of the channel material 110, of the other doped material 104 of the inter-slit support structures 106 (FIG. 1)), and/or relative to insulative materials (e.g., of the insulative materials 138, of the dielectric blocking material 150, of the tunnel dielectric material 146, and/or other insulative or dielectric structures). In some embodiments, the first sacrificial material 502 may be formed of and include silicon carbon nitride (SiCN), and the second sacrificial material 506 may be formed of and include silicon germanium (SiGe). In some such embodiments, the amount of carbon included in the SiCN of the first sacrificial material 502 may be selected to achieve the desired etch selectivity of the first sacrificial material 502. For example, the SiCN of the first sacrificial material 502 may comprise carbon in a range from about 5 at. % to about 75 at. % of the SiCN (e.g., in a range from about 5 at. % to about 25 at. % of the SiCN).

A stack structure 508 is formed on the upper region of the first sacrificial material 502. The stack structure 508 is formed to include a vertically alternating sequence of the insulative structures 116 and sacrificial structures 504 arranged in tiers 510. The sacrificial structures 504 may be formed at levels of the stack structure 508 that will eventually be replaced with or otherwise converted into the conductive structures 118 (FIG. 1).

The sacrificial material 512 of the sacrificial structures 504 may be selected or otherwise formulated to be selectively removable (e.g., selectively etchable) relative to the insulative material 138 of the insulative structures 116. In some embodiments, the insulative material 138 comprises silicon dioxide and the sacrificial material 512 comprises silicon nitride.

To form the stack structure 508, formation (e.g., deposition) of the insulative materials 138 of the insulative structures 116 may be alternated with formation (e.g., deposition) of the sacrificial material 512 of the sacrificial structures 504. In some embodiments, the stack structure 508 may be formed, at this stage, to include as many tiers 510 with sacrificial structures 504 as there will be tiers 122 (FIG. 1) of conductive structures 118 (FIG. 1) in all deck(s) (e.g., the lower deck 202, the upper deck 204 (FIG. 2)) of the microelectronic device structure being fabricated (e.g., the microelectronic device structure 200 of FIG. 2). In other embodiments, only the tiers 122 of the lower deck 202 are formed at this stage, and the subsequent stages illustrated in FIG. 5 through FIG. 23 may be carried out only in or for the lower deck 202, prior to fabricating the upper deck 204.

Figure 6:
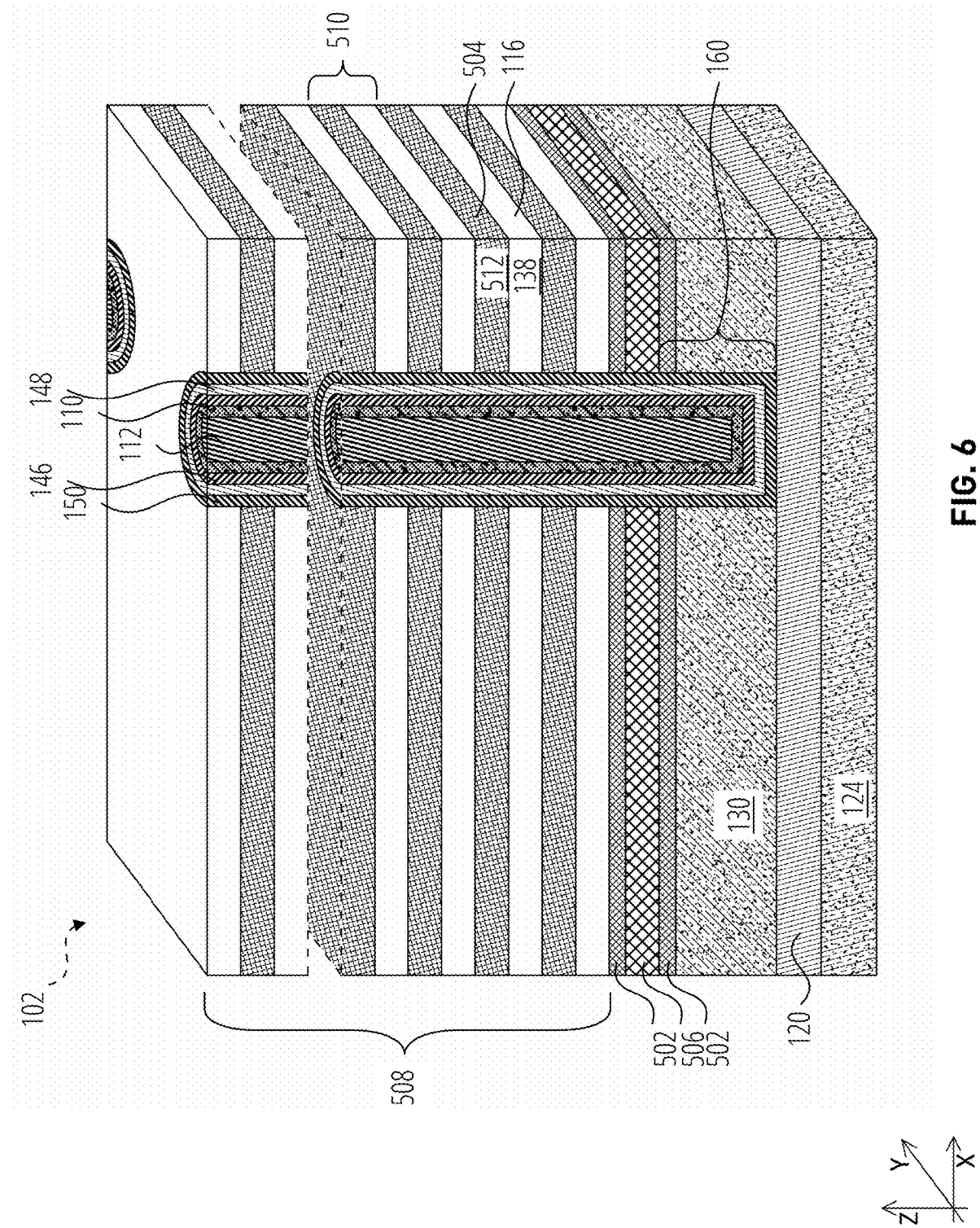

With reference to FIG. 6, pillar openings may be formed (e.g., etched) through the stack structure 508, through the sandwich structure of the first sacrificial material 502 and the second sacrificial material 506, through the semiconductor base structure 130, to the conductive region 120. The arrangement of the pillar openings may correspond to the arrangement of the pillars 132 (FIG. 3) to be formed in the pillar array portion 210 (FIG. 3).

The pillar openings may be formed to the depth 160—e.g., a vertical distance between a base of the pillar opening to an upper surface of the lower region of the first sacrificial material 502—defined by the combined thickness of the semiconductor base structure 130 and the lower region of the first sacrificial material 502. The depth 160 may subsequently define the height of the U-shaped cell material structure that may remain under the insulative material 112 core of the pillars 132 (FIG. 1) after forming the lateral opening 152 (FIG. 1).

Within each of the pillar openings, the cell materials (e.g., the dielectric barrier material, if any, the dielectric blocking material 150, the memory material 148, and the tunnel dielectric material 146) may be formed (e.g., conformally deposited) in sequence. The channel material 110 may be formed (e.g., conformally deposited) on the cell materials (e.g., on the tunnel dielectric material 146). The insulative material 112 may be formed (e.g., deposited) to fill remaining space defined by the channel material 110.

Figure 7:
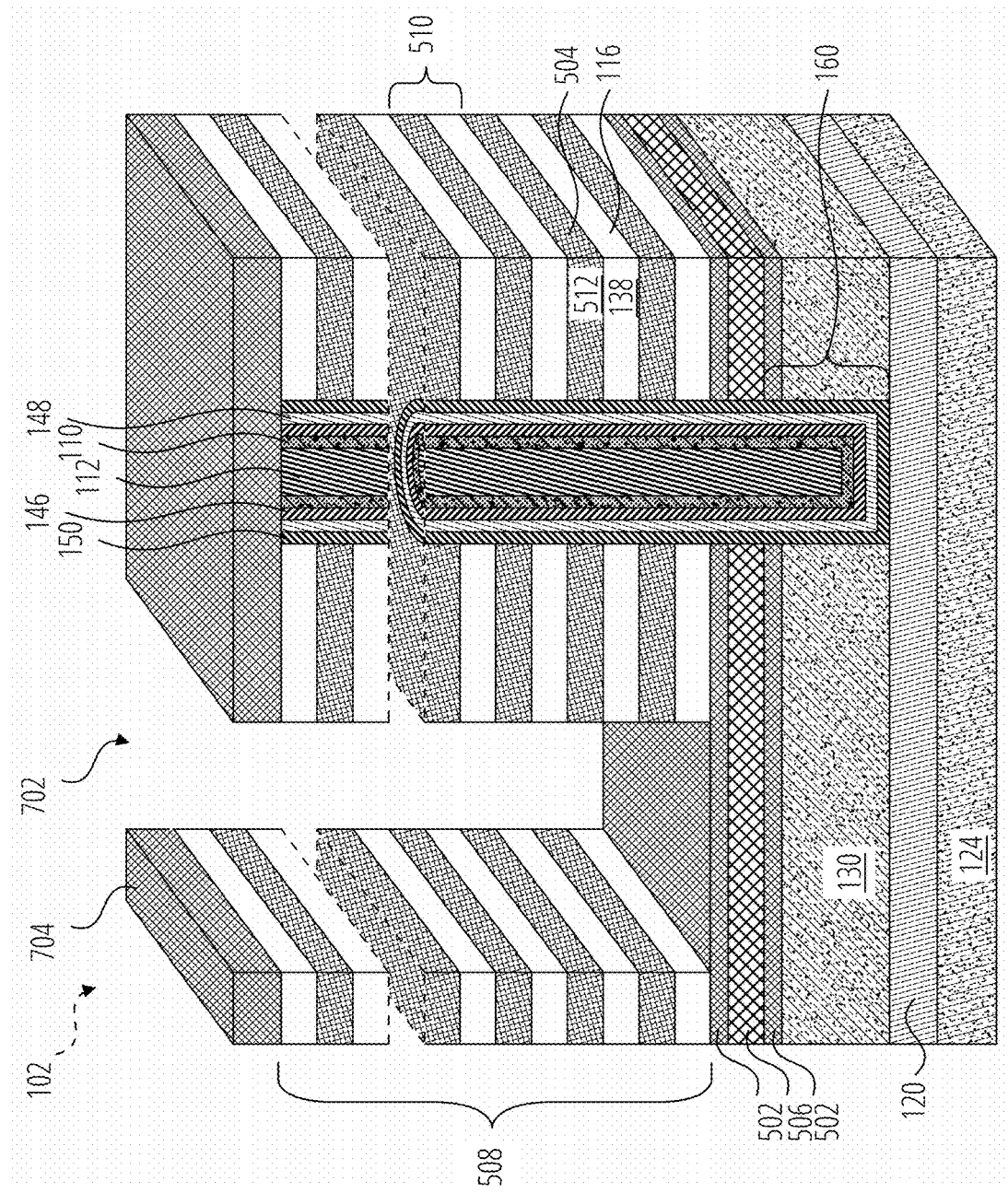

With reference to FIG. 7, a slit 702 is formed (e.g., etched) for each slit structure 126 (FIG. 1) to be formed in the microelectronic device structure (e.g., the microelectronic device structure 100 of FIG. 1, the microelectronic device structure 200 of FIG. 2 and FIG. 3). The slits 702 are formed to extend through the stack structure 508 to the upper region of the first sacrificial material 502, which is exposed at a base of the slit 702. The second sacrificial material 506 may not be exposed in the slits 702.

In some embodiments, prior to forming the slits 702 a sacrificial hard mask 704 may be formed on the stack structure 508, and the sacrificial hard mask 704 may be etched to define the pattern for the slits 702. The sacrificial hard mask 704 may comprise a sacrificial material such as SiCN. Accordingly, in some embodiments, the sacrificial hard mask 704 may comprise a same sacrificial material as the first sacrificial material 502 in the sacrificial sandwich structure below the stack structure 114.

Figure 8:
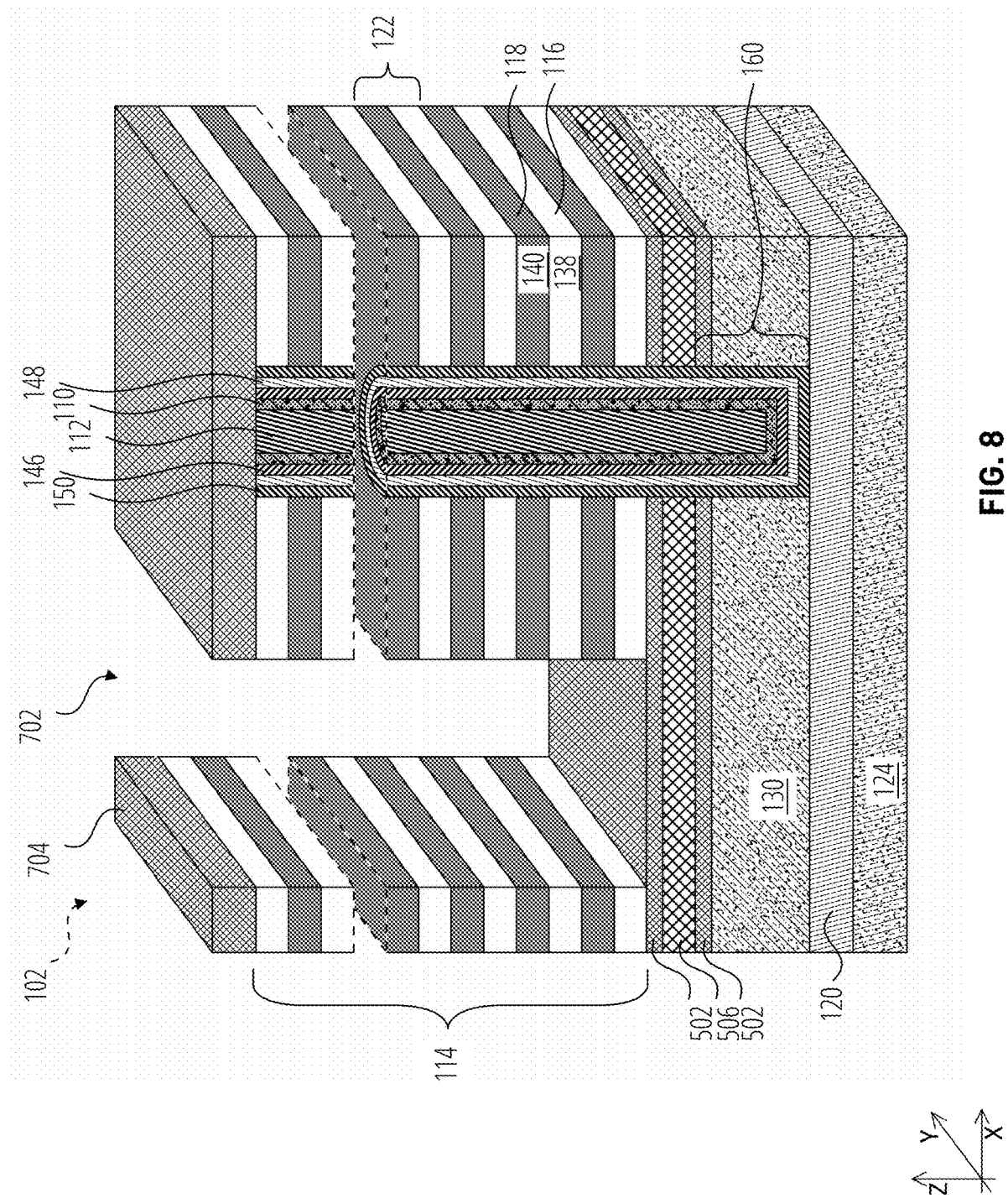
Figure 9:
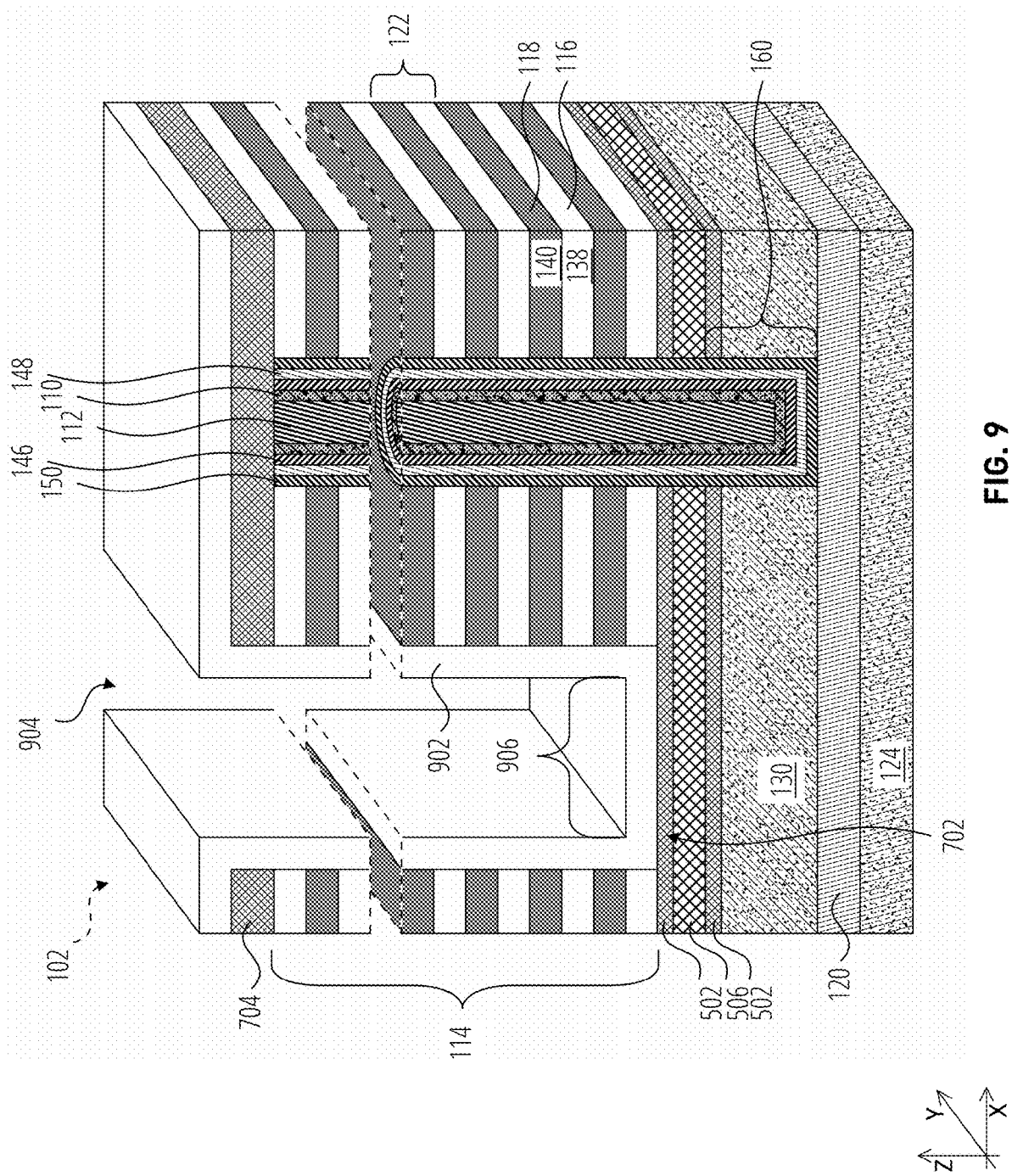

A "replacement gate" process is performed, via the slit 702, to exhume the sacrificial material 512 (FIG. 7)—and therefore the sacrificial structures 504 (FIG. 7)—and to form, as illustrated in FIG. 8, the conductive material(s) 140 (e.g., the conductive material 404 of FIG. 4A and/or the conductive liner material 408 and the conductive metal 406 of FIG. 4B) in place of the sacrificial structures 504 (FIG. 7). The replacement gate process forms the conductive structures 118 of the tiers 122 of the stack structure 114.

An insulative liner 902 is formed (e.g., conformally formed, deposited) to line the slits 702 (FIG. 8), forming a lined slit 904. The insulative liner 902 may also be formed on the sacrificial hard mask 704. In some embodiments, the conductive structures 118 are laterally recessed, relative to the insulative structures 116, along the slit 702 (FIG. 8), and the insulative liner 902 may be formed to fill such lateral recesses.

The insulative liner 902 may be formed of any one or more of the insulative materials described above. The composition of the insulative material(s) of the insulative liner 902 may be the same as or different from that of the insulative material 138 of the insulative structures 116. In some embodiments, the insulative liner 902 is formed of and includes an oxide material (e.g., silicon oxide).

Figure 10:
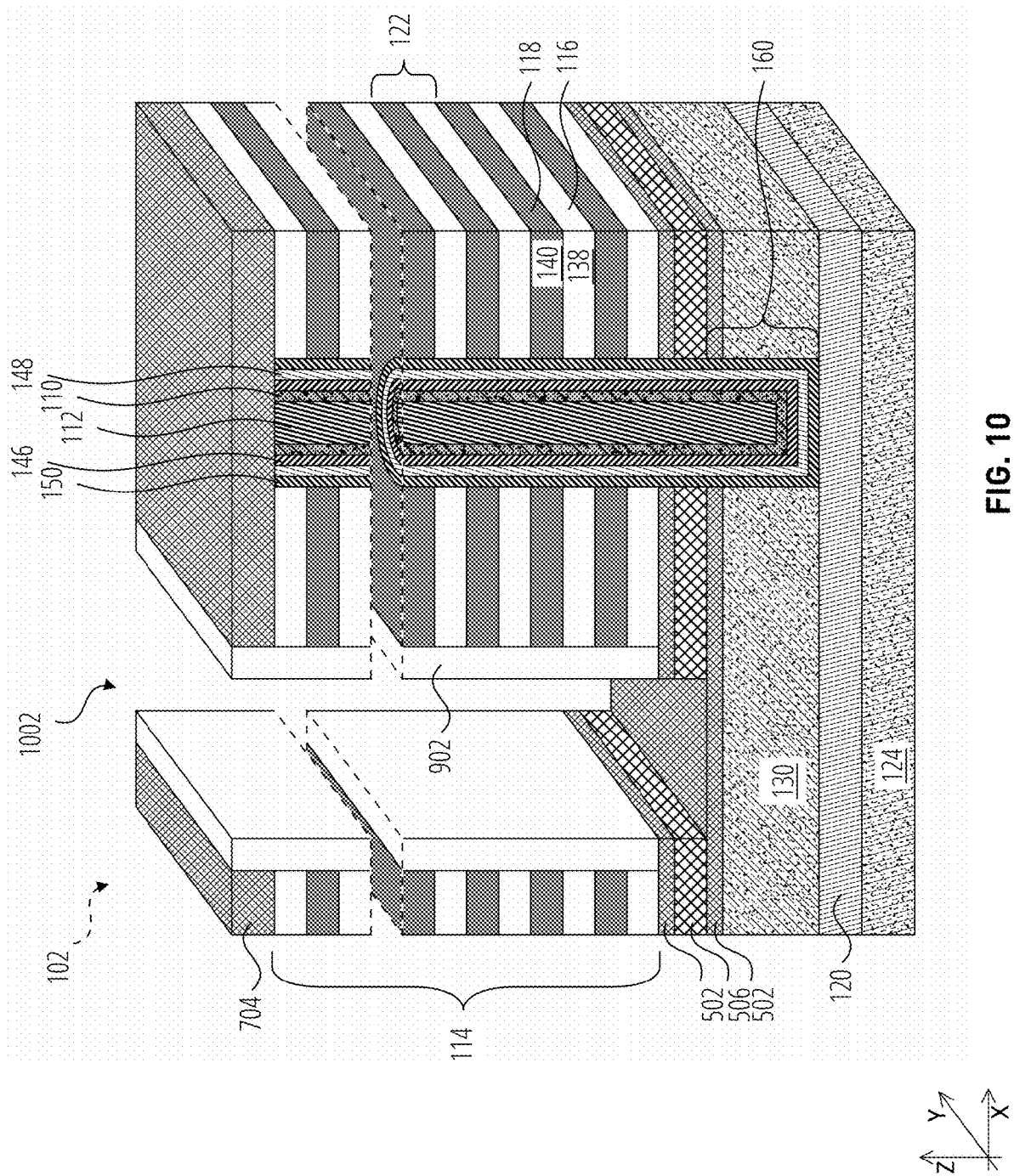

A base portion 906 of the insulative liner 902 may be removed (e.g., etched), as illustrated in FIG. 10, exposing the upper region of the first sacrificial material 502 and leaving portions of the insulative liner 902 to cover sidewalls of the tiers 122 of the stack structure 114. During or after removing the base portion 906 of the insulative liner 902, the portion(s) of the insulative liner 902 that were above the sacrificial hard mask 704 may also be removed, as illustrated in FIG. 10.

With continued reference to FIG. 10, in some embodiments—while or after etching through the base portion 906 (FIG. 9) of the insulative liner 902, the etching is continued through the upper region of the first sacrificial material 502 and through the second sacrificial material 506 to expose the lower region of the first sacrificial material 502 at the base of the a resulting extended slit 1002. Etching through the upper region of the first sacrificial material 502 and through the second sacrificial material 506 may be performed in one or more material-removal processes, such as conducting a sequence of etching acts with etchants tailored to selectively remove the first sacrificial material 502 and then the second sacrificial material 506 without substantially removing insulative materials such as the insulative material of the insulative liner 902.

In embodiments in which the first sacrificial material 502 was formed of and includes SiCN and the second sacrificial material 506 was formed of and includes SiGe, the upper region of the first sacrificial material 502 may be selectively etched by a dry etching process, and the second sacrificial material 506 may be selectively etched by, for example, a "wet" etchant chemistry comprising, consisting essentially of, or consisting of, e.g., a mixture of hydrogen fluoride (HF), hydrogen peroxide ($H_2O_2$), and acetic acid ($CH_3COOH$) or by, for another example, a "dry" etch chemistry comprising, consisting essentially of, or consisting of, e.g., a mixture of vapor-phase hydrochloric acid (HCl(g)) in a epitaxy reactor. In other embodiments, other etch chemistries or selective material-removal techniques may be used for either or both the selective etching of the first sacrificial material 502 and the second sacrificial material 506 to complete the formation of the extended slits 1002.

Etching through the first sacrificial material 502 may also remove some material from the sacrificial hard mask 704 above the stack structure 114. At least some portion of the sacrificial hard mask 704 remains so that an uppermost level (e.g., an uppermost insulative structure 116) of the stack structure 114 remains covered by the sacrificial hard mask 704 above.

A resulting extended slit 1002 exposes sidewalls of the second sacrificial material 506 and an upper surface of the lower region of the first sacrificial material 502. Accordingly, the extended slit 1002 may extend through elevations above the lower region of the first sacrificial material 502, and sidewalls of the extended slit 1002 are defined by the insulative liner 902 that remains to cover the sidewalls of the stack structure 114 so that the tiers 122 are not exposed in the extended slit 1002.

Figure 11:
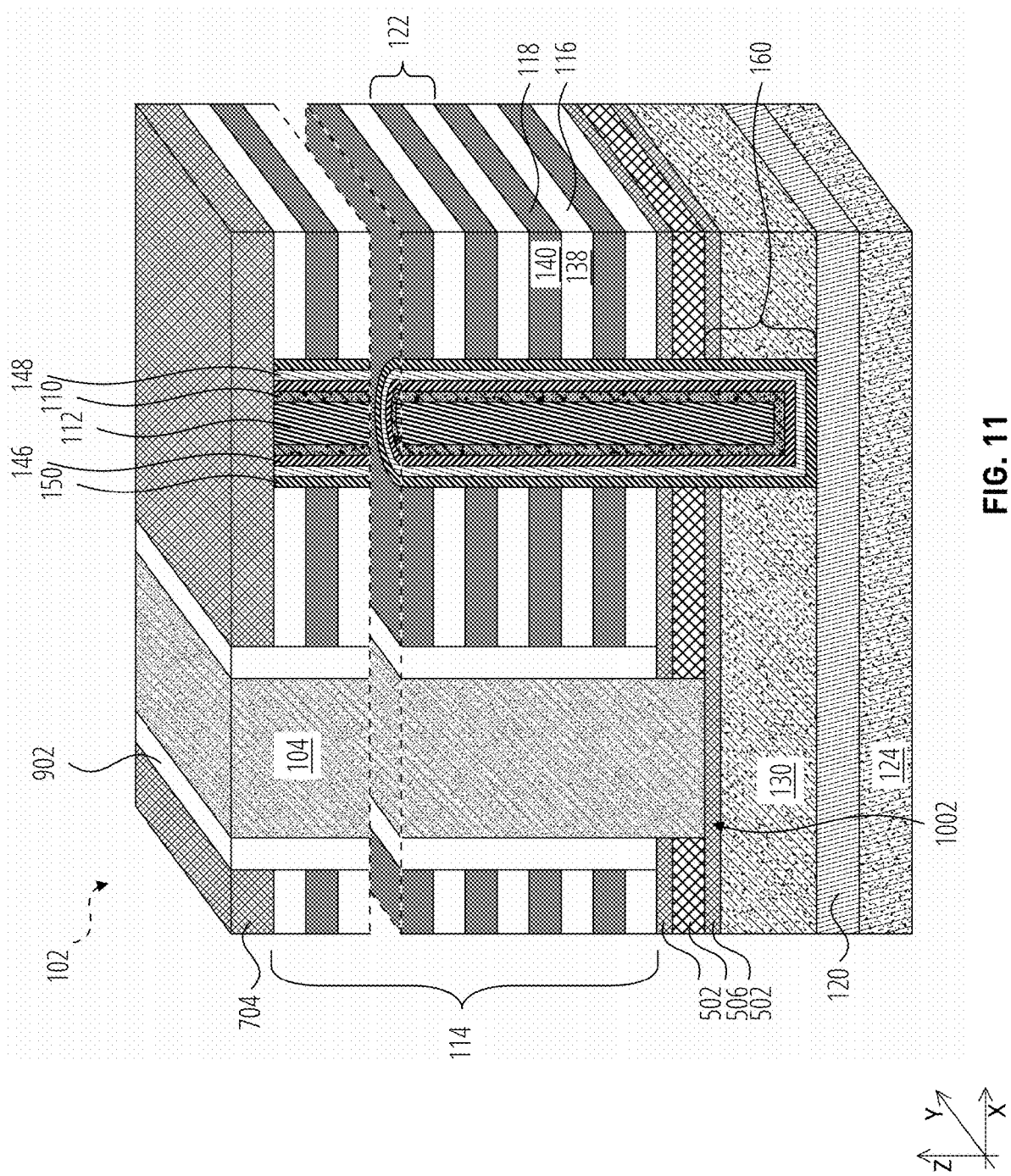

With reference to FIG. 11, the other doped material 104 is formed (e.g., deposited) in the extended slits 1002. The other doped material 104 may be formed to fill or substantially fill the extended slits 1002. A lower surface of the other doped material 104 may be directly adjacent (e.g., directly vertically above) an upper surface of the lower region of the first sacrificial material 502.

Figure 12:
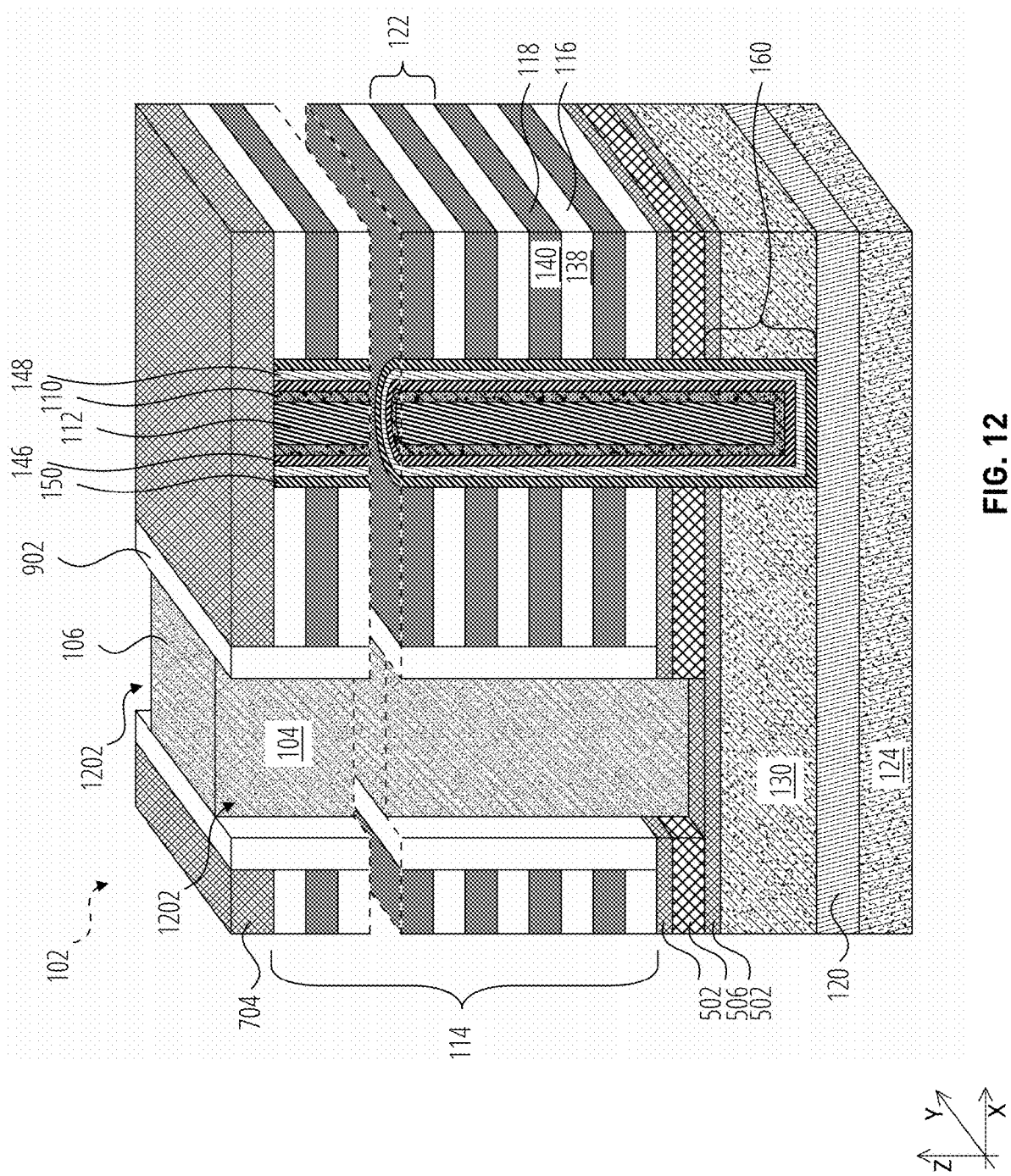

With reference to FIG. 12, discrete segments of the other doped material 104 are removed (e.g., etched) to form inter-slit openings 1202 extending through the other doped material 104. The dimensions and relative spacing of the inter-slit openings 1202 may be selected or otherwise configured to form the inter-slit openings 1202 in accordance with the dimensions and arrangement of the inter-slit support structures 106 (e.g., FIG. 3) to be formed in the inter-slit openings 1202.

Figure 13:
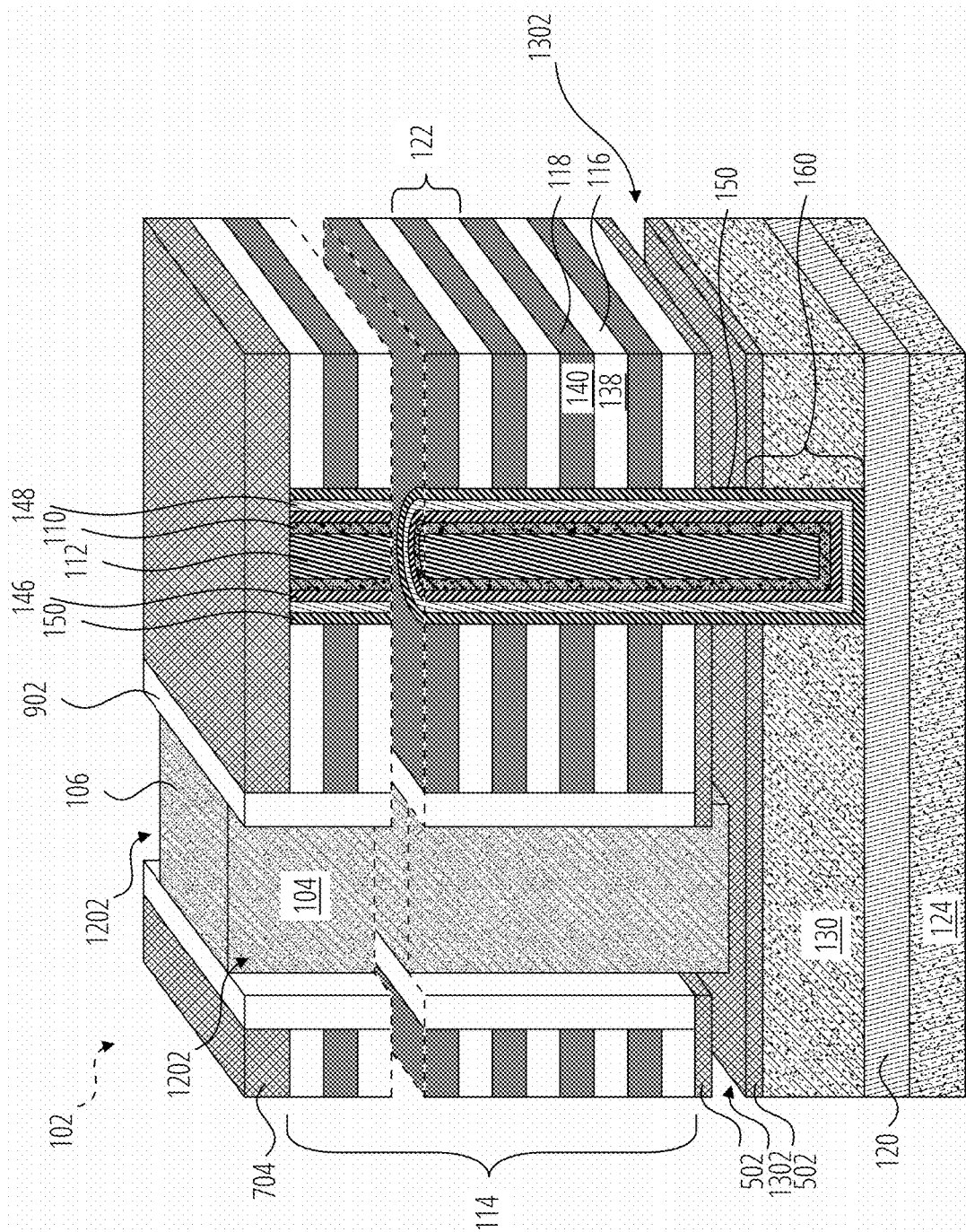

Forming the inter-slit openings 1202 exposes the sidewalls of the second sacrificial material 506 without exposing the tiers 122 of the stack structure 114. The second sacrificial material 506 is removed (e.g., exhumed) via the inter-slit openings 1202 to form, as illustrated in FIG. 13, a void 1302 vertically interposed between the regions of the first sacrificial material 502. Removing the second sacrificial material 506 (FIG. 12) exposes—in the elevations that had been occupied by the second sacrificial material 506 (FIG. 12)—an exterior sidewall of the outermost material(s) of the cell materials (e.g., a sidewall of the dielectric blocking material 150).

To form the void 1302, the second sacrificial material 506 (FIG. 12) may be selectively removed without substantially removing the insulative liner 902, the first sacrificial material 502, and the outer material of the cell materials (e.g., the dielectric blocking material 150). In embodiments in which the second sacrificial material 506 (FIG. 10) was formed of and includes SiGe, the second sacrificial material 506 may be selectively removed by any one or more of the SiGe-selective etchant chemistries discussed above or by other etch chemistries or selective material-removal techniques.

Figure 14:
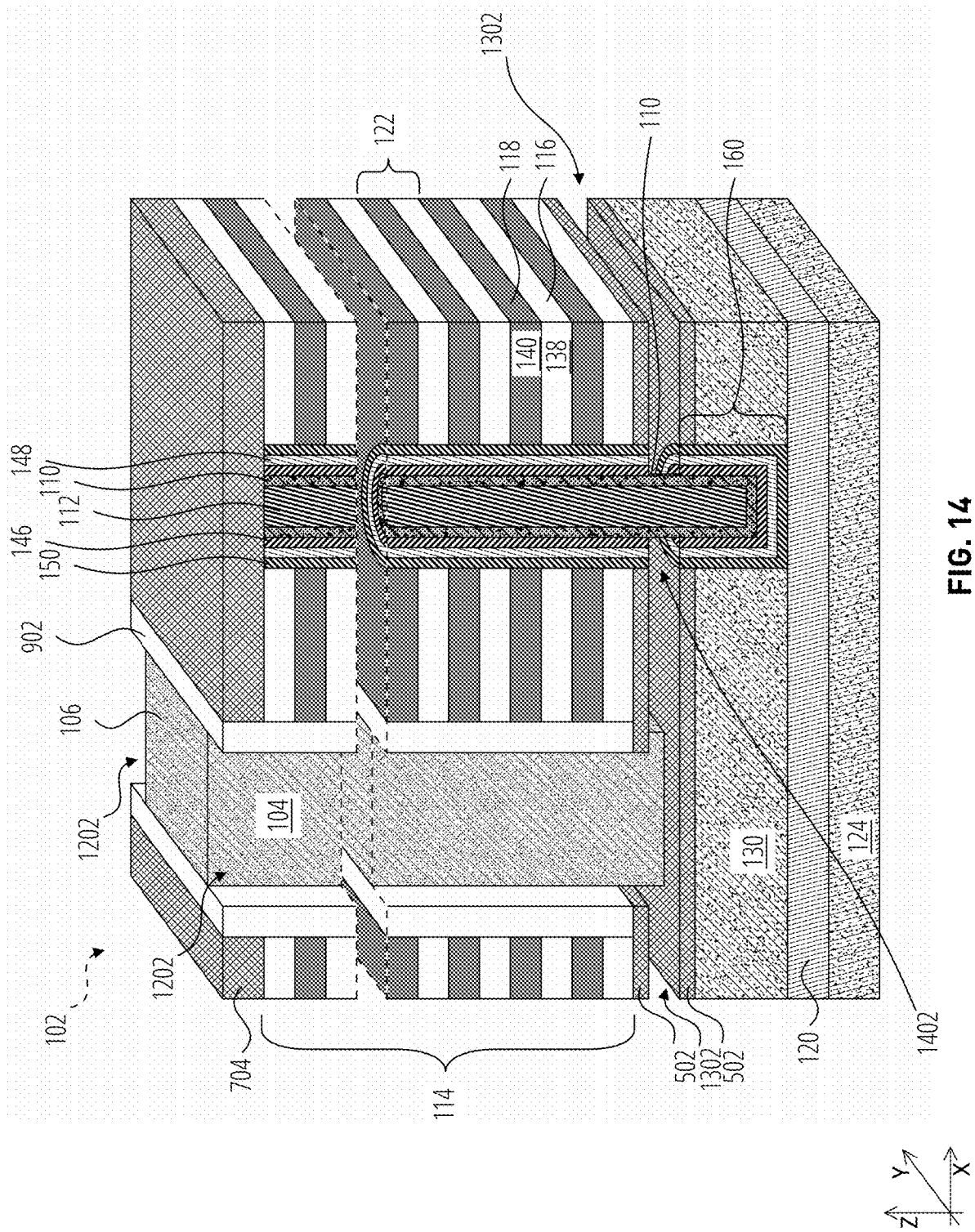

With reference to FIG. 14, portions of the cell materials (e.g., the dielectric blocking material 150, the memory material 148, and the tunnel dielectric material 146) are removed (e.g., by wet etching, by dry etching) via the void 1302 to form a lateral expansion 1402 proximal to the cell materials. In some embodiments, the removal (e.g., etching) of the cell materials may be a continuation of the etching process to remove the second sacrificial material 506 (FIG. 12). The lateral expansion 1402 exposes—in the elevations previously occupied by the second sacrificial material 506 (FIG. 12)—an outer sidewall of the channel material 110.

To form the lateral expansion 1402, the cell materials may be laterally etched selective to the first sacrificial material 502 (e.g., SiCN), the other doped material 104 (e.g., polysilicon), and the channel material 110 (e.g., polysilicon). The lateral expansion 1402 may be formed by performing a sequence of etching acts, including an oxide-removal act (e.g., to etch the dielectric blocking material 150), a nitride-removal act (e.g., to etch the memory material 148), and another oxide-removal act (e.g., to etch the tunnel dielectric material 146).

In some embodiments, forming the lateral expansion 1402 may vertically recess one, more, or all of the cell materials relative to other(s) of the cell materials and/or relative to the first sacrificial material 502. Therefore—though FIG. 14 illustrates upper and lower surfaces of the cell materials (e.g., the dielectric blocking material 150, the memory material 148, the tunnel dielectric material 146) as being substantially coplanar with upper and lower surfaces of the lower and upper regions of the first sacrificial material 502, respectively—the disclosure is not so limited. The thickness to which the upper region of the first sacrificial material 502 was formed may be tailored to ensure the etching of the cell materials to form the lateral expansion 1402 does not expose the lowest conductive structure 118 of the stack structure 114 and/or the lowest insulative structure 116 of the stack structure 114 to the etchant.

In some embodiments, forming the lateral expansion 1402 may—in a region proximate the lateral expansion 1402—horizontally thin one, more, or all of the cell materials relative to their respective lateral thicknesses prior to forming the lateral expansion 1402. Therefore—though FIG. 14 illustrates the horizontal thicknesses of the cell materials as being substantially similar to their respective horizontal thicknesses illustrated in FIG. 13—the disclosure is not so limited.

The etching acts to form the lateral expansion 1402 may also thin the material of the insulative liner 902. However, the initial thickness to which the insulative liner 902 was formed may have been tailored to ensure at least some of the insulative liner 902 remains along sidewalls of the inter-slit openings 1202 so that the tiers 122 of the stack structure 114 are not exposed to the etchant(s) used in forming the lateral expansion 1402. In embodiments in which the formation of the lateral expansion 1402 laterally thins portions of the insulative liner 902, the portions of the insulative liner 902 laterally between the other doped material 104 and the tiers 122 of the stack structure 114 may not be substantially exposed to the material-removal processes and so may remain at substantially their same lateral thickness before and after forming the lateral expansion 1402.

Figure 15:
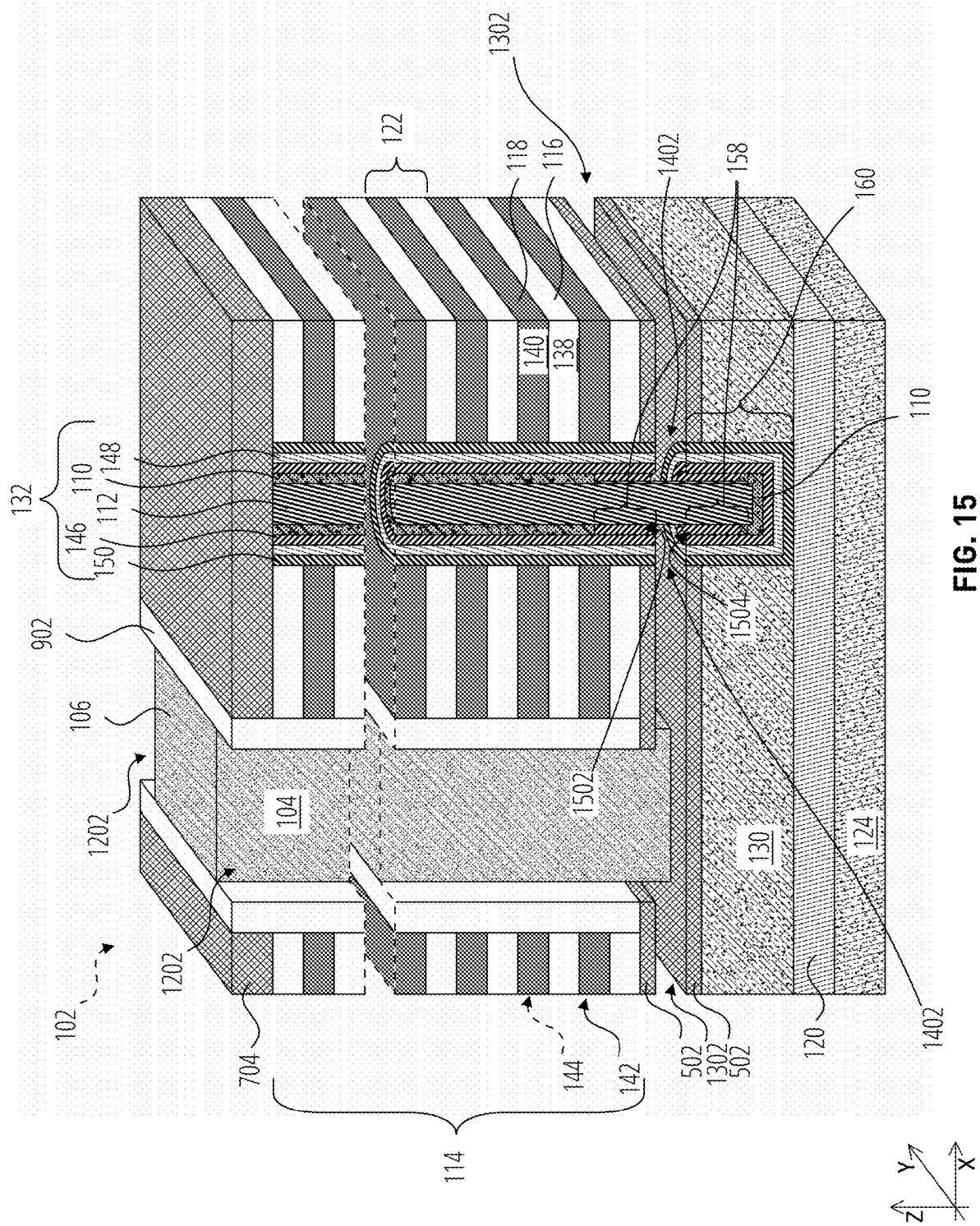

While or after forming the lateral expansion 1402, the portion of the channel material 110 exposed in the lateral expansion 1402 is also removed—as illustrated in FIG. 15—both laterally and vertically, in some portion, to form an upper vertical recess 1502 of vertical recess height 158 and to form a lower vertical recess 1504 of substantially the same vertical recess heights 158.

In some embodiments, the channel material 110 may be recessed by, e.g., a wet etching process and/or a dry etching process targeted to etching semiconductor material (e.g., polysilicon) so that portions of the channel material 110 above and below the lateral expansion 1402 is removed without substantially removing the first sacrificial material 502 and the other doped material 104 (e.g., polysilicon).

In some embodiments, etching the channel material 110 to form the upper vertical recess 1502 and the lower vertical recess 1504 may not substantially remove oxide material, nitride material, and/or oxynitride materials. For example, the insulative material 112 at the core of the pillar 132, the cell materials (e.g., the dielectric blocking material 150, the memory material 148, and the tunnel dielectric material 146) of the pillar 132, and the insulative liner 902 in the inter-slit openings 1202 may not be substantially removed while recessing the channel material 110. Accordingly, the formed pillar 132 may include a core of the insulative material 112 with a substantially consistent horizontal thickness along an entire height of the insulative material 112, as illustrated in FIG. 15.

Figure 16:
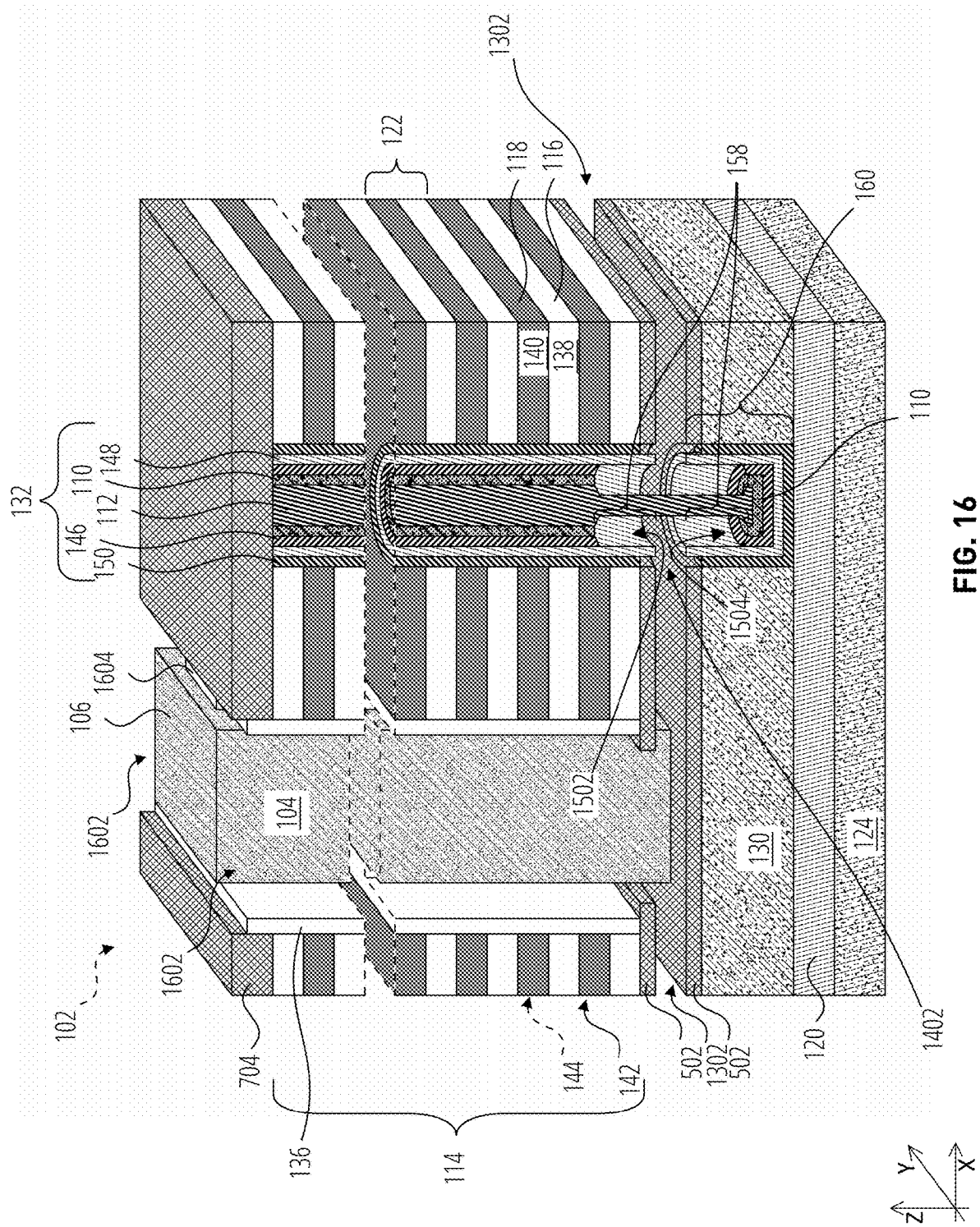

In other embodiments, laterally etching through the cell materials to form the lateral expansion 1402 and/or vertically recessing the channel material 110 to form the upper vertical recess 1502 and the lower vertical recess 1504 may also result in lateral recessing (e.g., thinning) of the insulative material 112 at the core of the pillar 132 and/or one or more of the cell materials (e.g., the tunnel dielectric material 146), as illustrated in FIG. 16. In other embodiments, the lateral recessing (e.g., thinning) of the insulative material 112 and/or the one or more cell material(s) (e.g., the tunnel dielectric material 146) may be an additional material-removal process performed after vertically recessing the channel material 110 to form the upper vertical recess 1502 and the lower vertical recess 1504. The lateral recessing (e.g., thinning)—whether resulting from the previously described material-removal processes or whether resulting from an additional material-removal process—broadens the upper vertical recess 1502 and the lower vertical recess 1504.

In some embodiments, the lateral recessing (e.g., thinning) of the one or more cell materials may substantially remove—in one, more, or all of the pillars 132—all of one or more inner-most cell materials (e.g., the tunnel dielectric material 146) in some or all of the elevations from which the channel material 110 was removed. Accordingly, as illustrated in FIG. 16, a sidewall of an inner cell material (e.g., the memory material 148) may be exposed in the upper vertical recess 1502 and/or in the lower vertical recess 1504.

Lateral recessing of the insulative material 112 and/or cell material(s) may result in thinning of the insulative liner 902 (FIG. 15) along the inter-slit openings 1202 (FIG. 15), forming the insulative liners 136 defining sidewalls of broader inter-slit openings 1602. The etchant(s) used to thin the insulative material 112 and/or cell material(s) may not be exposed to the portions of the insulative liner 902 (FIG. 15) that are laterally between the inter-slit support structures 106 and the stack structure 114. In these regions, the insulative liner 136 has non-thinned portions 1604, which may have substantially the thickness of the insulative liner 902 (FIG. 10) after forming the extended slit 1002 (FIG. 10) into the sacrificial sandwich structure. Therefore, in some embodiments the insulative liner 136 includes portions (e.g., non-thinned portions 1604) laterally adjacent (e.g., directly laterally adjacent) the inter-slit support structures 106 that are horizontally thicker than portions of the insulative liner 136 not laterally adjacent the inter-slit support structures 106, as most clearly illustrated in the top plan view of FIG. 3.

After forming the broadened upper vertical recess 1502 and lower vertical recess 1504, a remnant portion of the channel material 110 and remnant portions of the cell materials (e.g., the dielectric blocking material 150, the memory material 148, the tunnel dielectric material 146) may remain in a U-shaped structure within elevations of the semiconductor base structure 130. Some amount of the insulative material 112 may also remain within the U-shaped structure.

The lateral recessing of the insulative material 112 results in the portion of the insulative material 112 extending through the elevations of the void 1302, of the upper vertical recess 1502, and of the lower vertical recess 1504 being horizontally narrower (e.g., thinner) than portions of the insulative material 112 at elevations above the upper vertical recess 1502. In embodiments in which at least a portion of the insulative material 112 remains below the lower vertical recess 1504, these remnant portions may also be relatively thicker than the portion of the insulative material 112 extending through the elevations of the void 1302, the lower vertical recess 1504, and the upper vertical recess 1502.

In some embodiments, the lateral recessing (e.g., thinning) of the insulative material 112 may substantially remove—in one, more, or all of the pillars 132—so much of the insulative material 112 as to form an opening extending through the insulative material 112. Accordingly, not only may the channel material 110 and the cell materials be separated into upper and lower portions above and below the lateral expansion 1402, respectively, but the insulative material 112 may also be separated into upper and lower portions above and below the lateral expansion 1402, respectively.

Broadening the upper vertical recess 1502 and the lower vertical recess 1504 by the material-removal process(es)—whether the lateral recessing of the insulative material 112 and/or one or more cell materials (e.g., the tunnel dielectric material 146) is purposeful or unintentional—may result in less structural support proximate the base of the pillar 132. However, the inter-slit support structures 106 may provide sufficient structural support at this stage so as to avoid, e.g., bending, sagging, sinking, or collapse of the pillars 132 and/or of the stack structure 114. Accordingly, the dimensions and relative spacing at which the inter-slit support structures 106 were formed may have been tailored to provide sufficient structural support at this stage of the fabrication process.

At least because the inter-slit support structures 106 may provide sufficient structural support to the pillars 132 and the stack structure 114 after the material-removal process(es), the structural integrity of the pillars 132 and the stack structure 114 may—at least at this stage of the process—not be wholly or substantially reliant upon the pillar 132 materials or structure at the base of the pillar 132. Accordingly, in at least some embodiments, the fabrication process may not necessitate careful tailoring of the depth 160—into the semiconductor base structure 130 and the lower region of the first sacrificial material 502—of the pillar openings or of the breadth and depth—within the semiconductor base structure 130—of the cell materials, the channel material 110, or the insulative material 112. Likewise, in at least some embodiments, the depth and/or breadth of the lower vertical recess 1504 need not be carefully tailored. That is, even if the insulative material 112—in the elevations of the semiconductor base structure 130—should be wholly removed or disconnected from the insulative material 112 in the elevations of the stack structure 114, the pillars 132 and the stack structure 114 may be structurally sound due to the enhanced structural support provided by the inter-slit support structures 106. Likewise, even if all of the channel material 110 and/or one or more cell materials should be removed from beneath the insulative material 112 in the elevations of the semiconductor base structure 130, the pillars 132 and the stack structure 114 may not collapse, sag, sink, or bend at least because of the inclusion of the inter-slit support structures 106 between neighboring blocks 208 (FIG. 2) of the stack structure 114. Accordingly, the inclusion of the inter-slit support structures 106 may ensure structural stability without meticulous limits on material-removal processes (e.g., recess-formation processes) and/or without meticulous control of pillar material depths and widths. The inclusion of the inter-slit support structures 106 may, therefore, simplify the fabrication process while inhibiting structural defects or failures.

By the formation of the upper vertical recess 1502, the channel material 110 is recessed a height (e.g., the vertical recess height 158) tailored so that the upper vertical recess 1502 extends at least proximate, if not also overlapping, elevations of the conductive structures 118 configured as source-side GIDL region(s) (e.g., the source-side GIDL region 142 and, in some embodiments, the additional source-side GIDL region 144). For example, the channel material 110 may be recessed so that the upper vertical recess 1502 extends to at least within about 10 nm below (e.g., at least within about 5 nm below) a lower surface of the source-side GIDL region 142 to about even with an upper surface of an uppermost of the source-side GIDL regions (e.g., the source-side GIDL region 142, in embodiments including only a single source-side GIDL region, or the additional source-side GIDL region 144, in embodiments including multiple source-side GIDL regions).

Figure 17:
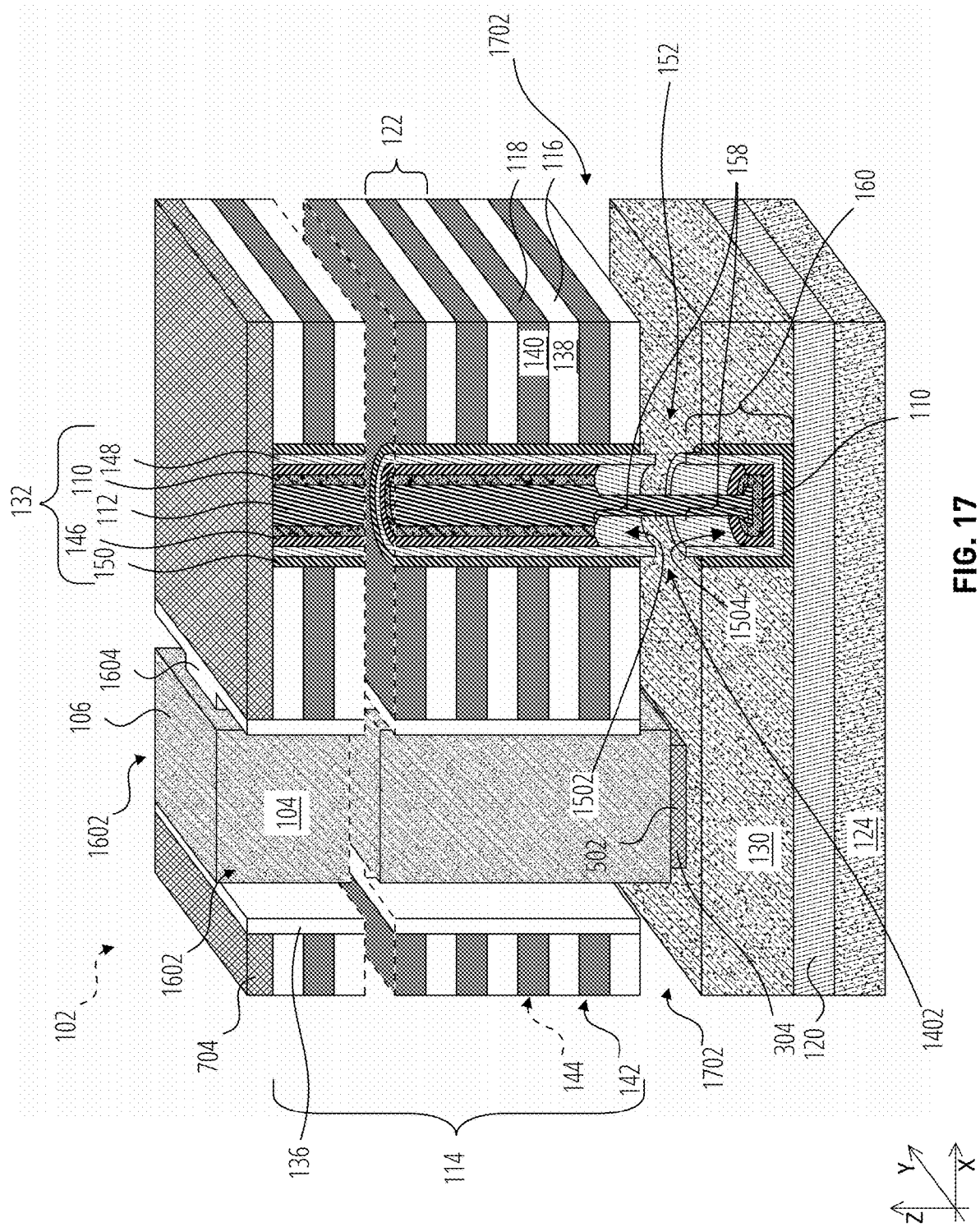

After or while forming—and, in at least some embodiments, broadening—the upper vertical recess 1502 and the lower vertical recess 1504, the first sacrificial material 502 is substantially and selectively removed (e.g., exhumed), as illustrated in FIG. 17, to form a source region void 1702 between the semiconductor base structure 130 and the stack structure 114. As discussed above, the first sacrificial material 502 may have been selected or formulated to enable the first sacrificial material 502 to be selectively removed without substantially removing, e.g., oxide insulative materials (e.g., the insulative liner 136, the remaining portions of the insulative material 112 of the pillar 132, and the insulative material 138 of the insulative structures 116 of the stack structure 114) and semiconductor materials (e.g., the other doped material 104 of the inter-slit support structures 106, the semiconductor material of the semiconductor base structure 130, and the channel material 110 in the pillar 132) exposed in the source region void 1702, the upper vertical recess 1502, the lower vertical recess 1504, or in the broader inter-slit openings 1602.

Portions of the first sacrificial material 502 beneath the inter-slit support structures 106 may not be substantially removed because those portions of the first sacrificial material 502 may not be exposed to the material-removal chemistry. Accordingly, inter-slit pedestals 304 formed from the first sacrificial material 502 may remain beneath the inter-slit support structures 106. Sidewalls of the inter-slit pedestals 304 may be somewhat laterally recessed relative to sidewalls of the inter-slit support structures 106.

For example, forming the source region void 1702 may include exposing the first sacrificial material 502 to a wet etch or vapor etch process with an etchant chemistry that will not access most of the first sacrificial material 502 beneath the inter-slit support structures 106. Therefore, though the etchant may remove some of the first sacrificial material 502 from around the base of the inter-slit support structures 106, at least some portion of the first sacrificial material 502 remains under the inter-slit support structures 106.

As another example, forming the source region void 1702 may include first converting the composition of the portions of the first sacrificial material 502 that were exposed in the void 1302 (FIG. 16) or in the broader inter-slit openings 1602 (FIG. 16) to make the exposed and converted portions more selectively etchable relative to other portions of the first sacrificial material 502 that were not exposed in the void 1302 or in the broader inter-slit openings 1602. In some such embodiments, a plasma conversion act may be performed prior to an etching act. An oxygen- or hydrogen-based plasma converts only a limited depth into the exposed portions of the first sacrificial material 502; therefore, the portions of the first sacrificial material 502 under the inter-slit support structures 106 may not be wholly converted. In embodiments in which the first sacrificial material 502 is formed of and includes SiCN, the oxygen-based or the hydrogen-based plasma may be used to convert the exposed portions of the SiCN to SiON. For example, the oxygen-based plasma may convert (e.g., directly convert) the SiCN to SiON. As another example, the hydrogen-based plasma may remove (e.g., substantially remove) the carbon from the SiCN exposed to the plasma, forming an SiN material that may be rich in silicon and/or rich in hydrogen; and the SiN material may be converted (e.g., oxidized) to SiON once the SiN material is exposed to air. After the plasma conversion (e.g., the oxygen-based plasma conversion and/or the hydrogen-based plasma conversion), a wet etch (e.g., a hydrogen fluoride (HF)) process is conducted to selectively remove the converted portions of the first sacrificial material 502 without substantially removing the non-converted portions of the first sacrificial material 502. Therefore, the upper and lower regions of the first sacrificial material 502 may be substantially removed, leaving behind only discrete remnants in the form of the inter-slit pedestals 304 beneath the inter-slit support structures 106. The inter-slit pedestals 304 may ensure the inter-slit support structures 106 remain structurally sound to continue to provide sufficient structural support to avoid pillar 132 and stack structure 114 collapse, bending, sinking, and sagging.

Figure 18:
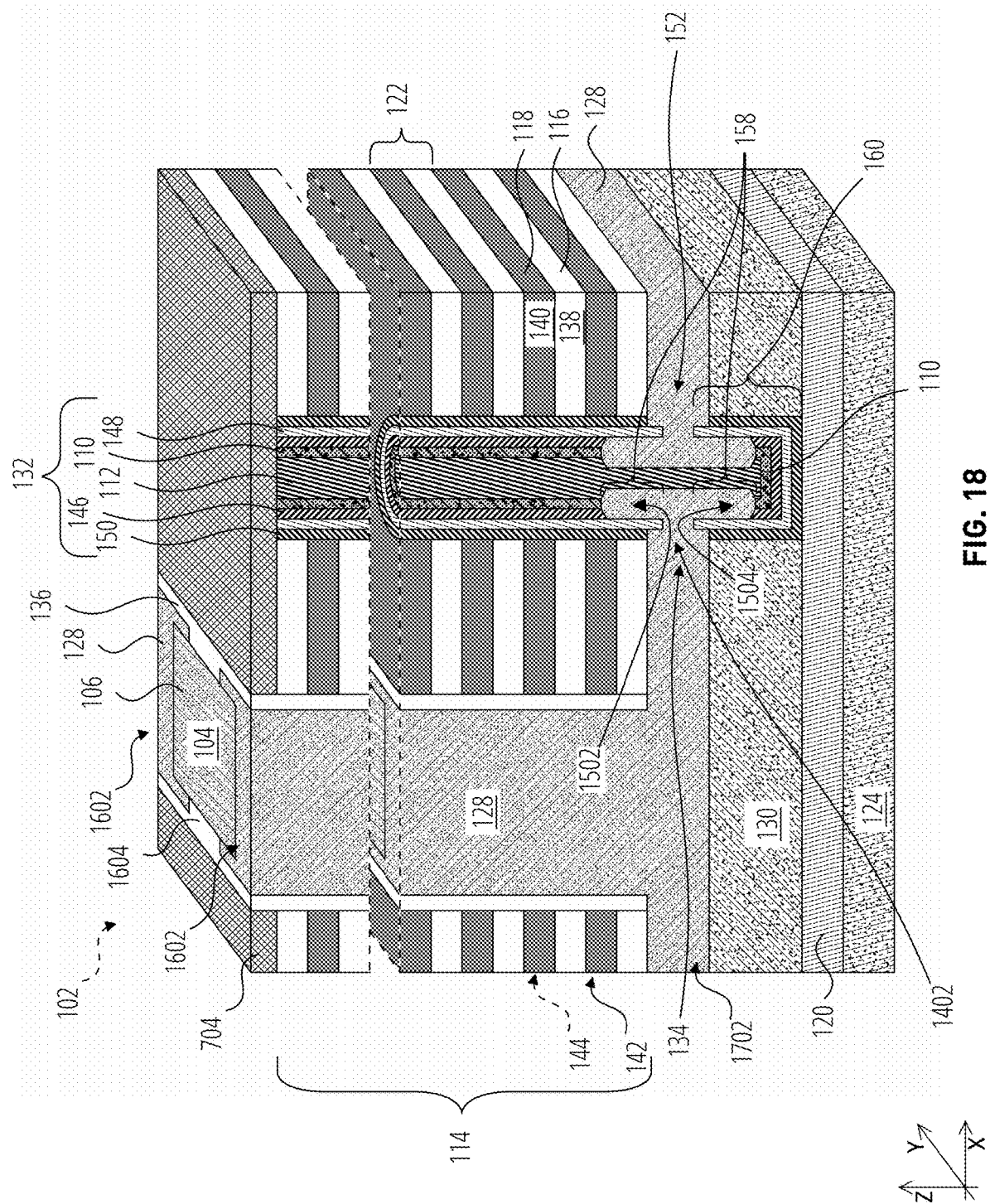

With reference to FIG. 18, the doped material 128 of the source region 134 (FIG. 1) is formed (e.g., deposited) to fill or substantially fill the upper vertical recess 1502, the lower vertical recess 1504, the source region void 1702, and the broader inter-slit openings 1602 between the inter-slit support structures 106. The doped materials 128 may extend through a height of the stack structure 114 (e.g., laterally adjacent the inter-slit support structures 106) and continue through the source region void 1702 (FIG. 17) and into the pillar 132. Forming the doped material 128 therefore provides the source region 134 adjacent the base of the pillar 132.

Forming the doped material 128 in the upper vertical recess 1502 disposes the doped material 128—and its relatively high dopant concentration (e.g., with respect to a relatively lower dopant concentration in the channel material 110)—in close proximity to the elevations of the stack structure 114 occupied by the source-side GIDL regions (e.g., the source-side GIDL region 142 and, in some embodiments, the additional source-side GIDL region 144). The breadth of the upper vertical recess 1502 (e.g., from the lateral recessing of the insulative material 112 and, in some embodiments, one or more of the cell materials) also enables disposition of a relatively greater volume of the doped material 128 proximate the source-side GIDL region 142 (and, in some embodiments, the additional source-side GIDL region 144) than would be disposable in the absence of the lateral expansion of the upper vertical recess 1502. The relatively greater volume of the doped material 128 may facilitate disposing a sufficiently-high amount and concentration of dopant proximate the source-side GIDL region 142 (and, in some embodiments, the additional source-side GIDL region 144).

In some embodiments, this close proximity of a sufficient amount of dopant to the GIDL region elevation(s) may be accomplished without utilizing, e.g., a thermally-driven out-diffusion of dopant from the doped material 128. In other embodiments, a thermally-driven out-diffusion of dopant may also be performed. In some such embodiments, the temperatures may be relatively lower than and/or the duration of the temperature exposure may be relatively shorter than may otherwise be utilized if relying upon thermally-driven out-diffusion alone for ensuring a sufficient dopant concentration in the level(s) of the GIDL regions (e.g., the levels of the source-side GIDL region 142 and, in some embodiments, of the additional source-side GIDL region 144).

Forming the doped material 128 in the spaces formed by recessing the channel material 110—and, in some embodiments, laterally recessing adjacent material(s)—also facilitates disposing the doped material 128 at a targeted elevation (e.g., an elevation, in the stack structure 114, of the interface between the doped material 128 and the channel material 110) proximate the GIDL region(s) without necessitating a so-called "punch" through (e.g., vertical etch) of materials at the base of a high-aspect-ratio opening. That is, the disclosed methods may, at least in some embodiments, avoid a stage of vertically etching materials (e.g., the channel material 110, the cell materials) at the base of the pillar opening prior to forming the doped material 128 in the areas within the horizontal footprint of the pillar 132. Avoiding a vertical etching at the base of a high-aspect-ratio opening may simplify the fabrication process and avoid potential process failures, particularly as the number of tiers 122 of the stack structure 114 are scaled up to greater numbers. For example, without utilizing a vertical etching of the channel material 110 and the cell materials at the base of the pillar opening during the fabrication process, the width of the pillar opening (e.g., at the base of the pillar 132) may not need to be formed as broadly as it may otherwise need to be formed to enable a vertical punch. With less fabrication criticality relying upon the pillar base width, the pillar 132 itself may be more narrowly formed than it may otherwise have been formed, which may also enable scaling of the pillar 132 array to include a greater density of pillars 132 per unit of microelectronic device structure cross-sectional footprint area.

The sacrificial hard mask 704 may be removed from above the stack structure 114 (e.g., by planarizing the structure), as illustrated in FIG. 1. Upper features (e.g., upper conductive contacts and upper conductive lines) may then be formed to electrically connect the drain end of the pillars 132 to other features of the structure (e.g., of the microelectronic device structure 100 (FIG. 1), of the microelectronic device structure 200 of FIG. 2 and FIG. 3).

Figure 19:
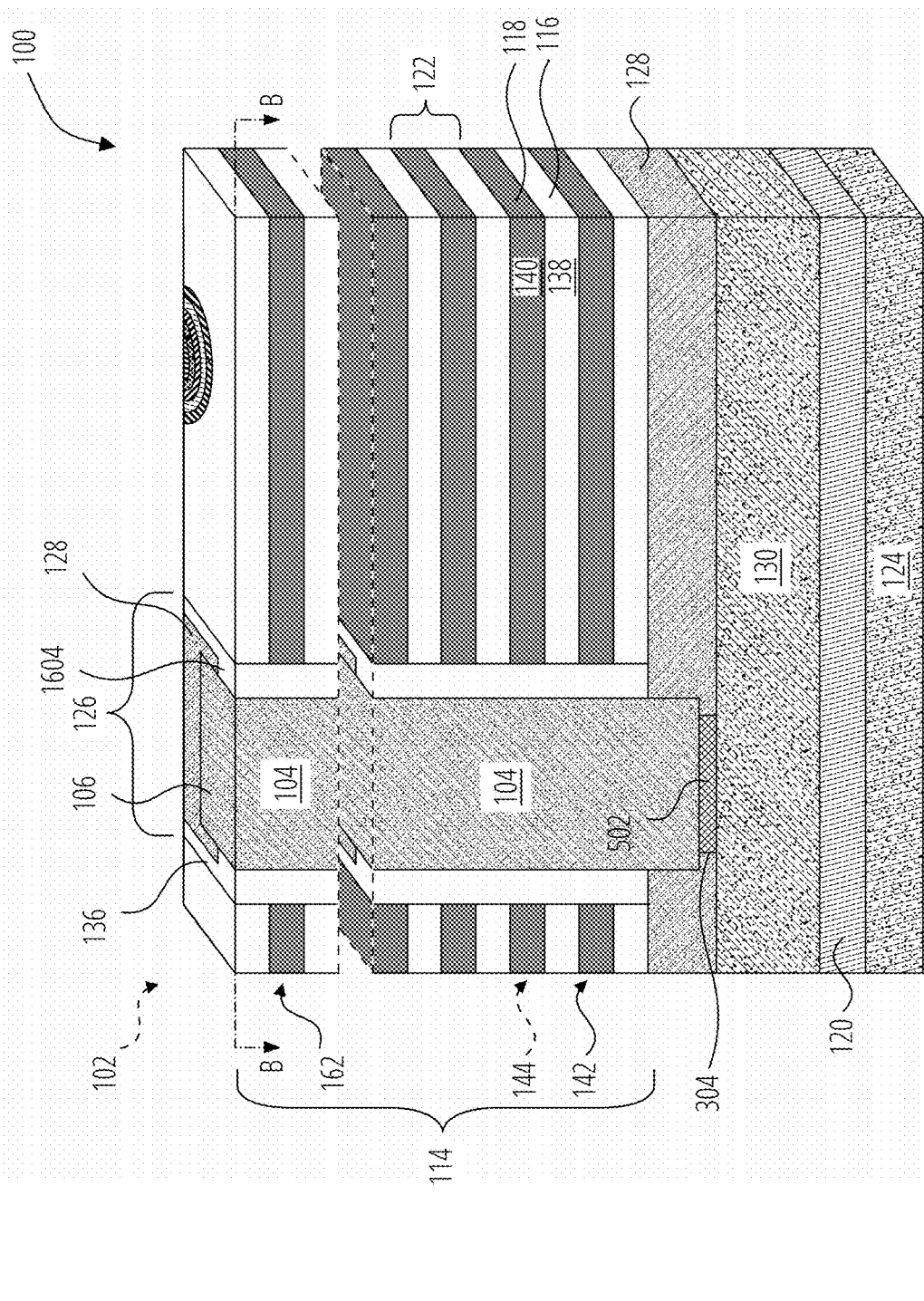

With reference to FIG. 19, illustrated is a cross-sectional, elevational illustration of the microelectronic device structure 100 of FIG. 1, taken along section line B-B of FIG. 1. As illustrated in FIG. 19, the slit structures 126 include the inter-slit pedestals 304 of the first sacrificial material 502, which remain below the other doped material 104 of the inter-slit support structures 106. The inter-slit pedestals 304 are directly between the semiconductor base structure 130 and a lower surface of the inter-slit support structures 106.

Figure 20:
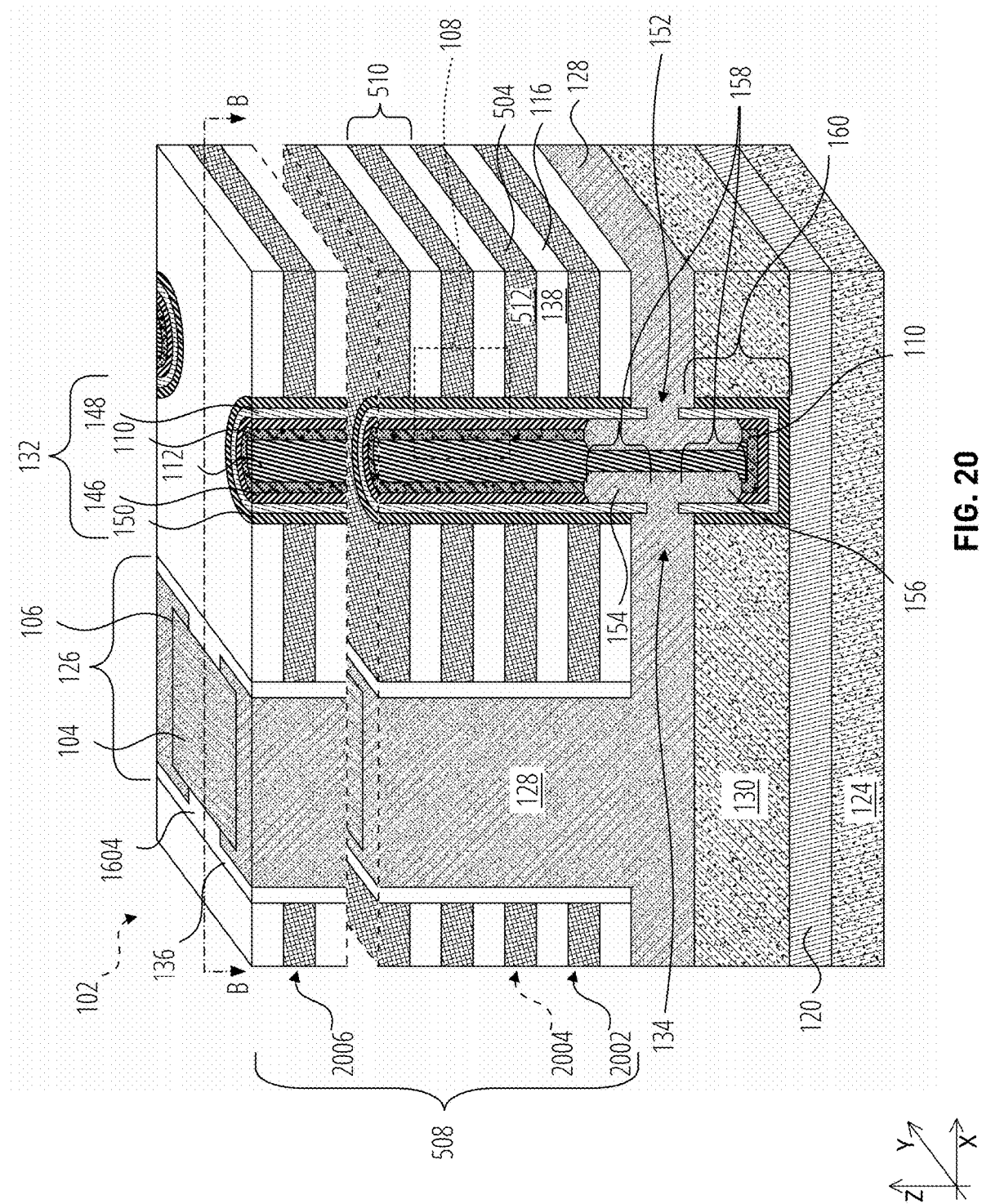
FIG. 20 through FIG. 24 are cross-sectional, elevational, schematic illustrations of various stages of processing to fabricate the microelectronic device structures of FIG. 24 through FIG. 26, in accordance with embodiments of the disclosure, wherein the stage of FIG. 20 follows completion of the stages of FIG. 5 to FIG. 7 and then FIG. 9 through FIG. 19. The view of FIG. 21 to FIG. 23 each correspond to a view taken along section line B-B of FIG. 24 at a respective stage of the fabrication process.

While the method of FIG. 5 through FIG. 19 includes forming the upper vertical recess 1502 and the lower vertical recess 1504 and forming the source region 134 after a replacement gate process has already formed the conductive structures 118 of the stack structure 114, in other embodiments, the replacement gate process may be performed after completing formation of the source region 134. For example, after performing the stages of FIG. 5, FIG. 6, and FIG. 7—and without yet replacing the sacrificial materials 512 (FIG. 7) with the conductive structures 118 (FIG. 8)—the stages of FIG. 9 (e.g., formation of the insulative liner 902 in the slit 702) through FIG. 18 (forming the doped material 128) may be performed. In some embodiments, the sacrificial hard mask 704 (FIG. 18) may also be removed. A resulting structure is illustrated in FIG. 20, including the formed source region 134 and pillars 132 with the upper vertical extension 154 of the doped material 128 extending to or near an elevation within the stack structure 508 that will become the source-side GIDL regions. For example, the doped material 128 of the upper vertical extension 154 may extend to an elevation that is at least within 10 nm of a lower surface of a level for source-side GIDL region 2002 or about equal to an upper surface of an uppermost level for additional source-side GIDL region 2004. At this stage, a level for drain-side GIDL region 2006 may also be occupied by the sacrificial material 512.

Figure 21:
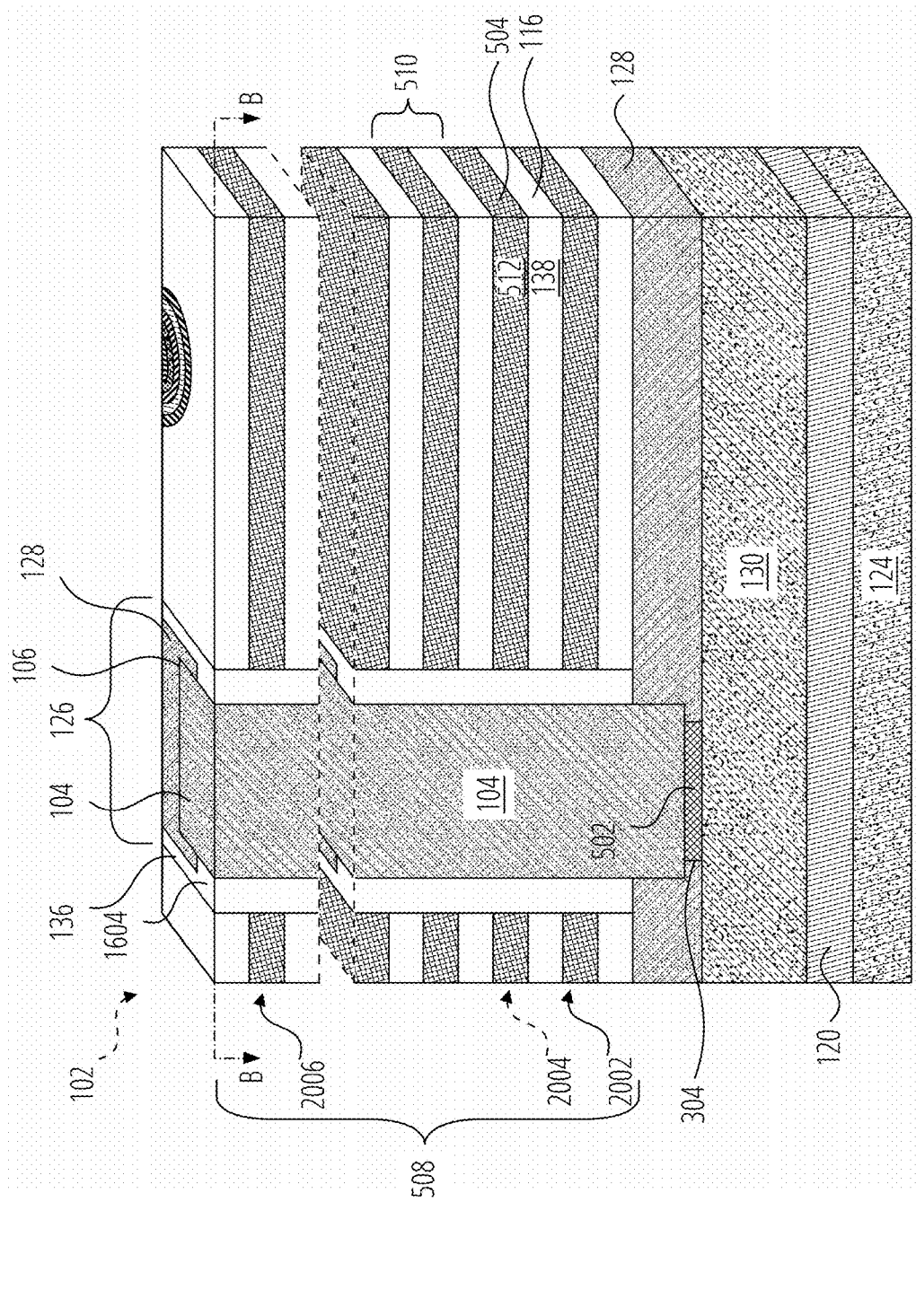

With reference to FIG. 21, illustrated is a cross-sectional view of the structure of FIG. 20, taken along section line B-B of FIG. 20, for ease of illustrating subsequent fabrication stages. As illustrated, the slit structures 126 formed so far in the process include the inter-slit support structures 106 of the other doped material 104 and the intermediate portions of the doped material 128 that extends down beneath the stack structure 508. The inter-slit pedestals 304 of remnant portions of the first sacrificial material 502 also remain.

Figure 22:
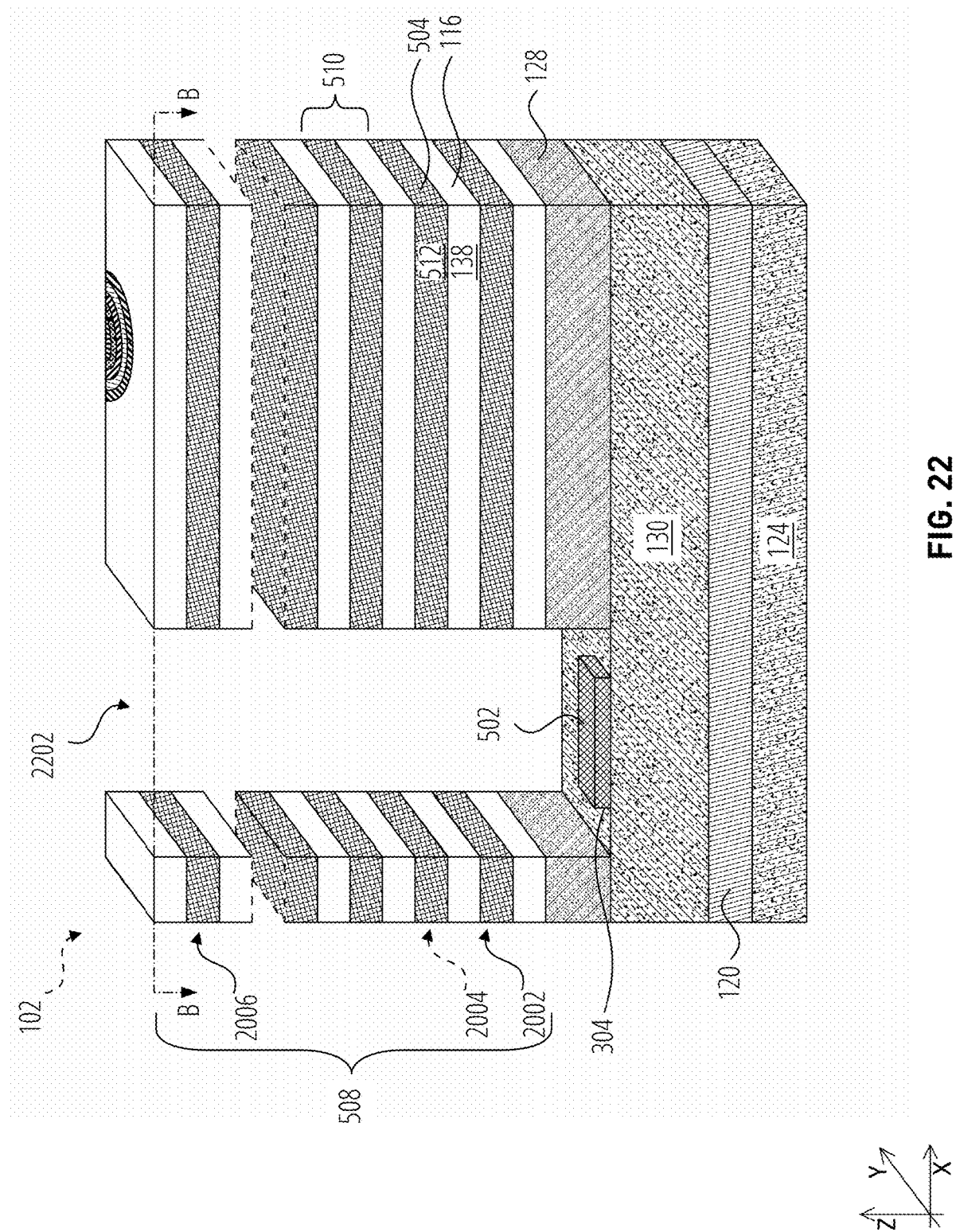

A polysilicon-selective material-removal process is conducted to form a slit 2202, as illustrated in FIG. 22, where the slit structures 126 (FIG. 20, FIG. 21) had been formed. For example, the doped material 128 (FIG. 21) and the other doped material 104 (FIG. 21) may be etched selective to the material of the insulative liner 136 (e.g., oxide material, nitride material) using a fluorine-based plasma and/or using a precursor such as $NF_3$. In some embodiments, forming the slit 2202 may include vertically etching the doped material 128 (FIG. 21) and the other doped material 104 (FIG. 21) down to the semiconductor base structure 130. Remnants of the insulative liner 136 (FIG. 21) may then be removed to expose sidewalls of the tiers 510 of the stack structure 508 in the slit 2202. The non-semiconductor first sacrificial material 502 may not be removed by the selective material-removal process(es). Therefore, the slits 2202 may expose the inter-slit pedestals 304 along a base of the slits 2202. Because the slits 2202 expose sidewalls of the tiers 510 of the stack structure 508, sidewalls of the sacrificial material 512 of the sacrificial structures 504 are exposed in the slits 2202.

Figure 23:
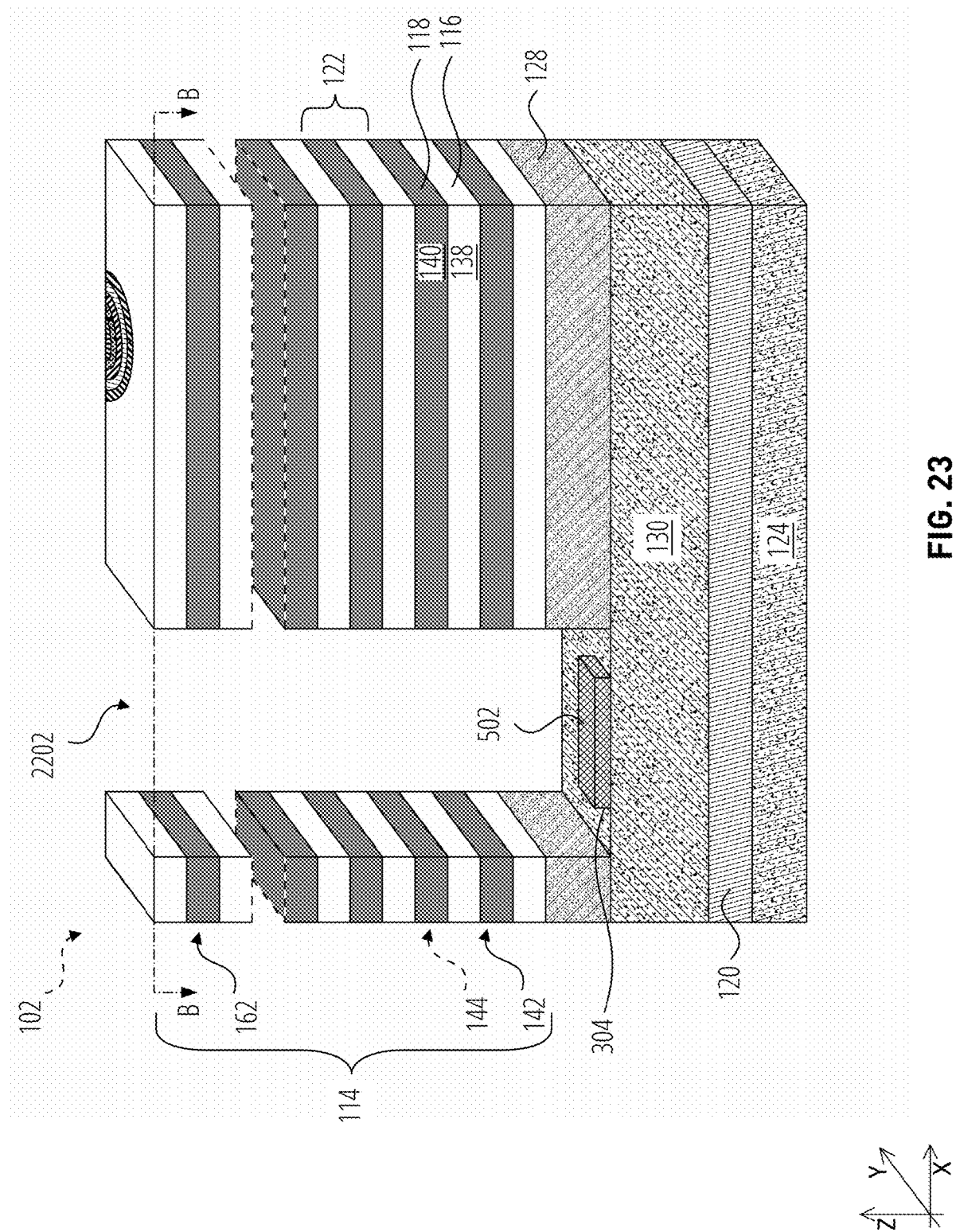

The "replacement gate" process is then performed, via the slit 2202, to exhume the sacrificial material 512—and therefore the sacrificial structures 504—and to form, as illustrated in FIG. 23, the conductive material(s) 140 (e.g., the conductive material 404 of FIG. 4A and/or the conductive liner material 408 and the conductive metal 406 of FIG. 4B) in place of the sacrificial structures 504 (FIG. 22). The replacement gate process forms—above the doped material 128—the stack structure 114 with the conductive structures 118 of the tiers 122.

Figure 24:
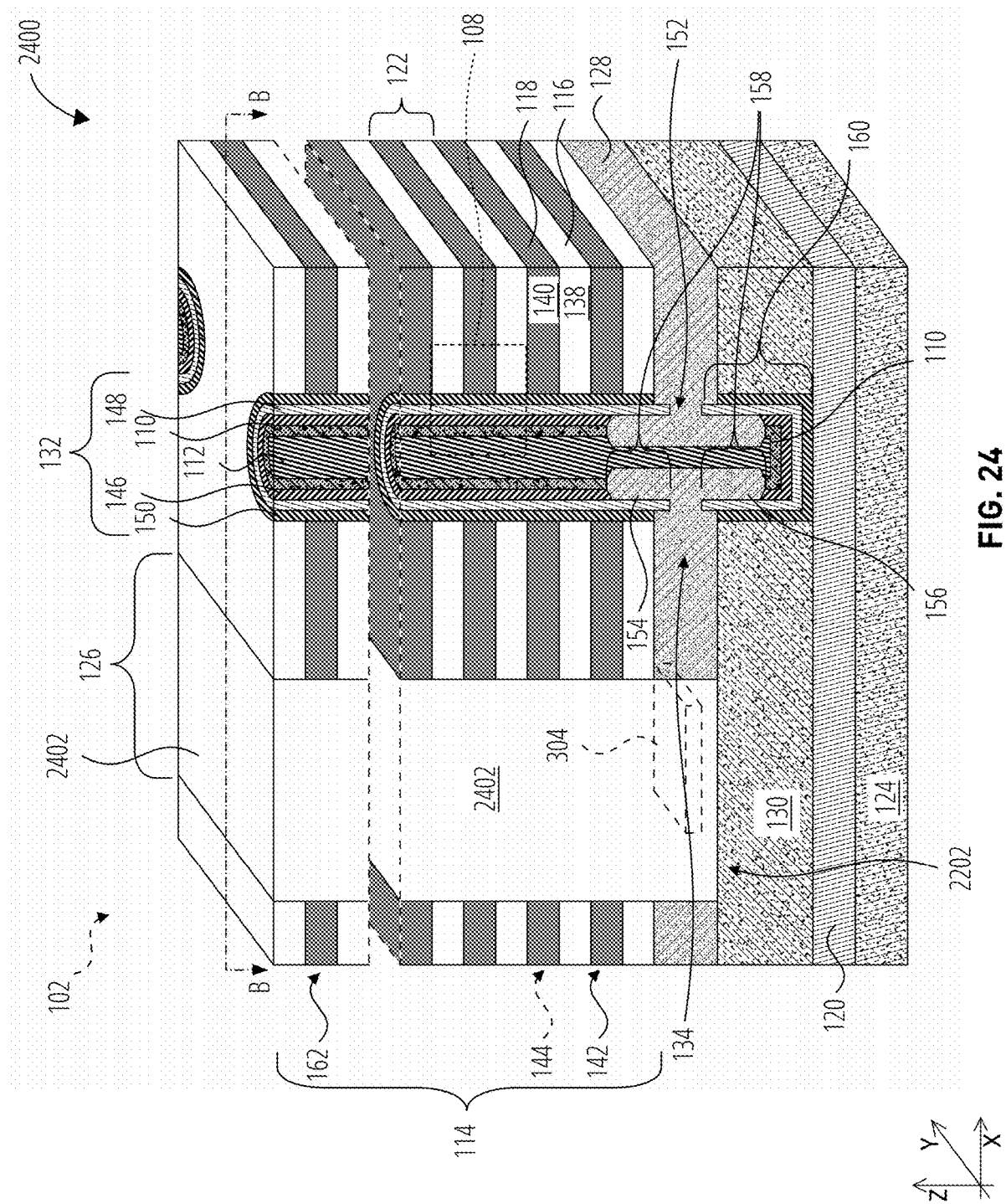

With reference to FIG. 24, a nonconductive fill material 2402 may be formed to fill or substantially fill the slits 2202 (FIG. 23) and reform the slit structures 126. The completed slit structures 126, however, consist substantially of the nonconductive fill material 2402 above the inter-slit pedestals 304. In contrast to other embodiments, the slit structures 126 of this embodiment may not include any of the doped material 128 or any of the other doped material 104 (FIG. 20, FIG. 21).

Figure 25:
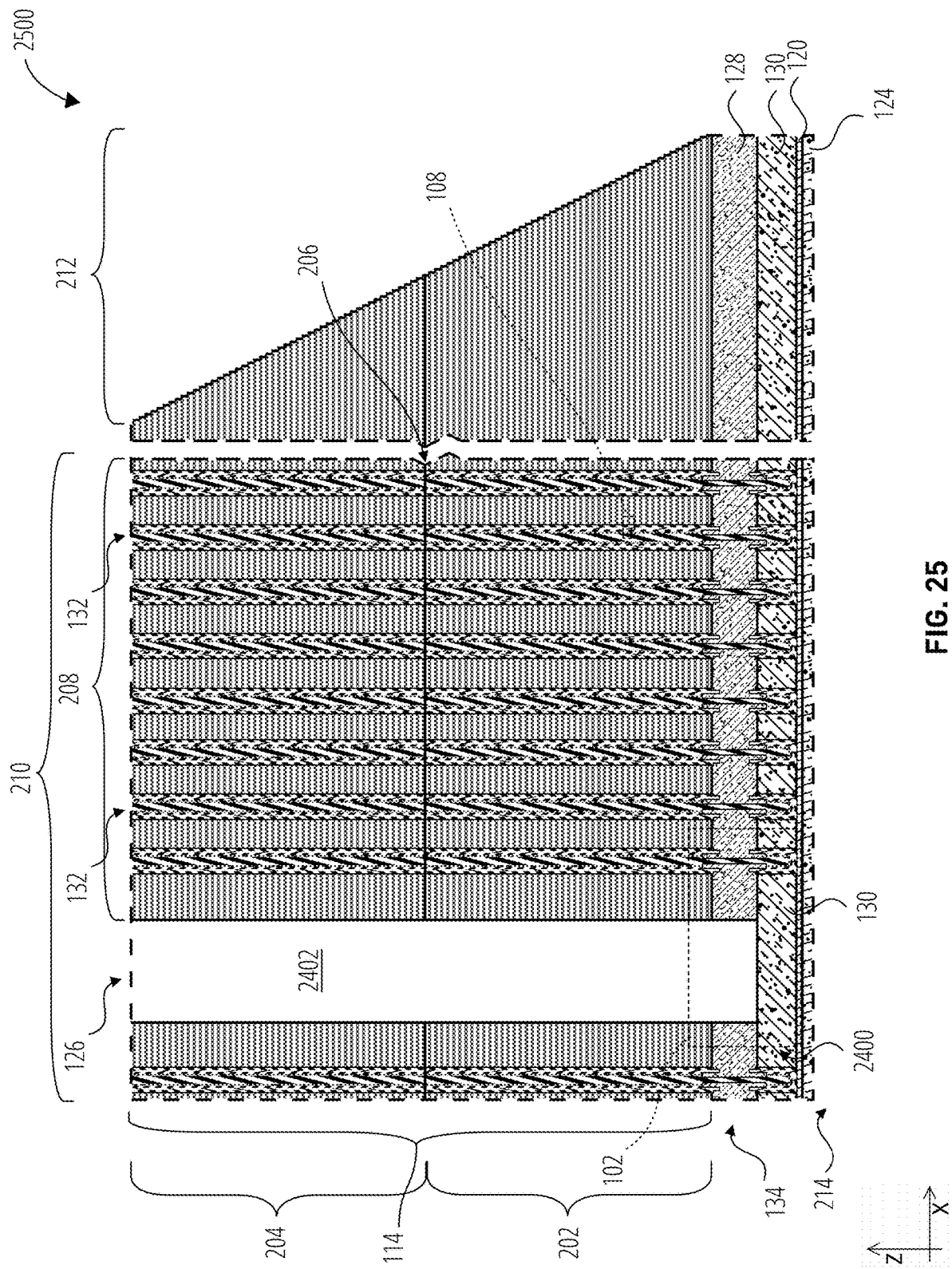
FIG. 25 is a cross-sectional, elevational, schematic illustration of a microelectronic device structure that may include the microelectronic device structure of FIG. 24, such that the illustration of FIG. 24 is an enlarged view corresponding to box 102 of FIG. 25, in accordance with embodiments of the disclosure.

The microelectronic device structure 2400, illustrated in the box 102 of FIG. 24, may be included as a portion of a larger microelectronic device structure 2500, illustrated in FIG. 25, such as the microelectronic device structure 100 of FIG. 1 may be included in the microelectronic device structure 200 of FIG. 2, as described above.

Figure 26:
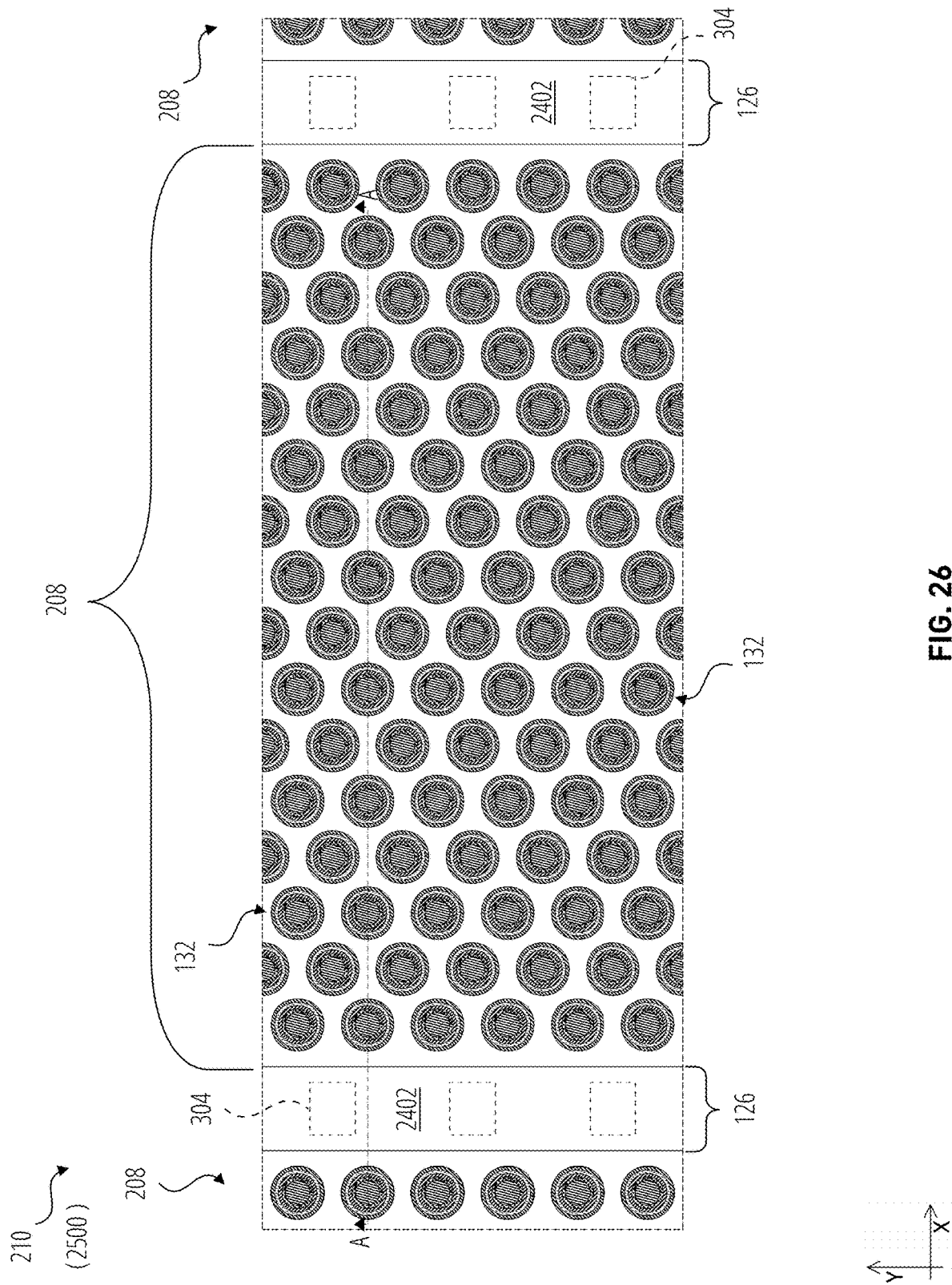
FIG. 26 is a top plan, schematic illustration of the microelectronic device structure of FIG. 25, wherein the view of FIG. 25 is taken along section line A-A of FIG. 26, in accordance with embodiments of the disclosure.

FIG. 26 is a top plan schematic illustration of the pillar array portion 210 of the microelectronic device structure 2500 of FIG. 25, wherein the view of the pillar array portion 210 of FIG. 25 may be taken along section line A-A of FIG. 26. The slit structures 126—reformed after completing the replacement gate process—consist substantially of the nonconductive fill material 2402 above a series of discrete inter-slit pedestals 304 formed by remnant portions of the first sacrificial material 502 (FIG. 23).

Accordingly, disclosed is a method of forming a microelectronic device. The method includes forming, on a base structure, a stack of sacrificial materials including a lower region of a first sacrificial material. A tiered stack structure is formed on the stack of sacrificial materials. The tiered stack structure comprises a vertically alternating sequence of insulative structures and other structures arranged in tiers. A pillar opening is formed through the tiered stack structure, through the stack of sacrificial materials, and into the base structure. Cell materials, a channel material, and an insulative core material are formed in the pillar opening. A slit is formed through the tiered stack structure and partially through the stack of sacrificial materials to the lower region of the first sacrificial material. At least one of the sacrificial materials, of the stack of sacrificial materials, is selectively removed to expose at least one of the cell materials formed in the pillar opening. Inter-slit support structures, of a first doped material, are formed on the lower region of the first sacrificial material exposed in the slit. A lateral opening is formed through the cell materials to expose a portion of the channel material in the lateral opening. The channel material is recessed to form a vertical recess protruding to an elevation within the stack structure. A second doped material is formed in the vertical recess.

By the foregoing methods, the doped material 128 of the source region 134 is disposed proximate and, laterally overlapping with, or nearly laterally overlapping with, the elevation(s) of at least one source-side GIDL region (e.g., the source-side GIDL region 142 and, in some embodiments, the additional source-side GIDL region 144) (FIG. 1, FIG. 24). The proximity of the doped material 128 to the source-side GIDL region(s) and, in some embodiments, the increased volume of the upper vertical extension 154 of the doped material 128 (e.g., resulting from the lateral recessing of at least one of the insulative material 112 and/or cell material(s) of the pillar 132 prior to forming the doped material 128) may provide a relatively high dopant quantity and gradient proximate the source-side GILD GIDL region(s) to enhance hole (e.g., electron hole) formation from the lower, source side of the pillars 132 (and the channel material 110) during block-erase operations. Accordingly, the gated connection between the source-side GIDL region(s) and the channel structures (of channel material 110) in the pillars 132 may be more reliable and enable microelectronic devices to be formed with greater numbers of tiers 122 (and therefore greater numbers of conductive structures 118 and memory cells 402) compared to conventional devices.

Moreover, the proximity and volume of the dopant to the source-side GIDL region(s) may be accomplished without conducting processes for driving diffusion of the dopant from the source region (e.g., without conducting rapid thermal processing (RTP) acts) or by conducting lower temperature and/or shorter duration thermal diffusion processes. Therefore, thermally-driven diffusion processes may be avoided in some embodiments or, in other embodiments, may be conducted at lower temperatures (e.g., temperatures of about 700° C. or about 600° C. or less, rather than high temperatures of about 900° C. or greater) and/or at shorter durations, which may eliminate the use of temperature and/or timing conditions that could otherwise impair material or device characteristics, such as material degradation (e.g., bending of the pillars 132) and operational speed slowing (e.g., in the CMOS region 214 under the array of pillars 132).

Also, as described above, the methods may avoid using a vertical "punch" at the base of the pillar 132 (e.g., to remove a base portion of the channel material 110 and/or the cell materials in which dopant may then be implanted or otherwise formed). Therefore, the critical dimension ("CD") of the pillar 132 itself may be relatively narrower, and the pillar array portion 210 (FIG. 3) may be formed to a relatively greater pillar 132 density, than if the fabrication process necessitated a vertical etching at the base of a high-aspect-ratio opening to ensure disposition of a sufficient concentration of dopant adjacent the source-side GIDL region(s).

Figure 27:
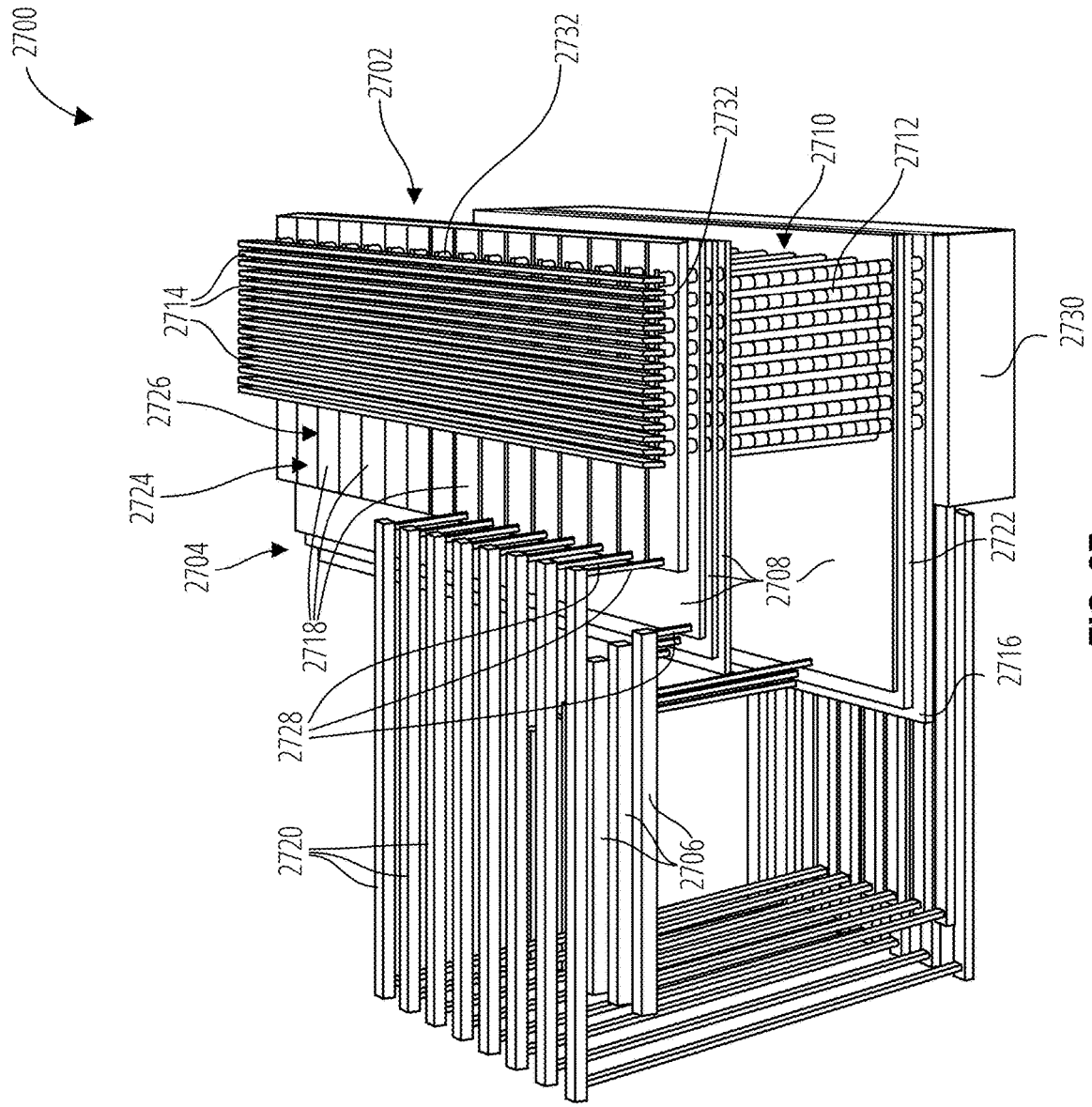
FIG. 27 is a partial, cutaway, perspective, schematic illustration of a microelectronic device, in accordance with embodiments of the disclosure.

With reference to FIG. 27, illustrated is a partial cutaway, perspective, schematic illustration of a portion of a microelectronic device 2700 (e.g., a memory device, such as a 3D NAND Flash memory device) including a microelectronic device structure 2702. The microelectronic device structure 2702 may be substantially similar to, e.g., the microelectronic device structure 200 of FIG. 2 and FIG. 3 (e.g., including the microelectronic device structure 100 of FIG. 1) and/or the microelectronic device structure 2500 of FIG. 25 and FIG. 26 (e.g., including the microelectronic device structure 2400 of FIG. 24).

As illustrated in FIG. 27, the microelectronic device structure 2702 may include a staircase structure 2704 (which may correspond to, e.g., the staircase portion 212 of the microelectronic device structure 200 of FIG. 2 and FIG. 3 and/or of the microelectronic device structure 2500 of FIG. 25 and FIG. 26). The staircase structure 2704 may define contact regions for connecting access lines 2706 to conductive tiers 2708 (e.g., conductive layers, conductive plates, such as the conductive structures 118 (e.g., FIG. 1, FIG. 24)) of a stack structure (e.g., the stack structure 114 (e.g., FIG. 1, FIG. 24)) in a deck (e.g., either or both the lower deck 202 (FIG. 2, FIG. 25) and/or the upper deck 204 (FIG. 2, FIG. 25)) of the microelectronic device structure 2702.

The microelectronic device structure 2702 may include pillars (e.g., the pillars 132 of FIG. 2 and/or FIG. 25) forming strings 2710 of memory cells 2712 (e.g., one or more of the memory cells 402' of FIG. 4A and/or the memory cells 402" of FIG. 4B). The pillars forming the strings 2710 of memory cells 2712 may extend at least somewhat vertically (e.g., in the Z-direction) and orthogonally relative to the conductive tiers 2708, relative to data lines 2714, relative to a source tier 2716 (e.g., the source region 134 of FIG. 2 and/or of FIG. 25), relative to access lines 2706, relative to first select gates 2718 (e.g., upper select gates, such as drain select gates (SGDs), which may include one or more regions configured as drain-side GIDL region(s)), relative to select lines 2720, and/or relative to one or more second select gates 2722 (e.g., lower select gate(s), such as source select gates (SGSs), which may include one or more regions configured as source-side GIDL region(s) (e.g., the source-side GIDL region 142 and the additional source-side GIDL region 144, if present, of FIG. 1 and FIG. 24)). As described above, portions of the source tier 2716 (e.g., the source region 134 (FIG. 2, FIG. 25)) vertically extend to an elevation proximate an elevation occupied by at least one of the source-side GIDL region(s) (e.g., the source-side GIDL region 142, the additional source-side GIDL region 144 of FIG. 1 and FIG. 24) of the second select gates 2722.

The first select gates 2718, the conductive tiers 2708, and the second select gates 2722 may be horizontally divided (e.g., in the X-axis direction) into multiple blocks 2724 (e.g., blocks 208 (FIG. 2, FIG. 3, FIG. 25, FIG. 26)) spaced apart (e.g., in the X-axis direction) from one another by slits 2726 (e.g., slit structures 126 (FIG. 1 to FIG. 3, FIG. 24 to FIG. 26)).

Vertical conductive contacts 2728 may electrically couple components to each other, as illustrated. For example, select lines 2720 may be electrically coupled to the first select gates 2718, and the access lines 2706 may be electrically coupled to the conductive tiers 2708.

The microelectronic device 2700 may also include a control unit 2730 positioned under the memory array (e.g., the pillar array portions 210 (FIG. 2, FIG. 25)). The control unit 2730 may include control logic devices configured to control various operations of other features (e.g., the memory strings 2710, the memory cells 2712) of the microelectronic device 2700. By way of non-limiting example, the control unit 2730 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), \Tad regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and/or other chip/deck control circuitry. The control unit 2730 may be electrically coupled to the data lines 2714, the source tier 2716, the access lines 2706, the first select gates 2718, and/or the second select gates 2722, for example. In some embodiments, the control unit 2730 may be configured as and/or include CMOS (complementary metal-oxide-semiconductor) circuitry. In such embodiments, the control unit 2730 may be characterized as having a "CMOS under Array" ("CuA") configuration. Accordingly, the control unit 2730 may be included in the CMOS region 214 of FIG. 2 and/or FIG. 25.

The first select gates 2718 may extend horizontally in a first direction (e.g., the Y-axis direction) and may be coupled to respective first groups of strings 2710 of memory cells 2712 at a first end (e.g., an upper end) of the strings 2710. The second select gates 2722 may be formed in a substantially planar configuration and may be coupled to the strings 2710 at a second, opposite end (e.g., a lower end) of the strings 2710 of memory cells 2712. As discussed above, portions of the source tier 2716 extend vertically upward to elevations that approach or laterally overlap at least one lower GIDL region (e.g., the source-side GIDL region 142, the additional source-side GIDL region 144 of FIG. 1 and FIG. 24) of the second select gates 2722.

The data lines 2714 (e.g., bit lines) may extend horizontally in a second direction (e.g., in the X-axis direction) that is at an angle (e.g., perpendicular) to the first direction in which the first select gates 2718 extend. The data lines 2714 may be coupled to respective second groups of the strings 2710 at the first end (e.g., the upper end) of the strings 2710. A first group of strings 2710 coupled to a respective first select gate 2718 may share a particular string 2710 with a second group of strings 2710 coupled to a respective data line 2714. Thus, a particular string 2710 may be selected at an intersection of a particular first select gate 2718 and a particular data line 2714. Accordingly, the first select gates 2718 may be used for selecting memory cells 2712 of the strings 2710 of memory cells 2712.

The conductive tiers 2708 (e.g., word lines, word line plates) may extend in respective horizontal planes. The conductive tiers 2708 may be stacked vertically, such that each conductive tier 2708 is coupled to all of the strings 2710 of memory cells 2712 in a respective block 2724, and the strings 2710 of the memory cells 2712 extend vertically through the stack(s) (e.g., decks, such as the lower deck 202 and the upper deck 204 of FIG. 2, FIG. 25) of conductive tiers 2708 of the respective block 2724. The conductive tiers 2708 may be coupled to, or may form control gates of, the memory cells 2712 to which the conductive tiers 2708 are coupled. Each conductive tier 2708 may be coupled to one memory cell 2712 of a particular string 2710 of memory cells 2712.

The first select gates 2718 and the second select gates 2722 may operate to select a particular string 2710 of the memory cells 2712 between a particular data line 2714 and the source tier 2716. Thus, a particular memory cell 2712 may be selected and electrically coupled to one of the data lines 2714 by operation of (e.g., by selecting) the appropriate first select gate 2718, second select gate 2722, and the conductive tier 2708 that are coupled to the particular memory cell 2712.

The staircase structure 2704 may be configured to provide electrical connection between the access lines 2706 and the conductive tiers 2708 through the vertical conductive contacts 2728. In other words, a particular level of the conductive tiers 2708 may be selected via one of the access lines 2706 that is in electrical communication with a respective one of the conductive contacts 2728 in electrical communication with the particular conductive tier 2708.

The data lines 2714 may be electrically coupled to the strings 2710 of memory cells 2712 through conductive structures 2732.

Figure 28:
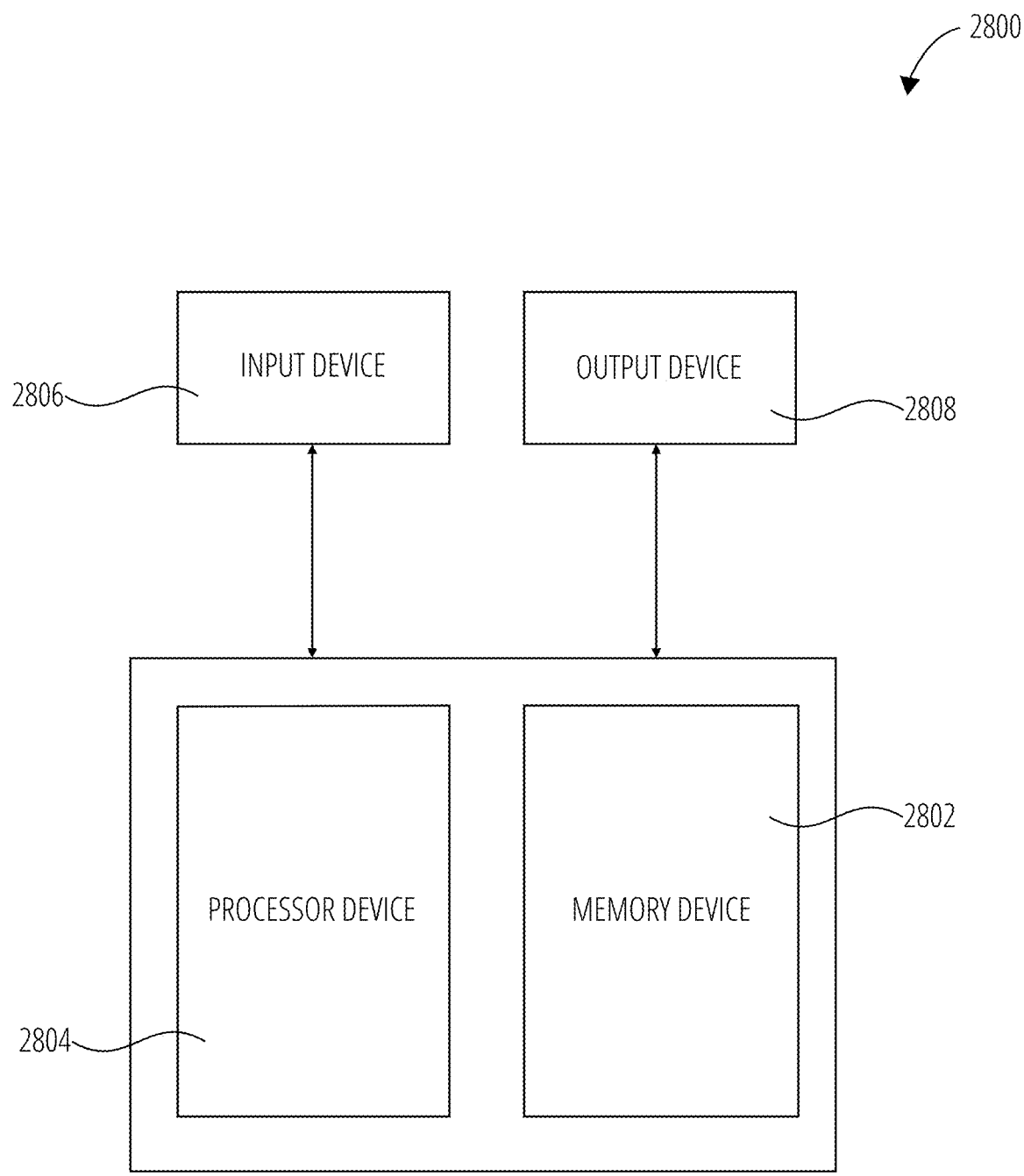
FIG. 28 is a block diagram of an electronic system, in accordance with embodiments of the disclosure.

Microelectronic devices (e.g., the microelectronic device 2700) including microelectronic device structures (e.g., the microelectronic device structure 100 of FIG. 1, the microelectronic device structure 200 of FIG. 2 and FIG. 3, the microelectronic device structure 2400 of FIG. 24, and/or the microelectronic device structure 2500 of FIG. 25 and FIG. 26) may be used in embodiments of electronic systems of the disclosure. For example, FIG. 28 is a block diagram of an electronic system 2800, in accordance with embodiments of the disclosure. The electronic system 2800 may comprise, for example, a computer or computer hardware component, a server or other networking hardware component, a cellular telephone, a digital camera, a personal digital assistant (PDA), a portable media (e.g., music) player, a Wi-Fi or cellular-enabled tablet (e.g., an iPAD® or SURFACE® tablet, an electronic book, a navigation device), etc.

The electronic system 2800 includes at least one memory device 2802. The memory device 2802 may include, for example, one or more embodiment(s) of a microelectronic device and/or structure previously described herein (e.g., the microelectronic device 2700 of FIG. 27, the microelectronic device structure 100 of FIG. 1, the microelectronic device structure 200 of FIG. 2 and FIG. 3, the microelectronic device structure 2400 of FIG. 24, and/or the microelectronic device structure 2500 of FIG. 25 and FIG. 26), e.g., with structures formed according to embodiments previously described herein.

The electronic system 2800 may further include at least one electronic signal processor device 2804 (often referred to as a "microprocessor"). The processor device 2804 may, optionally, include an embodiment of a microelectronic device and/or a microelectronic device structure previously described herein (e.g., the microelectronic device 2700 of FIG. 27, the microelectronic device structure 100 of FIG. 1, the microelectronic device structure 200 of FIG. 2 and FIG. 3, the microelectronic device structure 2400 of FIG. 24, and/or the microelectronic device structure 2500 of FIG. 25 and FIG. 26). The electronic system 2800 may further include one or more input devices 2806 for inputting information into the electronic system 2800 by a user, such as, for example, a mouse or other pointing device, a keyboard, a touchpad, a button, or a control panel. The electronic system 2800 may further include one or more output devices 2808 for outputting information (e.g., visual or audio output) to a user such as, for example, a monitor, a display, a printer, an audio output jack, a speaker, etc. In some embodiments, the input device 2806 and the output device 2808 may comprise a single touchscreen device that can be used both to input information into the electronic system 2800 and to output visual information to a user. The input device 2806 and the output device 2808 may communicate electrically with one or more of the memory device 2802 and the electronic signal processor device 2804.

Accordingly, disclosed is an electronic system comprising an input device, an output device, a processor device, and a memory device. The processor device is operably coupled to the input device and to the output device. The memory device is operably coupled to the processor device. The memory device comprises at least one microelectronic device structure. The at least one microelectronic device structure comprises a stack structure. The stack structure comprises insulative structures vertically interleaved with conductive structures. Pillars extend through the stack structure, through a region of doped material below the stack structure, and into a base structure below the region of the doped material. The doped material extends laterally into at least one of the pillars and extends upwardly within the at least one of the pillars to an interface with a channel material of the at least one of the pillars. The interface is at an elevation within the stack structure and proximate at least a lowermost of the conductive structures of the stack structure. The doped material defines a broader lateral width below the interface than a lateral width of the channel material above the interface.

Figure 29:
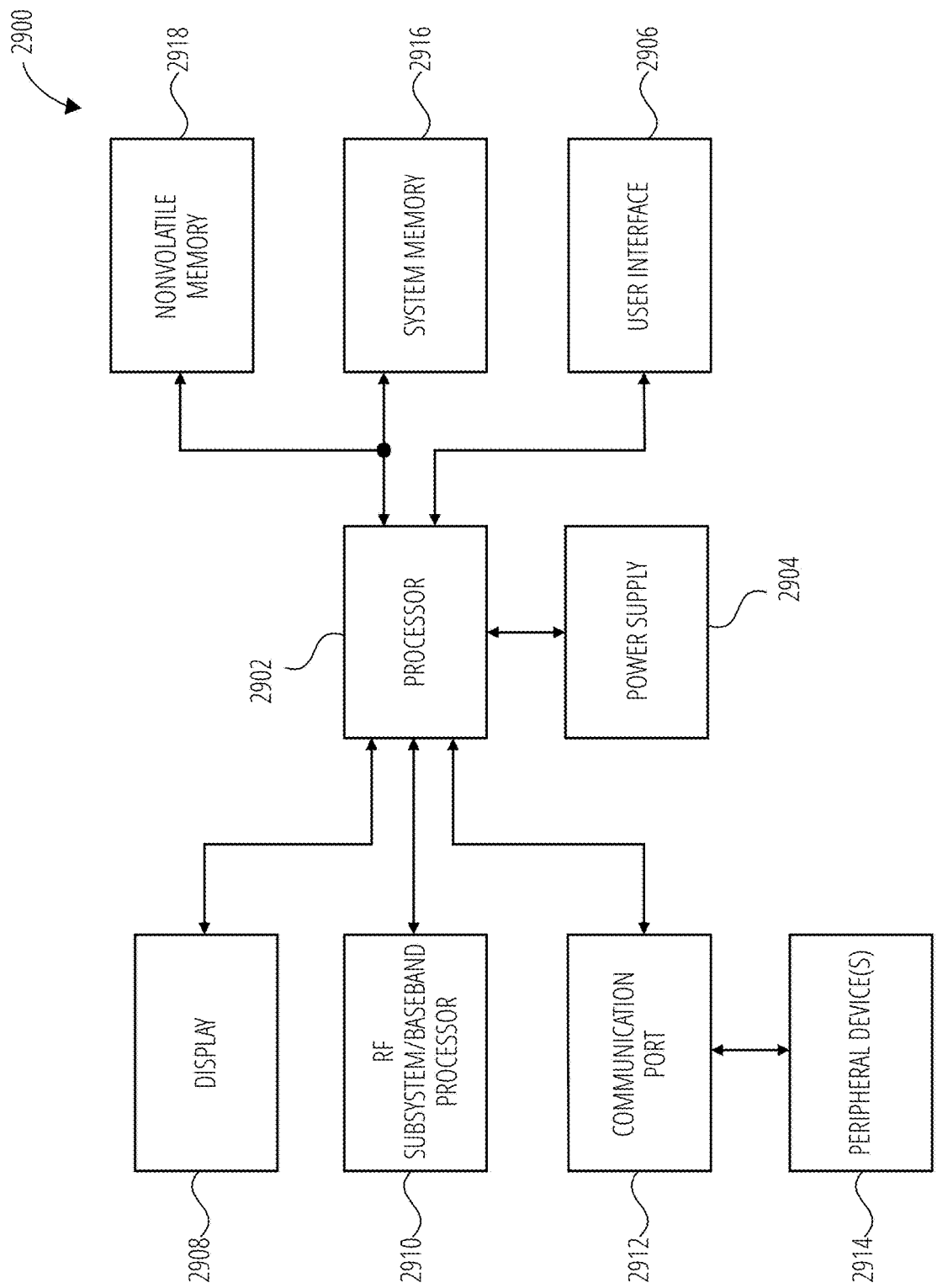
FIG. 29 is a block diagram of a processor-based system, in accordance with embodiments of the disclosure.

With reference to FIG. 29, shown is a block diagram of a processor-based system 2900. The processor-based system 2900 may include various microelectronic devices (e.g., the microelectronic device 2700 of FIG. 27) and microelectronic device structures (e.g., the microelectronic device structure 100 of FIG. 1, the microelectronic device structure 200 of FIG. 2 and FIG. 3, the microelectronic device structure 2400 of FIG. 24, and/or the microelectronic device structure 2500 of FIG. 25 and FIG. 26) manufactured in accordance with embodiments of the present disclosure. The processor-based system 2900 may be any of a variety of types, such as a computer, a pager, a cellular phone, a personal organizer, a control circuit, or another electronic device. The processor-based system 2900 may include one or more processors 2902, such as a microprocessor, to control the processing of system functions and requests in the processor-based system 2900. The processor 2902 and other subcomponents of the processor-based system 2900 may include microelectronic devices (e.g., the microelectronic device 2700 of FIG. 27) and microelectronic device structures (e.g., the microelectronic device structure 100 of FIG. 1, the microelectronic device structure 200 of FIG. 2 and FIG. 3, the microelectronic device structure 2400 of FIG. 24, and/or the microelectronic device structure 2500 of FIG. 25 and FIG. 26) manufactured in accordance with embodiments of the present disclosure.

The processor-based system 2900 may include a power supply 2904 in operable communication with the processor 2902. For example, if the processor-based system 2900 is a portable system, the power supply 2904 may include one or more of a fuel cell, a power scavenging device, permanent batteries, replaceable batteries, and/or rechargeable batteries. The power supply 2904 may also include an AC adapter; therefore, the processor-based system 2900 may be plugged into a wall outlet, for example. The power supply 2904 may also include a DC adapter such that the processor-based system 2900 may be plugged into a vehicle cigarette lighter or a vehicle power port, for example.

Various other devices may be coupled to the processor 2902 depending on the functions that the processor-based system 2900 performs. For example, a user interface 2906 may be coupled to the processor 2902. The user interface 2906 may include one or more input devices, such as buttons, switches, a keyboard, a light pen, a mouse, a digitizer and stylus, a touch screen, a voice recognition system, a microphone, or a combination thereof. A display 2908 may also be coupled to the processor 2902. The display 2908 may include an LCD display, an SED display, a CRT display, a DLP display, a plasma display, an OLED display, an LED display, a three-dimensional projection, an audio display, or a combination thereof. Furthermore, an RF subsystem/baseband processor 2910 may also be coupled to the processor 2902. The RF subsystem/baseband processor 2910 may include an antenna that is coupled to an RF receiver and to an RF transmitter. A communication port 2912, or more than one communication port 2912, may also be coupled to the processor 2902. The communication port 2912 may be adapted to be coupled to one or more peripheral devices 2914 (e.g., a modem, a printer, a computer, a scanner, a camera) and/or to a network (e.g., a local area network (LAN), a remote area network, an intranet, or the Internet).

The processor 2902 may control the processor-based system 2900 by implementing software programs stored in the memory (e.g., system memory 2916). The software programs may include an operating system, database software, drafting software, word processing software, media editing software, and/or media-playing software, for example. The memory (e.g., the system memory 2916) is operably coupled to the processor 2902 to store and facilitate execution of various programs. For example, the processor 2902 may be coupled to system memory 2916, which may include one or more of spin torque transfer magnetic random access memory (STT-MRAM), magnetic random access memory (MRAM), dynamic random access memory (DRAM), static random access memory (SRAM), racetrack memory, and/or other known memory types. The system memory 2916 may include volatile memory, nonvolatile memory, or a combination thereof. The system memory 2916 is typically large so it can store dynamically loaded applications and data. In some embodiments, the system memory 2916 may include semiconductor devices (e.g., the microelectronic device 2700 of FIG. 27) and structures (e.g., the microelectronic device structure 100 of FIG. 1, the microelectronic device structure 200 of FIG. 2 and FIG. 3, the microelectronic device structure 2400 of FIG. 24, and/or the microelectronic device structure 2500 of FIG. 25 and FIG. 26), described above, or a combination thereof.

The processor 2902 may also be coupled to nonvolatile memory 2918, which is not to suggest that system memory 2916 is necessarily volatile. The nonvolatile memory 2918 may include one or more of STT-MRAM, MRAM, read-only memory (ROM) (e.g., EPROM, resistive read-only memory (RROM)), and Flash memory to be used in conjunction with the system memory 2916. The size of the nonvolatile memory 2918 is typically selected to be just large enough to store any necessary operating system, application programs, and fixed data. Additionally, the nonvolatile memory 2918 may include a high-capacity memory (e.g., disk drive memory, such as a hybrid-drive including resistive memory or other types of nonvolatile solid-state memory, for example). The nonvolatile memory 2918 may include microelectronic devices (e.g., the microelectronic device 2700 of FIG. 27) and structures (e.g., the microelectronic device structure 100 of FIG. 1, the microelectronic device structure 200 of FIG. 2 and FIG. 3, the microelectronic device structure 2400 of FIG. 24, and/or the microelectronic device structure 2500 of FIG. 25 and FIG. 26) described above, or a combination thereof.

While the disclosed structures, apparatus (e.g., devices), systems, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A microelectronic device, comprising:
a stack structure comprising a vertically alternating sequence of insulative structures and conductive structures arranged in tiers;
at least one pillar extending through the stack structure, the at least one pillar comprising a channel material;
a source region below the stack structure, the source region comprising a doped material, a vertical extension of the doped material protruding upward to an interface with the channel material at an elevation within the stack structure, the vertical extension of the doped material defining a greater horizontal thickness than a horizontal thickness defined by the channel material above the interface; and
at least one slit structure extending through the stack structure to divide the stack structure into blocks of arrays of the at least one pillar,
at least one individual slit structure, of the at least one slit structure, comprising therein:
a series of discrete, spaced pedestal structures;
a series of inter-slit support structures above the series of discrete, spaced pedestal structures, the inter-slit support structures extending vertically through the stack structure; and
a series of regions of the doped material, the regions of the doped material horizontally alternating with the inter-slit support structures of the series of inter-slit support structures, the doped material of the series of regions of the doped material extending from the source region upward into the at least one individual slit structure.

2. The microelectronic device of claim 1, wherein the pedestal structures occupy elevations below the stack structure.

3. The microelectronic device of claim 1, wherein:
the doped material comprises a polysilicon with one of an N-type dopant or a P-type dopant; and
the inter-slit support structures, of the series of inter-slit support structures, comprise a polysilicon with a different one of the N-type dopant or the P-type dopant.

4. The microelectronic device of claim 1, wherein:
the doped material comprises a polysilicon doped with an N-type dopant; and
the inter-slit support structures, of the series of inter-slit support structures, comprise a polysilicon doped with a P-type dopant.

5. The microelectronic device of claim 1, wherein, within the at least one individual slit structure, the regions of the doped material are respectively individually directly between spacing-neighboring inter-slit support structures in the series of inter-slit support structures.

6. The microelectronic device of claim 1, wherein the pedestal structures comprise SiCN.

7. The microelectronic device of claim 1, wherein the at least one pillar comprises an insulative material at a core of the at least one pillar, the insulative material defining a greater horizontal thickness at an elevation immediately above the vertical extension of the doped material than a horizontal thickness defined by the insulative material laterally adjacent the vertical extension of the doped material.

8. The microelectronic device of claim 1, wherein the vertical extension of the doped material laterally overlaps in elevation at least a portion of a lowest conductive structure of the conductive structures of the stack structure.

9. The microelectronic device of claim 1, wherein the channel material comprises a lower portion below a lower vertical extension of the doped material.

10. A method of forming a microelectronic device, the method comprising:
forming, on a base structure, a stack of sacrificial materials including a lower region of a first sacrificial material;
forming, on the stack of sacrificial materials, a tiered stack structure comprising a vertically alternating sequence of insulative structures and other structures arranged in tiers;
forming a pillar opening through the tiered stack structure, through the stack of sacrificial materials, and into the base structure;
forming cell materials, a channel material, and an insulative core material in the pillar opening;
forming a slit through the tiered stack structure and partially through the stack of sacrificial materials to the lower region of the first sacrificial material;
selectively removing at least one of the sacrificial materials, of the stack of sacrificial materials, to expose at least one of the cell materials formed in the pillar opening;
forming, on the lower region of the first sacrificial material exposed in the slit, inter-slit support structures of a first doped material, comprising:
filling the slit with the first doped material; and
etching a series of inter-slit openings through the first doped material to the lower region of the first sacrificial material to form a series of the inter-slit support structures from the first doped material;
forming a lateral opening through the cell materials to expose a portion of the channel material in the lateral opening;
recessing the channel material to form a vertical recess protruding to an elevation within the tiered stack structure;
forming in the slit, under the inter-slit support structures, discrete, spaced inter-slit pedestal structures;
forming a second doped material in the vertical recess, in the lateral opening, and in the inter-slit openings; and
before or after selectively removing the at least one of the sacrificial materials, substantially replacing the other structures of the tiered stack structure with conductive structures or substantially converting the other structures of the tiered stack structure into the conductive structures;
the method forming a microelectronic device, comprising:
the tiered stack structure comprising the vertically alternating sequence of the insulative structures and the conductive structures arranged in the tiers;
a pillar extending through the tiered stack structure in the pillar opening, the pillar comprising the channel material;
a source region below the tiered stack structure, the source region comprising the second doped material, a vertical extension of the second doped material protruding upward in the vertical recess to an interface with the channel material at an elevation within the tiered stack structure, the vertical extension of the second doped material defining a greater horizontal thickness than a horizontal thickness defined by the channel material above the interface; and a slit structure in the slit and extending through the tiered stack structure to divide the tiered stack structure into blocks of arrays of at least one pillar, the at least one pillar comprising the pillar, the slit structure comprising therein:
the discrete, spaced inter-slit pedestal structures arranged in a series along the slit structure within the slit;
the series of the inter-slit support structures, the inter-slit support structures being above the discrete, spaced inter-slit pedestal structures, the inter-slit support structures extending vertically through the tiered stack structure; and
a series of regions of the second doped material, the regions of the second doped material horizontally alternating with the inter-slit support structures of the series of inter-slit support structures, the second doped material of the series of regions of the second doped material extending from the source region upward into the slit structure.

11. The method of claim 10, further comprising:
before forming the lateral opening through the cell materials, removing a second sacrificial material of the stack of sacrificial materials to form a void between an upper region of the first sacrificial material and the lower region of the first sacrificial material; and
exposing a portion of the first sacrificial material to an oxygen-based plasma to convert exposed portions of the first sacrificial material to an oxide;
wherein forming in the slit, under the inter-slit support structures, the discrete, spaced inter-slit pedestal structures comprises selectively removing the oxide of the converted portions of the first sacrificial material without removing non-converted portions of the first sacrificial material to form the discrete, spaced inter-slit pedestal structures from the non-converted portions of the first sacrificial material.

12. The method of claim 10, further comprising, after recessing the channel material, removing at least a portion of at least one material laterally adjacent the vertical recess to broaden the vertical recess before forming the second doped material in the vertical recess.

13. The method of claim 10, wherein substantially replacing the other structures of the tiered stack structure with the conductive structures or substantially converting the other structures of the tiered stack structure into the conductive structures comprises:
before selectively removing the at least one of the sacrificial materials, of the stack of sacrificial materials, replacing the other structures, of the tiered stack structure, with the conductive structures.

14. An electronic system, comprising:
an input device;
an output device;
a processor device operably coupled to the input device and to the output device; and
a memory device operably coupled to the processor device and comprising at least one microelectronic device structure, the at least one microelectronic device structure comprising:

a stack structure comprising insulative structures vertically interleaved with conductive structures;
at least one slit structure extending through the stack structure;
in at least one individual slit structure, of the at least one slit structure:
a series of discrete pedestal structures spaced along a base of the at least one individual slit structure;
a series of inter-slit support structures above the series of discrete pedestal structures, the inter-slit support structures extending vertically through the stack structure; and
a series of regions of doped material, the regions of the doped material extending vertically through the stack structure and horizontally alternating with the inter-slit support structures of the series of inter-slit support structures; and
pillars extending through the stack structure, through a region of the doped material below the stack structure, and into a base structure below the region of the doped material,
the doped material extending from the regions of the doped material in the at least one individual slit structure, through the region of the doped material below the stack structure, and laterally into at least one of the pillars and extending upwardly within the at least one of the pillars to an interface with a channel material of the at least one of the pillars, the interface being at an elevation within the stack structure and proximate at least a lowermost of the conductive structures of the stack structure, the doped material defining a broader lateral width below the interface than a lateral width of the channel material above the interface.

15. The electronic system of claim 14, wherein:
the pillars individually comprise an insulative core region; and
the doped material protrudes laterally into the insulative core region of at least one of the pillars.

16. The electronic system of claim 14, wherein the doped material extends in a substantially continuous material region:
from the region of doped material below the stack structure, into the at least one individual slit structure, the doped material spacing neighboring inter-slit support structures of the series of inter-slit support structures.

17. The microelectronic device of claim 1, wherein:
the at least one pillar individually comprises an insulative core region; and
the insulative core region defines a lesser horizontal width in elevations of the source region than a horizontal width of the insulative core region in an elevation directly above the interface.

18. The microelectronic device of claim 5, wherein the doped material defines a substantially continuous material region from the source region extending into and through a whole height of the at least one slit structure to space the neighboring inter-slit support structures in the series of inter-slit support structures.

* * * * *